United States Patent
Bendett et al.

(10) Patent No.: US 6,330,388 B1
(45) Date of Patent: Dec. 11, 2001

(54) METHOD AND APPARATUS FOR WAVEGUIDE OPTICS AND DEVICES

(75) Inventors: Mark P. Bendett; Michael A. McCoy, both of Plymouth, MN (US)

(73) Assignee: Northstar Photonics, Inc., Maple Grove, MN (US)

( * ) Notice: Subject to any disclaimer, the term of this patent is extended or adjusted under 35 U.S.C. 154(b) by 0 days.

(21) Appl. No.: 09/490,168

(22) Filed: Jan. 22, 2000

Related U.S. Application Data

(60) Provisional application No. 60/162,458, filed on Oct. 29, 1999, and provisional application No. 60/117,477, filed on Jan. 27, 1999.

(51) Int. Cl.$^7$ ...................................................... G02B 6/10
(52) U.S. Cl. ............................ 385/132; 385/129; 385/88; 385/91; 385/90; 385/37
(58) Field of Search .......................... 385/1, 4–6, 11–14, 385/129–132; 372/41, 102, 19, 6, 94, 81, 92, 93, 97, 99, 98

(56) References Cited

U.S. PATENT DOCUMENTS

| H1848 | * | 5/2000 | Amin et al. | ........................... 385/132 |
| 4,318,058 | * | 3/1982 | Mito et al. | .............................. 372/50 |

(List continued on next page.)

FOREIGN PATENT DOCUMENTS

| 0784362 | 7/1997 | (EP) | .................................. H01S/3/06 |
| 02222187 | 9/1990 | (JP) | .................................. H01S/3/23 |
| 97/44686 | 11/1997 | (WO) . | |

OTHER PUBLICATIONS

Barbier, D., et al., "Sub–Centimeter length ion–exchanged waveguide lasers in Er/Yb doped phosphate glass", *11th Ann. Conf. on Integrated Optics and Optical Fibre Comm.*, vol. 4, pp. 41–44, (1977).

Veasey, D.L., et al., "Distributed Feedback Lasers in Rare–earth–doped phosphate glass", (Abstract) *Proceedings of the 7th European Conference on Integrated Optics with Technical Exhibition*, vol. 1, Delft, Nederlands, pp. 579–582, (Apr. 3–6, 1995).

Roman, J.E., et al., "Neodymium–doped glass channel waveguide laser containing an integrated distributed Bragg reflector", *Applied Physics Letters*, 61 (23), Amer. Inst. of Physics, pp. 2744–2746, (Dec. 7, 1992).

*Primary Examiner*—Ellen E. Kim
(74) *Attorney, Agent, or Firm*—Schwegman, Lundberg, Woesnner & Kluth, P.A.

(57) ABSTRACT

Optical structures and method for producing tunable waveguide lasers. In one embodiment, a waveguide is defined within a glass substrate doped with a rare-earth element or elements by ion diffusion. Feedback elements such as mirrors or reflection gratings in the waveguide further define a laser-resonator cavity so that laser light is output from the waveguide when pumped optically or otherwise. Means are disclosed for varying the wavelengths reflected by the reflection gratings and varying the effective length of the resonator cavity to thereby tune the laser to a selected wavelength. Apparatus and method for integrating rare-earth doped lasers and optics on glass substrates. The invention includes a laser component formed from a glass substrate doped with a optically active lanthanides species with a plurality of waveguides defined by channels within the substrate. The laser component may constitute a monolithic array of individual waveguides in which the waveguides of the array form laser resonator cavities with differing resonance characteristics. The channels defining the waveguides are created by exposing a surface of the substrate to an ion-exchange solvent through a mask layer having a plurality of line apertures corresponding to the channels which are to be formed.

60 Claims, 40 Drawing Sheets

U.S. PATENT DOCUMENTS

| | | | |
|---|---|---|---|
| 5,080,503 | 1/1992 | Najafi et al. | 385/1 |
| 5,134,620 | 7/1992 | Huber | 372/6 |
| 5,151,908 | 9/1992 | Huber | 372/6 |
| 5,243,609 | 9/1993 | Huber | 372/19 |
| 5,334,559 | 8/1994 | Hayden | 501/48 |
| 5,491,708 | 2/1996 | Malone et al. | 372/41 |
| 5,544,268 * | 8/1996 | Bischel et al. | 385/4 |
| 5,579,154 | 11/1996 | Mueller-Fiedler et al. | 359/341 |
| 5,580,471 * | 12/1996 | Fumumoto et al. | 219/121.63 |
| 5,614,436 * | 3/1997 | Shim et al. | 437/129 |
| 5,677,920 * | 10/1997 | Waarts et al. | 372/6 |
| 5,953,359 * | 9/1999 | Yamaguchi et al. | 372/50 |

* cited by examiner

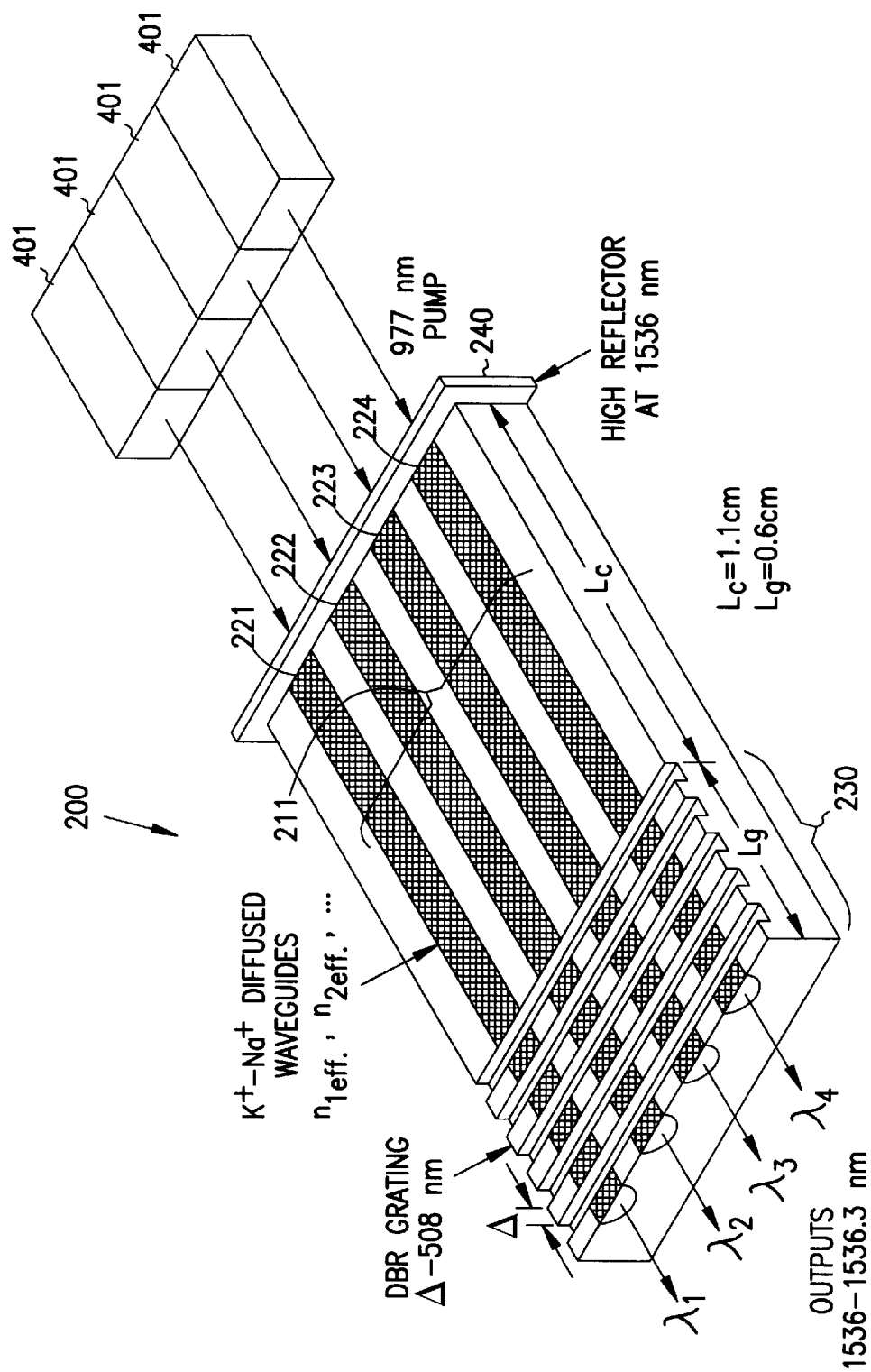
FIG. 1-A1

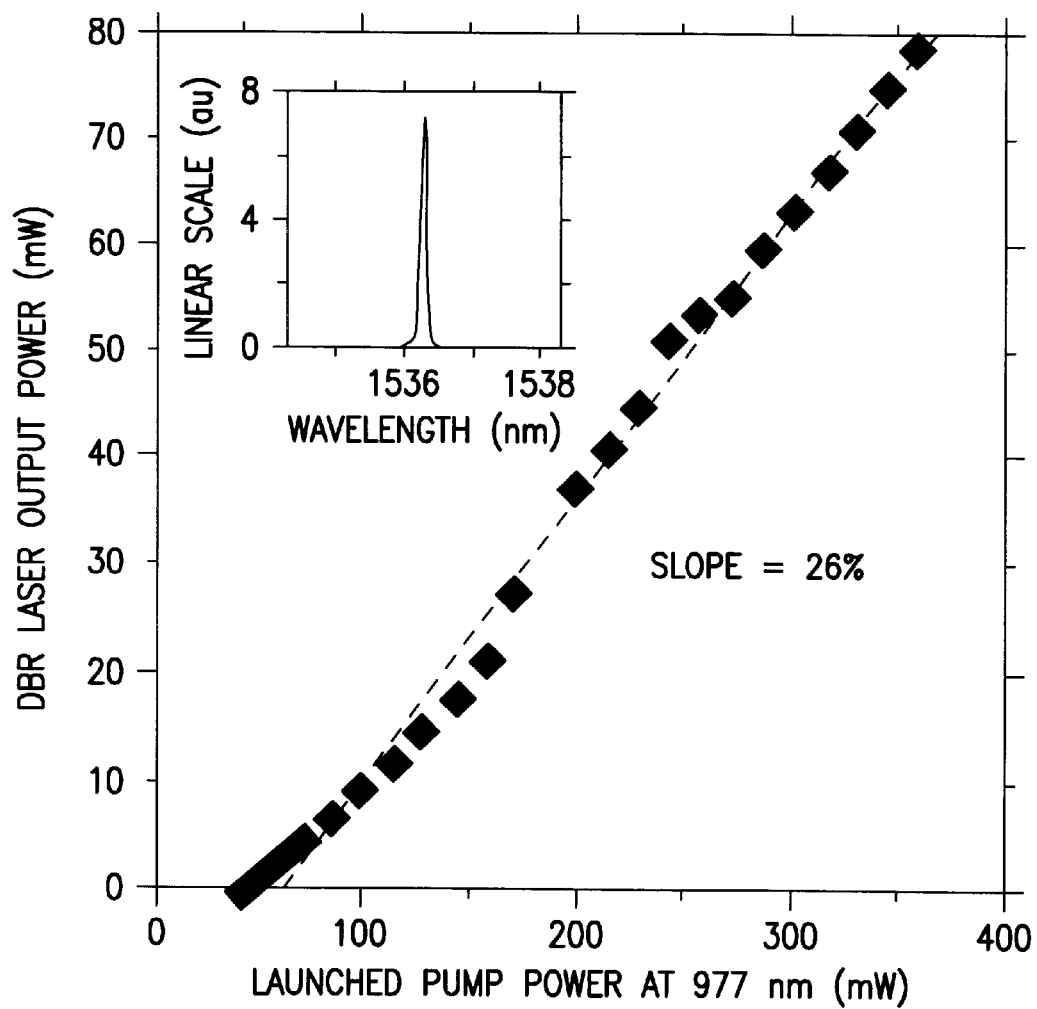
FIG. 1-A2

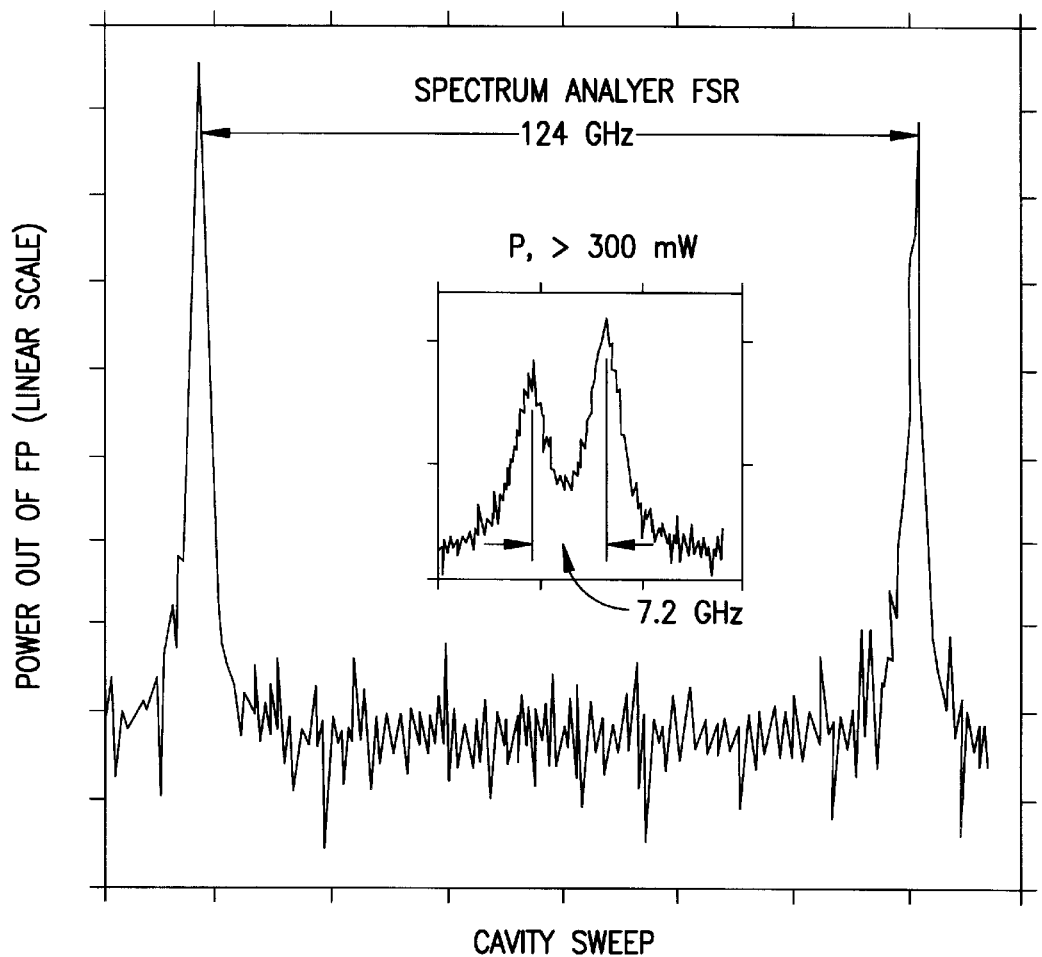
FIG. 1-A3

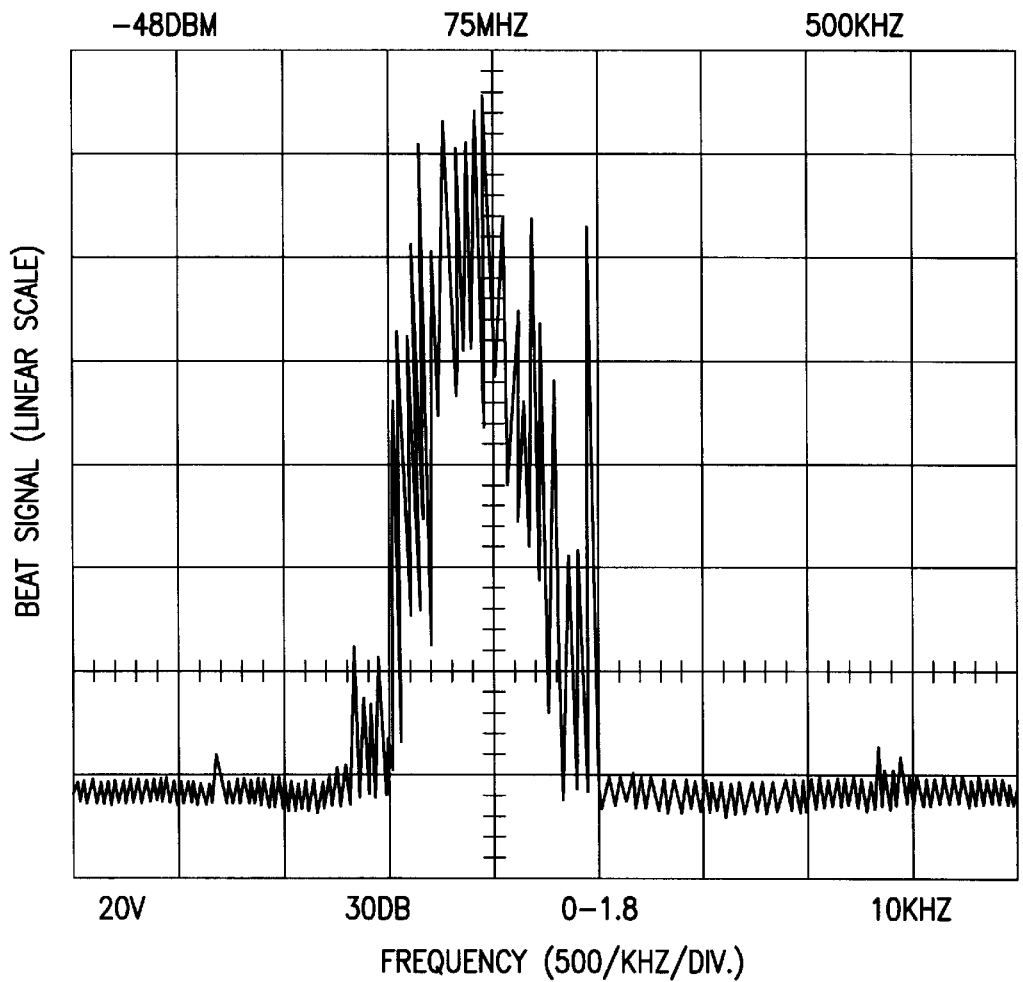
FIG. 1-A4

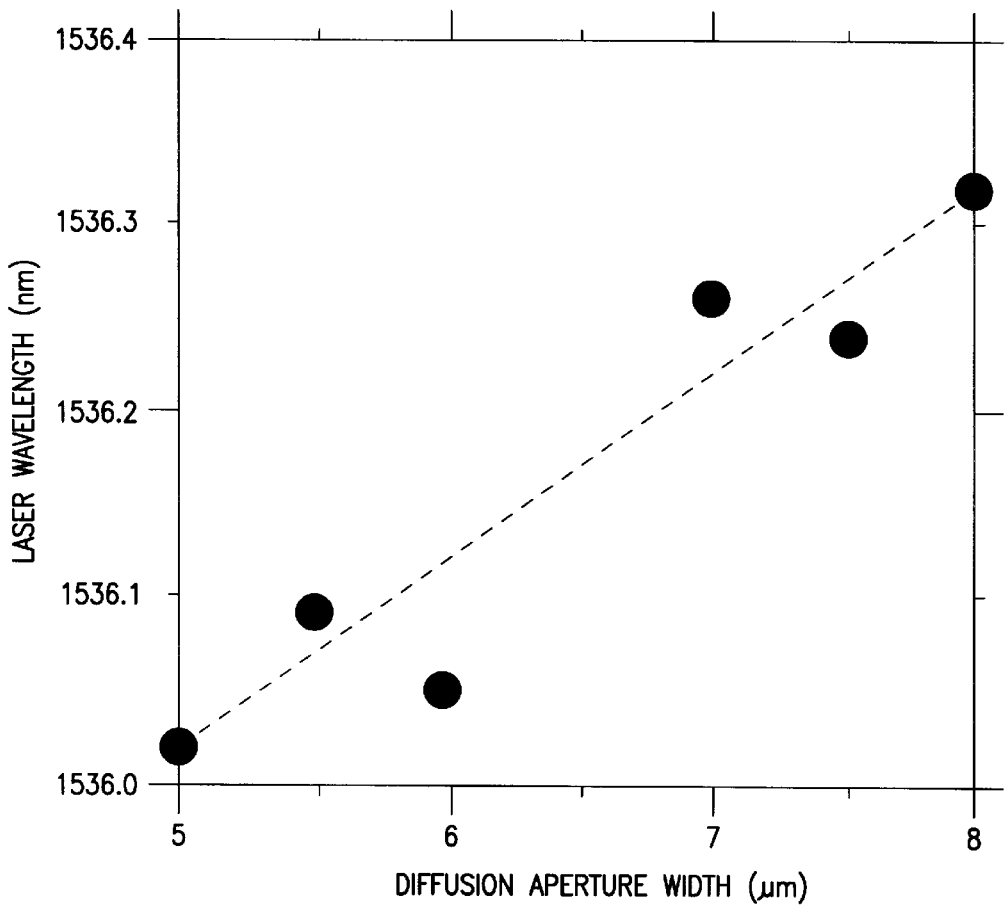
FIG. 1-A5

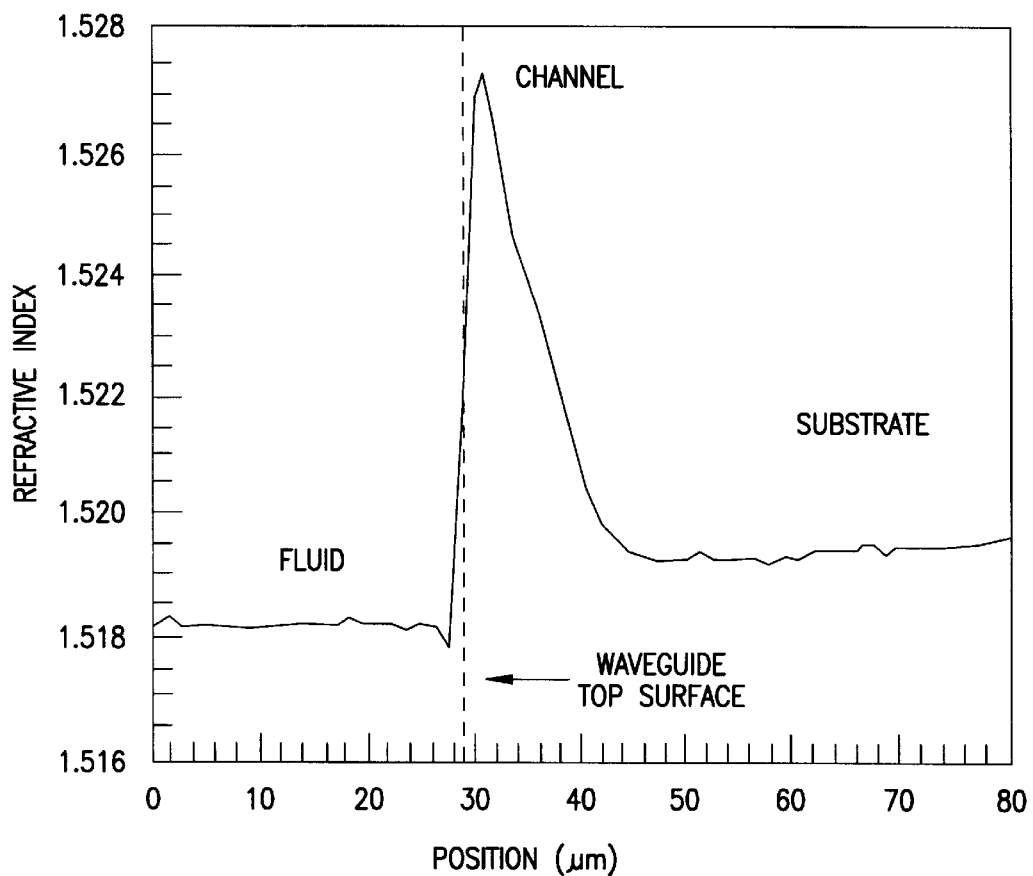
FIG. 1-B1

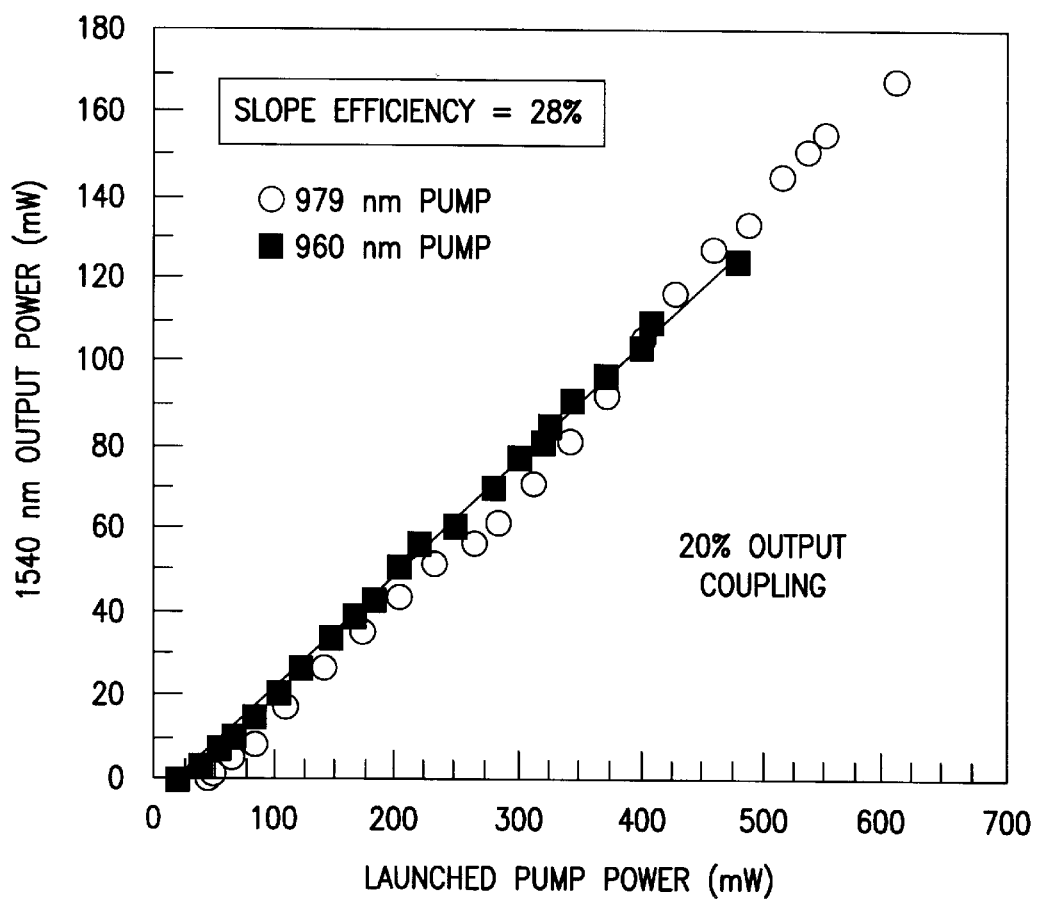
FIG. 1-B2

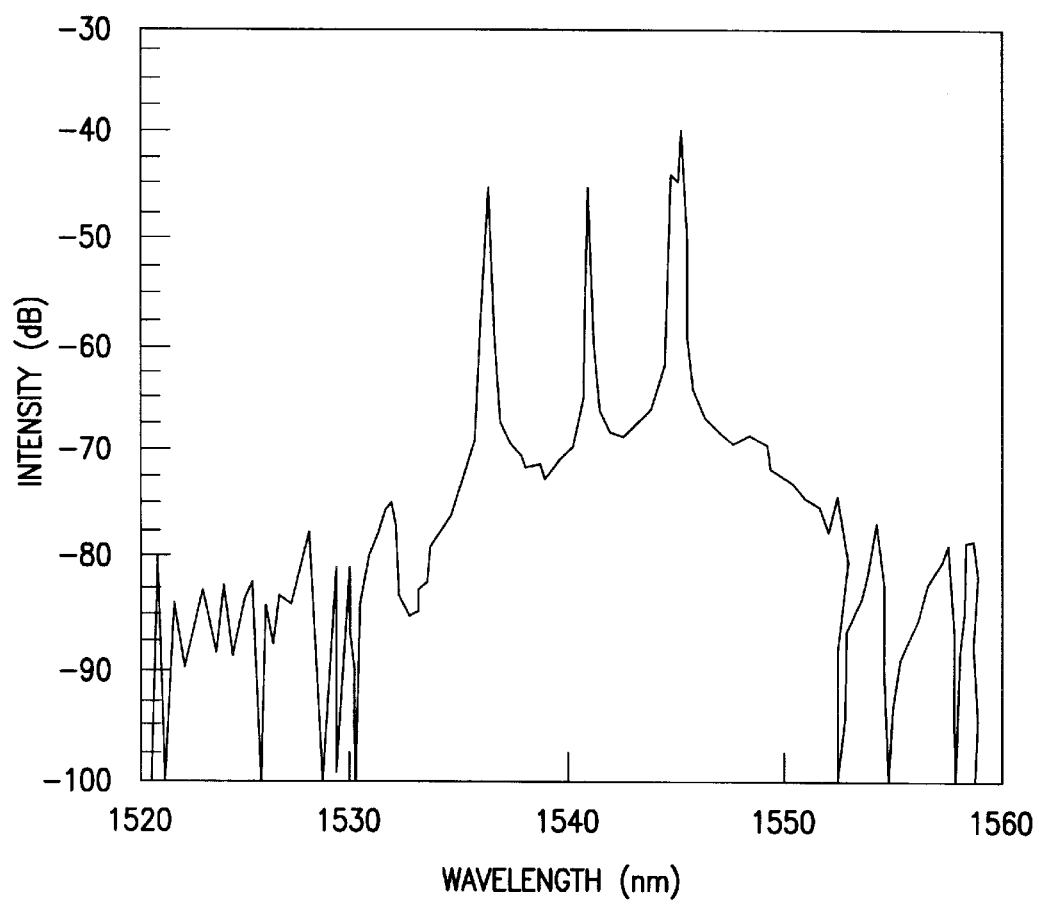
FIG. 1-B3

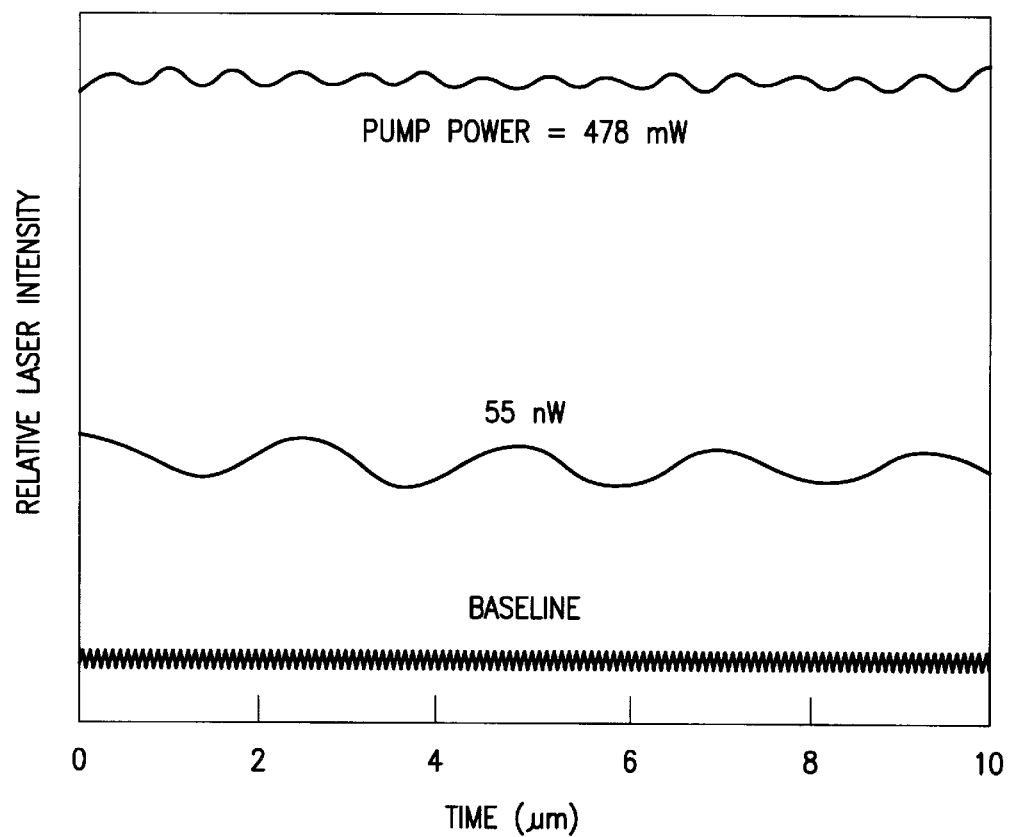
FIG. 1-B4

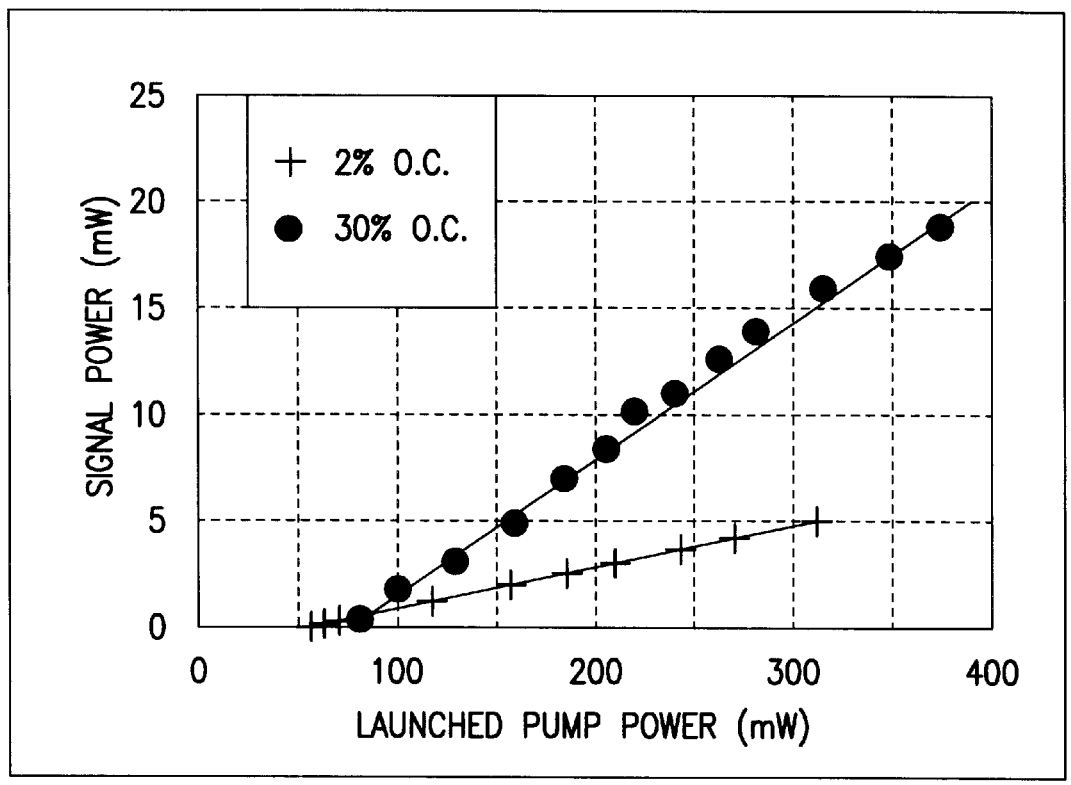
FIG. 1-C1

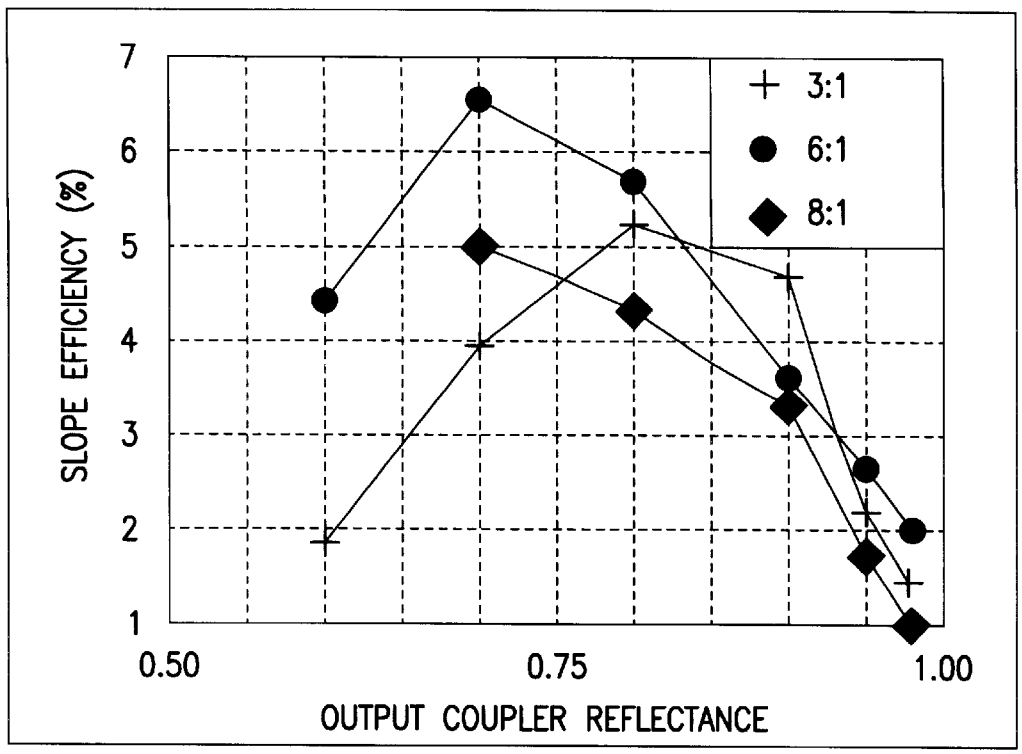
FIG. 1-C2

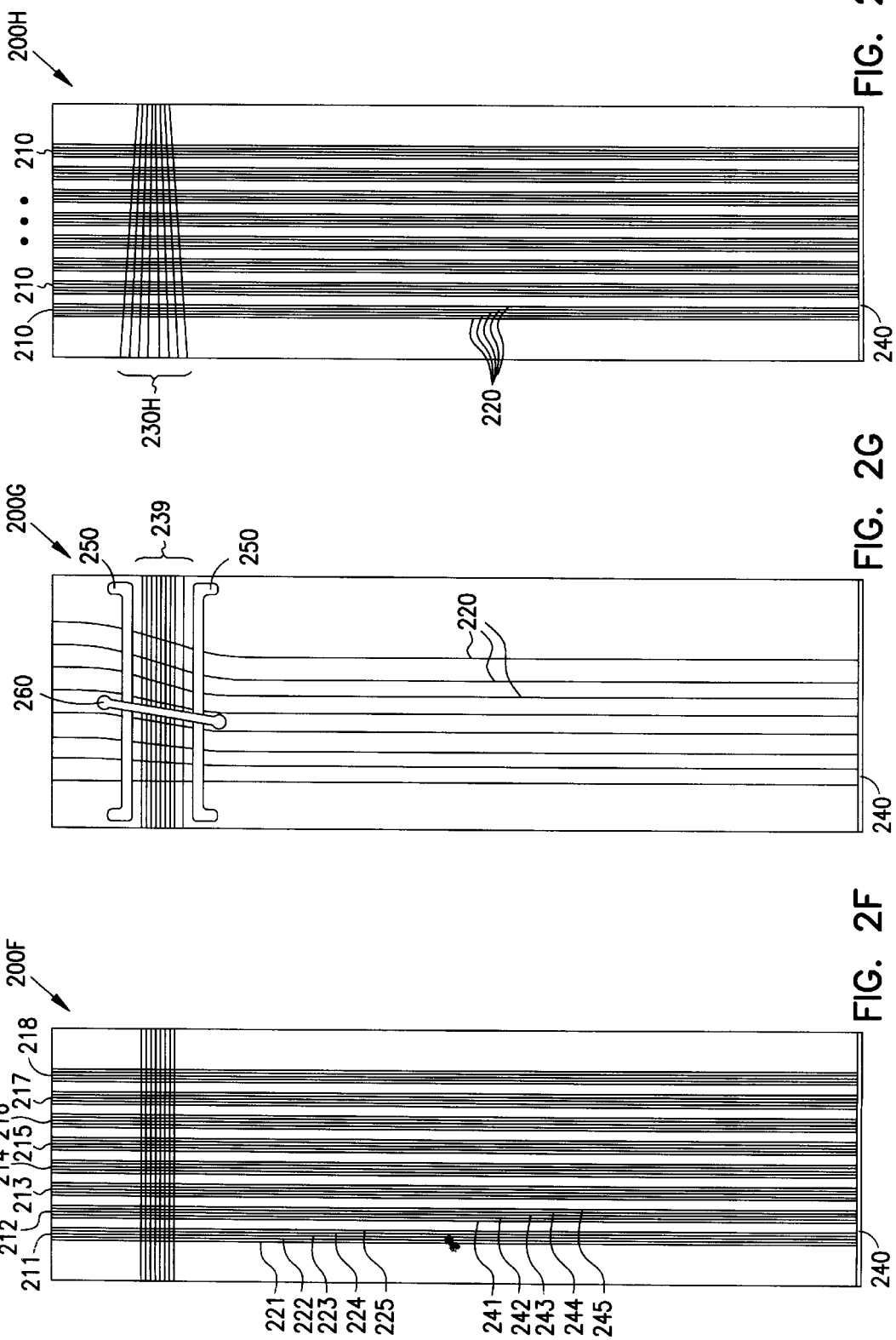

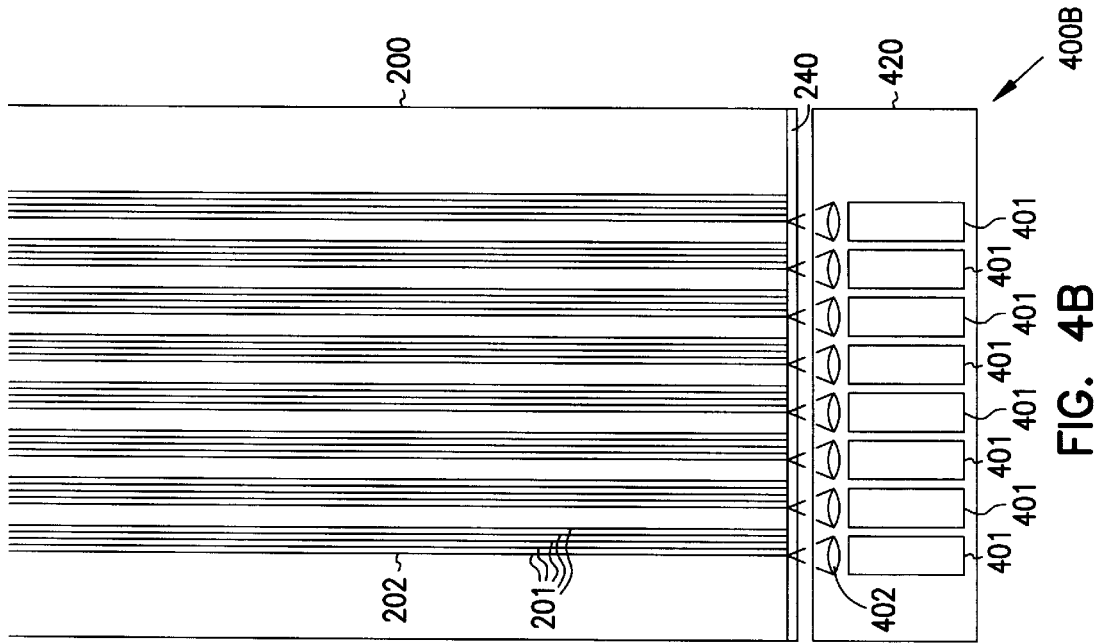
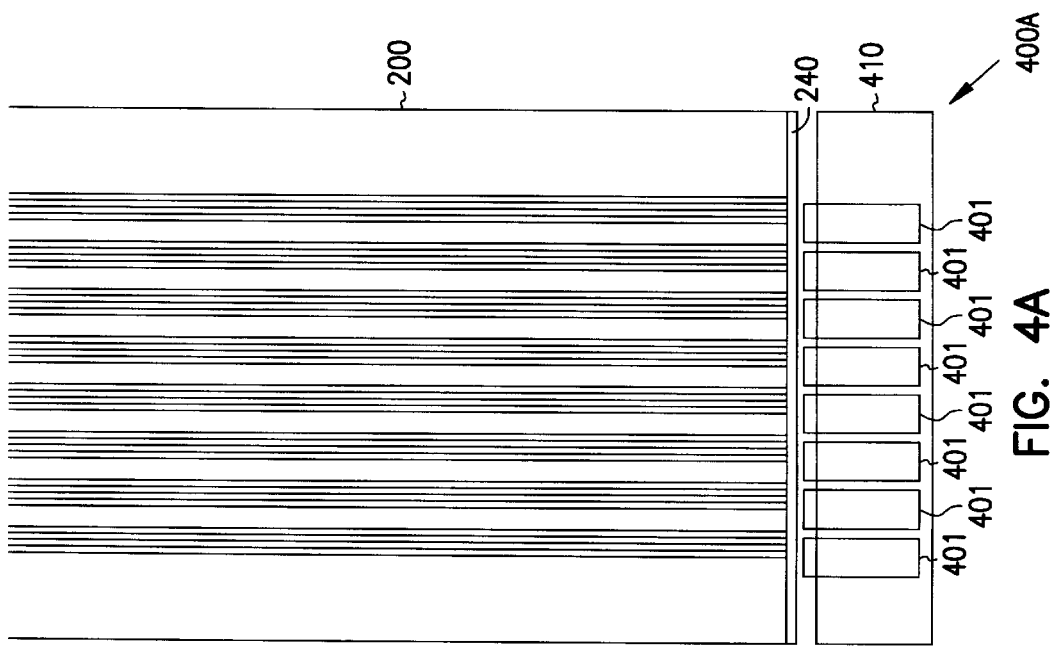

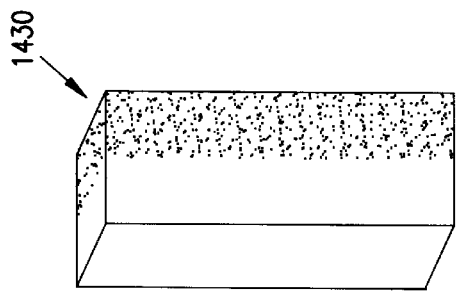
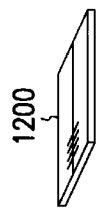
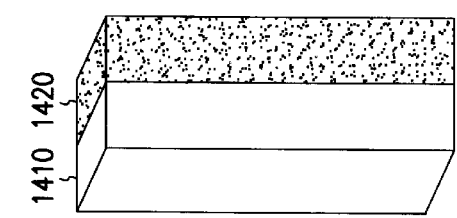
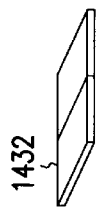
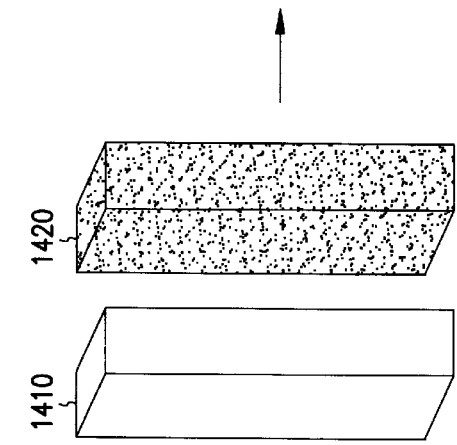
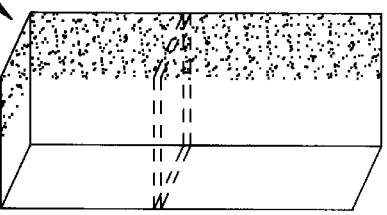

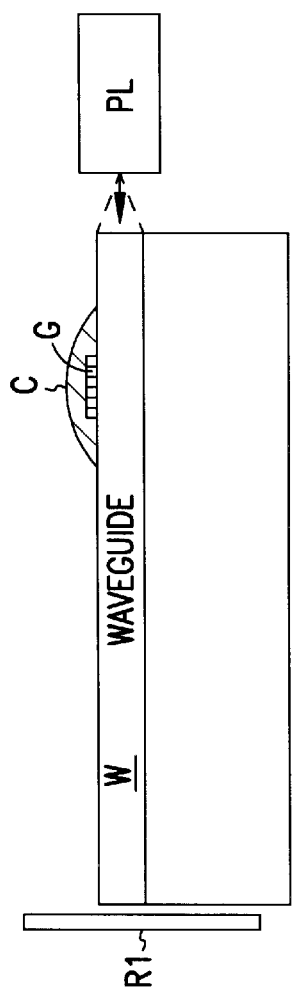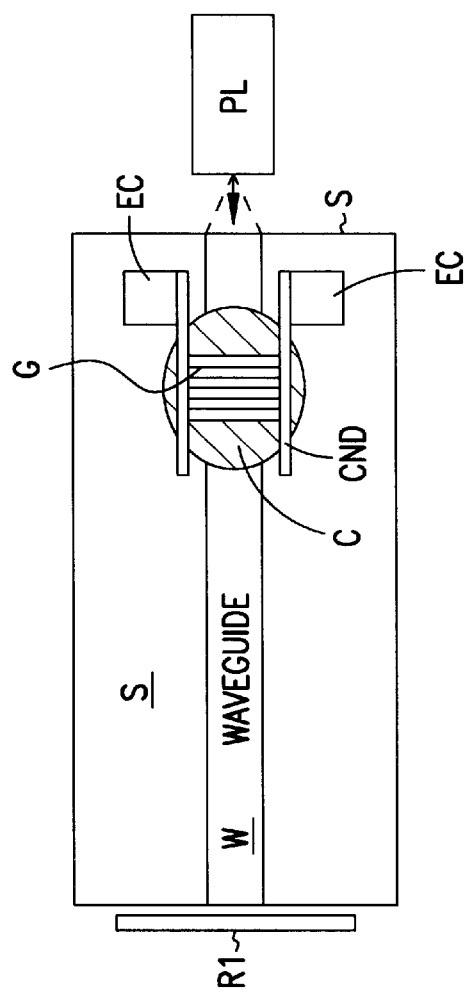

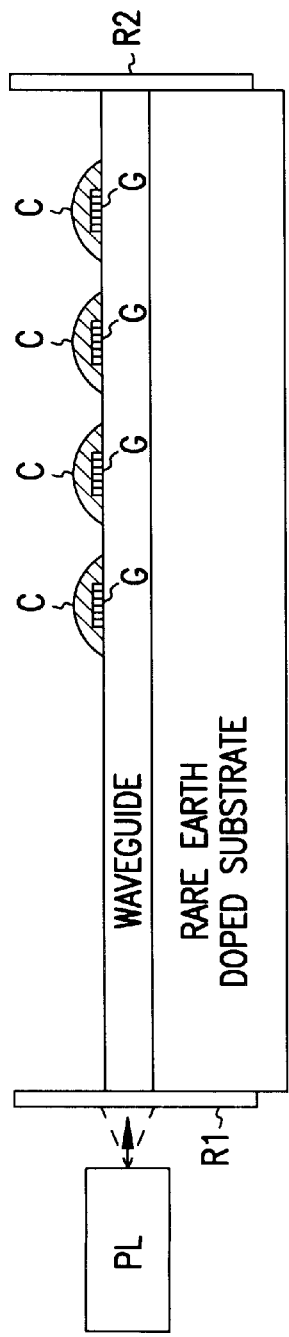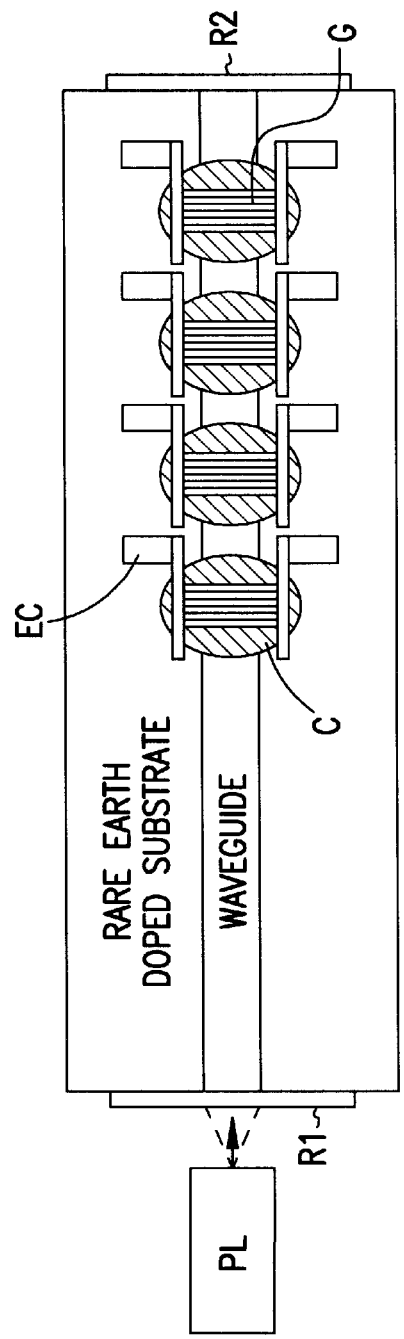

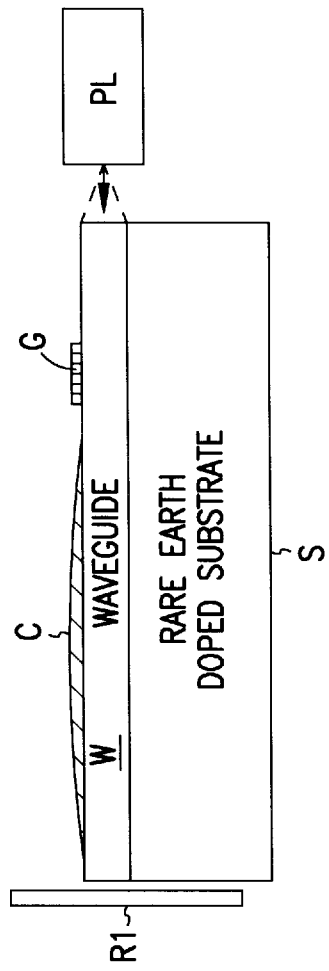
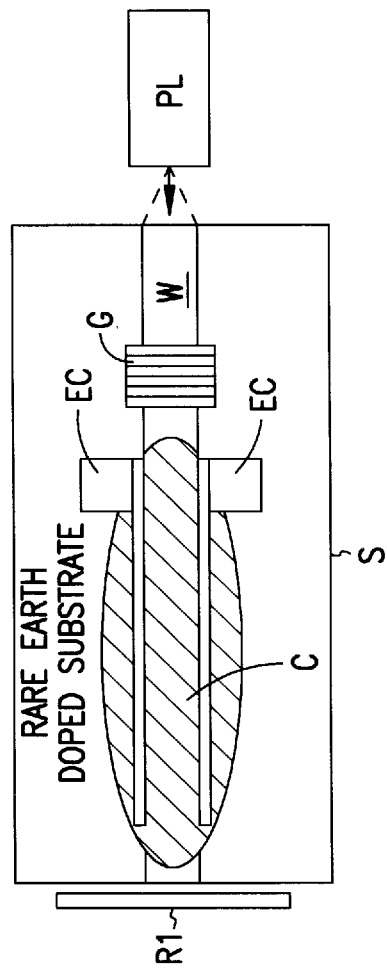

METHOD AND APPARATUS FOR WAVEGUIDE OPTICS AND DEVICES

RELATED APPLICATIONS

This application claims the benefit under 35 U.S.C. 119(e) of U.S. Provisional Application Ser. No. 60/117,477 filed Jan. 27, 1999 and to Provisional Application Ser. No. 60/162,458 filed Oct. 29, 1999, both of which are incorporated by reference.

STATEMENT AS TO RIGHTS TO INVENTIONS MADE UNDER FEDERALLY SPONSORED RESEARCH AND DEVELOPMENT

Certain aspects of these inventions were developed with support from NIST (National Institute for Standards and Technology). The U.S. Government may have rights in certain of these inventions.

FIELD OF THE INVENTION

This invention relates to the field of optics and lasers, and more specifically to a method and apparatus for pumping optical waveguide lasers formed on a glass substrate.

BACKGROUND OF THE INVENTION

The telecommunications industry commonly uses optical fibers to transmit large amounts of data in a short time. One common light source for optical-fiber communications systems is a laser formed using erbium-doped glass. One such system uses erbium-doped glass fibers to form a laser that emits at a wavelength of about 1.536 micrometer and is pumped by an infrared source operating at a wavelength of about 0.98 micrometer. One method usable for forming waveguides in a substrate is described in U.S. Pat. No. 5,080,503 issued Jan. 14, 1992 to Najafi et al., which is hereby incorporated by reference. A phosphate glass useful in lasers is described in U.S. Pat. No. 5,334,559 issued Aug. 2, 1994 to Joseph S. Hayden, which is also hereby incorporated by reference. An integrated optic laser is described in U.S. Pat. No. 5,491,708 issued Feb. 13, 1996 to Malone et al., which is also hereby incorporated by reference.

There is a need in the art for an integrated optical system, including one or more high-powered lasers along with routing and other components, that can be inexpensively mass-produced. The system should be highly reproducible, accurate, and stable.

SUMMARY OF THE INVENTION

The present invention is embodied by a laser component that includes a glass substrate doped with one or more optically active lanthanide species and having a plurality of waveguides defined by channels within the substrate. (As used herein, a "channel within the substrate" is meant to broadly include any channel formed on or in the substrate, whether or not covered by another structure or layer of substrate.) Each substrate waveguide (or "channel") is defined within the substrate as a region of increased index of refraction relative to the substrate. The glass substrate is doped with one or more optically active lanthanide species which can be optically pumped (typically a rare-earth element such as Er, Yb, Nd, or Pr or a combination of such elements such as Er and Yb) to form a laser medium which is capable of lasing at a plurality of frequencies. Mirrors or distributed Bragg reflection gratings may be located along the length of a waveguide for providing feedback to create a laser-resonator cavity. One or more of the mirrors or reflection gratings is made partially reflective for providing laser output.

The laser component may constitute a monolithic array of individual waveguides in which the waveguides of the array form laser resonator cavities with differing resonance characteristics (e.g., resonating at differing wavelengths). The component may thus be used as part of a laser system outputting laser light at a plurality of selected wavelengths. In certain embodiments of the invention, the resonance characteristics of a waveguide cavity are varied by adjusting the width of the channel formed in the substrate which thereby changes the effective refractive index of the waveguide. The effective refractive index can also be changed by modifying the diffusion conditions under which the waveguides are formed as described below. A diffraction Bragg reflector (DBR) grating formed into or close to the waveguide is used, in some embodiments, to tune the wavelength of light supported in the waveguide cavity. Changing the effective refractive index thus changes the effective wavelength of light in the waveguide cavity which determines the wavelengths of the longitudinal modes supported by the cavity. In another embodiment, the resonance characteristics of the waveguide cavities are individually selected by varying the pitch of the DBR reflection gratings used to define the cavities which, along with the effective refractive index for the propagated optical mode, determines the wavelengths of light reflected by the gratings. In still other embodiments, the location of the gratings on the waveguide is varied in order to select a laser-resonator cavity length that supports the desired wavelength of light.

In some embodiments, the laser element is constructed from a glass substrate which is a phosphate alkali glass doped with a rare-earth element such as Er or Yb/Er. The channels defining the waveguides are created by exposing a surface of the substrate to an ion-exchange solvent through a mask layer having a plurality of line apertures corresponding to the channels which are to be formed. The ion exchange may be carried out through an aluminum mask layer in an aluminum or borosilicate glass crucible using molten potassium nitrate as a solvent. Lessened etching of the substrate by the ion-exchange melt has been found to occur in some embodiments that use a tightly sealed aluminum crucible having a graphite gasket between opposing flanges that are tightly bolted together, and having two reserviors, one for holding the salt melt away from the glass wafers during heating (and later cooling) and another reservior for holding the salt melt in contact with the glass wafers during ion-exchange processing. In other embodiments, a borosilicate crucible is used and if the potassium nitrate is pre-baked at a temperature of at least 120 degrees C. for 24–48 hours in an inert argon atmosphere. In other embodiments, the crucible is placed inside a fully enclosed chamber during the ion-exchange process, with the chamber filled with an inert atmosphere. Carrying out the ion-exchange process in an enclosed chamber has been found to lessen surface etching due to oxidation reactions. The exchange of K for Na in the substrate produces a channel in the substrate of higher refractive index than the rest of the substrate, thus defining a waveguide. In another particular embodiment, a sodium nitrate electrode is used to carry out electrical field-assisted diffusion of Na ions into the substrate after the K-diffused waveguides are formed. This has the effect of driving the waveguides deeper into the substrate and giving them a more circular cross section. The buried waveguides thus avoid the effects of corrosive processes that result in surface etching.

In one embodiment, a surface-relief grating forming a distributed Bragg reflection grating is fabricated on the surface of the waveguide by coating the surface with photoresist, defining the grating pattern in the photoresist holographically or through a phase mask, developing the photoresist pattern, and etching the grating pattern into the waveguide with a reactive ion system such as an argon ion mill. In certain embodiments, a more durable etch mask allowing more precise etching and higher bias voltages is obtained by depositing chromium on the developed photoresist pattern using an evaporation method which causes the chromium to deposit on the tops of the grating lines.

BRIEF DESCRIPTION OF THE DRAWINGS

FIG. 1-A1 shows an isometric view of a distributed Bragg reflector waveguide laser array realized using a single pitch grating and diffused waveguides with varying effective index.

FIG. 1-A2 shows the single frequency output power at 1536.3 nm as a function of launched 977 nm pump power for a laser described in Example A.

FIG. 1-A3 is a Fabry Perot (FP) interferometer scan of the output of a laser described in Example A showing single frequency operation.

FIG. 1-A4 shows the self heterodyne beat spectrum of a laser in Example A with a 75 MHz frequency shift.

FIG. 1-A5 shows laser wavelength as a function of waveguide diffusion aperture width for Example A, with data taken using an automatic spectrum analyzer with a resolution of 0.1 nm.

FIG. 1-B1 shows the index depth profile at the center of a waveguide described in Example B.

FIG. 1-B2 shows the output power characteristics of a laser described in Example B for two different pump wavelengths.

FIG. 1-B3 shows the output spectrum of a laser described in Example B.

FIG. 1-B4 shows the output power of the laser described in Example B as a function of time for two pump power levels.

FIG. 1-C1 shows a plot of laser signal power vs. launched pump power for two different output couplers in Example C.

FIG. 1-C2 is plot of slope efficiency vs. output coupler reflectance for each host glass in Example C.

FIG. 2F shows a top view of an optical chip 200F having eight waveguide sets 211, 212, 213, 214, 215, 216, 217, and 218, each having five different waveguides.

FIG. 2G shows a top view of an optical chip 200G having eight waveguides 220 and one or more tuning thin-film resistors 250 and one or more heat sensors 260.

FIG. 2H shows a top view of an optical chip 200H having eight waveguide sets 210, and a fanned DBR 230H.

FIG. 4A shows a top view of an optical chip 200 used as part of a multi-wavelength laser source 400A.

FIG. 4B shows a top view of an optical chip 200 used as part of a multi-wavelength laser source 400B.

FIGS. 14A through 14F depict the process steps for making a substrate with distinctly doped regions in an exemplary embodiment.

FIGS. 16A and 16B depict side and top views of a tunable laser.

FIGS. 17A and 17B depict side and top views of a tunable laser having a plurality of reflection gratings.

FIGS. 22A and 22B depict a tunable laser that is tuned by altering the effective length of the resonant cavity.

DESCRIPTION OF PREFERRED EMBODIMENTS

Figure 2A:
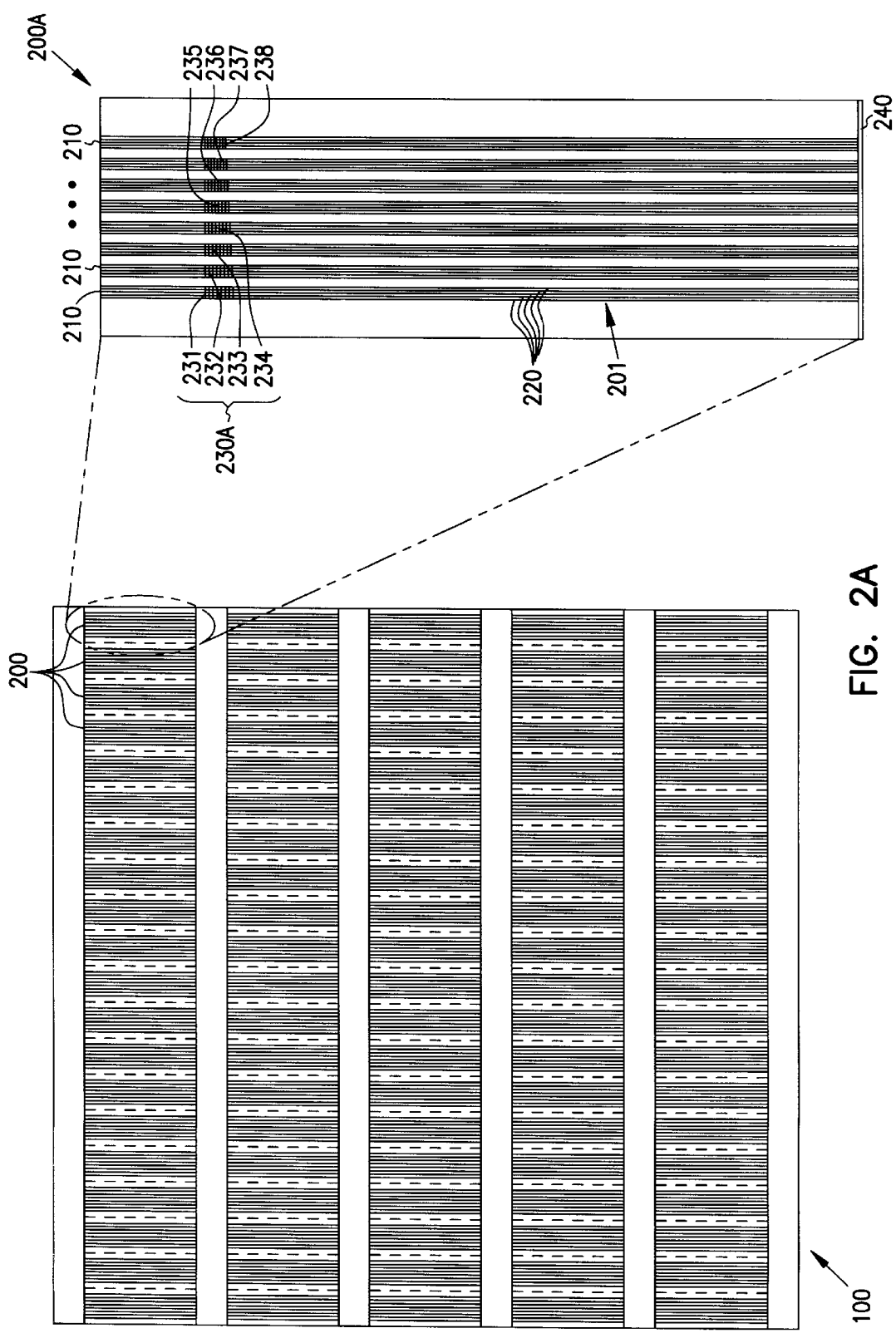
FIG. 2A shows a top view of a glass wafer 100 having a plurality of optical chips 200, and the right-hand portion shows a top view of an optical chip 200A having 40 identical laser waveguides 220 organized in eight waveguide sets 210 and a stepped DBR 230A.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The present invention provides a process for forming waveguides onto (or into) the surface of a glass substrate. In one embodiment, photolithographic techniques define waveguides by changing the index of refraction of waveguide channels formed into the surface of the substrate. In one such embodiment, a glass wafer, approximately 10 cm by 10 cm by 1 mm is cut from a slab of IOG-1 laser glass available from Schott Glass Technologies, Inc., of Duryea, Pa., USA. The surfaces of interest, including a "top" major surface (where "top" refers to an orientation in the Figures of this discussion, and not necessarily to an orientation used in the process or operation of the devices) are polished to optical smoothness.

The present invention is embodied by a laser component that includes a glass substrate doped with one or more optically active lanthanide species, or a laser species that is not a lanthanide, and having a plurality of waveguides defined by channels within the substrate. (As used herein, a "channel within the substrate" is meant to broadly include any channel formed on or in the substrate, whether or not covered by another structure or layer of substrate. As used herein, when an embodiment reciting optically active lanthanide species is described, other embodiments may use a laser species that is not a lanthanide.) Each substrate waveguide (or "channel") is defined within the substrate as a region of increased index of refraction relative to the substrate. The glass substrate is doped with one or more optically active lanthanide species which can be optically pumped (typically a rare-earth element such as Er, Yb, Nd, or Pr or a combination of such elements such as Er and Yb) to form a laser medium which is capable of lasing at a plurality of frequencies. Mirrors or distributed Bragg reflection gratings may be located along the length of a waveguide for providing feedback to create a laser-resonator cavity. One or more of the mirrors or reflection gratings is made partially reflective for providing laser output.

The laser component may constitute a monolithic array of individual waveguides in which the waveguides of the array form laser resonator cavities with differing resonance characteristics (e.g., resonating at differing wavelengths). The component may thus be used as part of a laser system outputting laser light at a plurality of selected wavelengths. In certain embodiments of the invention, the resonance characteristics of a waveguide cavity are varied by adjusting the width of the channel formed in the substrate which thereby changes the effective refractive index of the waveguide. The effective refractive index can also be changed by modifying the diffusion conditions under which the waveguides are formed as described below. Changing the effective refractive index thus changes the effective DBR spacings length of the waveguide cavity which in some embodiments determines the wavelengths of the longitudinal modes supported by the cavity. In another embodiment, the resonance characteristics of the waveguide cavities are individually selected by varying the pitch of the reflection gratings used to define the cavities which, along with the effective refractive index of the waveguide under the DBR for the propagated optical mode, determines the wavelengths of light reflected by the gratings. In still other embodiments, the location of the reflectors on the waveguide is varied in order to select a laser-resonator cavity length that supports the desired wavelength of light.

In some embodiments, the laser element is constructed from a glass substrate which is a phosphate alkali glass doped with a rare-earth element such as Er or Yb/Er. In certain various embodiments, Schott glass type IOG1 or IOG10 (available from Schott Glass Technology, Inc. of Duryea, Pa.) is used. In the case of Yb/Er doped glass, maximal lasing efficiency has been found to occur when the Yb/Er ratio is between approximately 3:1 and 8:1 in some embodiments. The channels defining the waveguides are created by exposing a surface of the substrate to an ion-exchange solvent through a mask layer having a plurality of line apertures corresponding to the channels which are to be formed. The ion exchange may be carried out through an aluminum mask layer in an aluminum or borosilicate glass crucible using molten potassium nitrate as a solvent. Lessened etching of the substrate by the ion-exchange melt has been found to occur in some embodiments if a borosilicate crucible is used and if the potassium nitrate is pre-baked at a temperature of at least 120 degrees C. for 24–48 hours in an inert argon atmosphere. In other embodiments, the crucible is placed inside a fully enclosed chamber during the ion-exchange process, with the chamber filled with an inert atmosphere. Carrying out the ion-exchange process in an enclosed chamber has been found to lessen surface etching due to oxidation reactions. The exchange of K for Na in the substrate produces a channel in the substrate of higher refractive index than the rest of the substrate, thus defining a waveguide. In another particular embodiment, a sodium nitrate ion-exchange melt having a pair of electrodes is used to carry out electrical field-assisted diffusion of Na ions into the substrate after the K-diffused waveguides are formed. This has the effect of driving the waveguides deeper into the substrate and giving them a circular cross section. The buried waveguides thus avoid the effects of corrosive processes that result in surface etching.

In one embodiment, a surface-relief grating forming a distributed Bragg reflection grating is fabricated on the surface of the waveguide by coating the surface with photoresist, defining the grating pattern in the photoresist holographically or through a phase mask, developing the photoresist pattern, and etching the grating pattern into the waveguide with a reactive ion system such as an argon ion mill. In some embodiments, an $SiO_2$ layer, approximately 1 to 2 nm (nanometers), is deposited on the glass before the photoresist coating to improve adhesion to the glass. In certain embodiments, a more durable etch mask allowing more precise etching and higher bias voltages is obtained by depositing chromium on the developed photoresist pattern using an evaporation method which causes the chromium to deposit on the tops of the grating lines.

In some embodiments, a collimated laser beam passed through a suitably defined hologram which then transforms collimated laser beam into one or more interference patterns, such as one corresponding to the grating 230 of FIG. 1A1. In yet another embodiment, a suitably defined hologram simultaneously provides one or more other grating patterns as defined herein.

Fabrication and operation of the above devices, parts and/or systems may be better understood with reference to the following non-limiting examples, each of which describe numerous individual embodiments of the present invention. The improved devices output laser power up to and exceeding 170 milliwatts, and provide slope efficiencies of up to and exceeding 26% in various embodiments, far exceeding the output power and slope efficiency of previous devices that lase in the 1.5 micrometer range when pumped in the 0.98 micrometer range. Further, the devices of the present invention provide reproducible and stable output wavelengths, and can be mass produced inexpensively, as compared to previous devices.

EXAMPLE A

An array of monolithic, single-frequency distributed-Bragg-reflector (DBR) waveguide lasers has been successfully demonstrated operating near 1536 nm wavelengths. In this embodiment, lasers 202 were fabricated by forming waveguides 201 in Yb/Er co-doped phosphate glass by ion exchange. The slope efficiency for each laser 202 as a function of launched pump power is 26% and the thresholds occur at 50 mW of launched pump power. An output power of 80 mW was achieved with 350 mW of coupled pump power. Each laser 202 exhibits stable operation on a single longitudinal mode and all have linewidths less than 500 kHz. A comb 211 of waveguides with varying effective indices allows the selection of wavelength using a single-period grating 230 (i.e., a multiple-groove grating having the same groove spacing for all waveguides).

This description is the first reported monolithic, single-frequency distributed-Bragg-reflector (DBR), waveguide lasers in $Yb^{3+}/Er^{3+}$-co-doped phosphate glass. Over the past several years, the growth in the demand for telecommunications bandwidth generated by new telecommunication services, cable television (CATV), and data communication has driven the rapid development of wavelength-division multiplexing (WDM) and dense-wavelength-division multiplexing (DWDM) where information is simultaneously transmitted on several different wavelengths in the same optical fiber channel. The development of WDM systems has placed demands on laser sources that are difficult to meet using conventional technologies such as semiconductor distributed feedback (DFB) lasers. Issues of concern for such systems include wavelength selectivity, wavelength stability over laser lifetime, tunability, process yield, power limitations, and costs.

Integrated, single-frequency, solid-state lasers using the $Er^{3+}$ ion offer a very promising and competitive alternative to DFB lasers for use in future WDM communications systems and for optically-distributed CATV (cable television). Several demonstrations of waveguide-laser and fiber-laser technology have been discussed in the literature. One primary advantage of solid-state waveguide lasers is that they offer the possibility for arrays of lasers operating on many wavelengths on a single glass chip. Rare-earth-doped waveguide lasers can also provide kilohertz linewidths with high radiance, low noise, and easy coupling to optical fibers.

In some embodiments, single-transverse-mode waveguides at 1535 nm wavelength were fabricated in a commercially available phosphate alkali glass that was co-doped with $0.99 \times 10^{20}$ $Er^{3+}$ ions/$cm^3$ and $3.97 \times 10^{20}$ $Yb^{3+}$ ions/$cm^3$. Phosphate glass is a very good host material for ytterbium and erbium ions since the sensitization efficiency is nearly unity and large doping concentrations are possible before the onset of concentration quenching. The guides were formed by ion exchange of $K^+$ for $Na^+$ using line apertures 3 to 8 μm wide etched in a 200 nm thick aluminum mask layer. The exchange time was 4 hours in an aluminum crucible containing molten $KNO_3$ at 375° C. Inspection of the samples using refractive near-field scanning after the ion exchange revealed that the regions of the glass surface corresponding to the location of the mask openings had become recessed by approximately 1 μm during the exchange process. The mechanism behind the etching of the glass during the exchange is currently under investigation, and it is thought that it is caused by residual water in the hygroscopic nitrate melt. The surface quality of the glass in the recessed regions, as observed using a 1000× Nomarski contrast microscope, appears identical to the original surface of the glass and apparently does not cause significant scattering losses.

In one embodiment, the length of the waveguides prior to the grating fabrication step was 2.2 cm. The waveguide end faces were polished perpendicular to the channels. Measurements of the waveguide mode-field dimensions showed that a single transverse mode was supported in each of the waveguides. For the guide formed with the 6.5 μm mask aperture, the 1/e full-widths of the mode-field intensity were 16 μm wide by 11 μm deep at 1.54 μm wavelength. It supported multiple transverse modes at the 977 nm pump wavelength. However, when the device was lasing, the pump energy was confined primarily within the lowest-order transverse mode, which had 1/e dimensions of 13 μm wide by 9.5 μm deep. All measurements of the intensity profile are within an estimated experimental error of ±10%.

In this embodiment, a DBR surface relief grating 230 was fabricated holographically in a 0.5 μm thick layer of Shipley 1805 photoresist (available from Shipley Company) using a 90° corner that split a collimated laser beam into two beams. The corner was mounted on a rotation stage so that the angle of the two beams could be varied. One surface of the corner was a mirror, and the other surface was a vacuum chuck for holding the sample. Light from a 457.8 nm Ar-ion laser was spatially filtered by focusing through a 15 μm pinhole using a 20× objective lens. The beam was collimated using a 76 mm diameter lens with a 350 mm focal length. The exposure angle was set to write a grating with a pitch of Λ=507.8 nm. For a waveguide with estimated effective index of 1.515±0.003, this pitch should provide laser operation at λ=1538.6 nm±3 nm. The exposure time for the photoresist was 18 s with 3.85 mW incident in each arm on the 0.44 $cm^2$ exposed region (0.8 cm long×0.55 cm wide). The grating was developed in undiluted Shipley CD-30 (available from Shipley Company) developer. During the development, the diffraction of light from a 632.8 nm HeNe laser was monitored. When the first-order diffracted power reached a peak, the grating was removed, rinsed, and dried.

Before the DBR grating was formed by transferring the photoresist pattern into the glass by Ar-ion sputtering, 40 nm of Cr was deposited on the surface with the specimen inclined 60° to the electron-beam evaporation source. Mounting the specimen in this way causes Cr to accumulate only on the tops of the grating lines and not in the grooves, thus providing a durable etch mask that will perform better in the Ar-ion sputtering step. The grating was etched in the glass for 20 minutes using a reactive ion etching system with a 6.67 Pa (50 mTorr) Ar-ion plasma. The low-pressure plasma created a large self-bias voltage of 1700 V when running at 365 W of coupled power with frequency 13.5 MHz. The electrode spacing was 3.2 cm. After etching, the sample 200 was cleaned ultrasonically in photoresist stripper at 85° C. In one such embodiment, a 5 minute rince in TCE (trichloroethylene), is followed by a 5 minute rince in acetone, and then followed by a 5 minute rince in TCE methyl alcohol.

FIG. 1-A1 is an illustration of the completed DBR laser array.

The waveguide laser cavities 202 were formed by placing a thin, highly reflecting (R=99.9% at 1540 nm, R=15% at 977 nm) dielectric mirror 240 on the pump input facet. The mirror 240 was held in place by a spring clip, and index-matching fluid was used between the mirror 240 and the waveguide facet. The DBR grating 230 was used as the laser output coupler. The laser 202 was tested by coupling light from a Ti:Al$_2$O$_3$ laser tuned to a wavelength of 977 nm using a 4× objective lens with a numerical aperture of 0.1. The launching efficiency was estimated to be between 65 and 71 percent. To determine the launching efficiency we measured the Fresnel reflectance of the input mirror, the loss of the launching objective, and the excess coupling loss.

FIG. 1-A2 shows the laser output power as a function of launched pump power and the spectrum of the laser. The waveguide diffusion aperture for this waveguide was 8 µm. The slope efficiency as a function of launched pump power is calculated to be 26 percent when we take the coupling factor to be 71 percent.

The reflectance of the grating was estimated using the simplified laser formula derived from the theory of Rigrod:

$$\frac{P_1}{P_2} = \frac{1-R_1}{1-R_2}\sqrt{\frac{R_2}{R_1}}$$

where $P_1$ is the output power at the grating end and $P_2$ is the output power at the end opposite the grating. $R_1$ is the grating reflectance and $R_2$ is the reflectance of the attached mirror. Two mirrors were used with reflectances of 80 and 90 percent for $R_2$. For both cases the grating reflectance, $R_1$, was calculated to be 65 percent.

To investigate the longitudinal mode structure of the laser, the laser output was coupled into an optical fiber scanning Fabry-Perot interferometer with a free spectral range of 124 GHz.

FIG. 1-A3 shows that the laser operated on a single longitudinal mode when the coupled pump power did not exceed 300 mW. The laser was robustly single frequency with TE polarization, and no mode hopping was observed. The inset in FIG. 1-A3 shows that a second longitudinal mode appeared when the coupled pump power exceeded 300 mW. In this pump regime, the laser was unstable and exhibited mode hopping, single-frequency operation, and dual-frequency operation. By measuring the frequency spacing between the longitudinal modes, the physical length of the laser cavity was determined to be 1.4 cm.

The linewidth of the laser was measured using a conventional self-heterodyne configuration with a 75 MHz frequency shift. The path length difference between the two arms was 10 km corresponding to a linewidth resolution limit of 30 kHz for a Gaussian line shape. Optical isolators were used in both arms to prevent optical linewidth narrowing due to feedback; however, the output end of the laser was not beveled.

FIG. 1-A4 shows the self-heterodyne spectrum. The laser linewidth obtained from this measurement was 500 kHz.

Finally, the laser wavelengths of other waveguides on the chip were measured using an automatic spectrum analyzer with a resolution of 0.1 nm. Seven of the eleven waveguides on the chip exhibited laser oscillation. The waveguides formed through the smaller apertures did not achieve threshold because the smaller mode volumes caused a reduction of the gain such that the 45 percent transmittance loss of grating could not be overcome.

FIG. 1-A5 shows the change in wavelength trend as the waveguides were scanned. The wavelength increases as the diffusion aperture width increases, which is consistent with increasing effective index as the aperture width increases.

This example has demonstrated an array of high power, robustly single-frequency, integrated, DBR waveguide lasers operating near 1536 nm wavelength. The slope efficiencies of the lasers are 26 percent based on launched pump power, and the threshold is less than 50 mW when pumped at a wavelength of 977 nm. The linewidths of the lasers were measured to be 500 kHz, and the outputs were linearly polarized in a TE mode. The temperature stability of the lasers and the relative intensity noise (RIN) are currently being investigated. It is expected that with diode laser pumping, the RIN will be similar to other results presented for single-fluency fiber lasers and will fall below −150 dB/Hz above 10 MHz. It is anticipated that the output power and efficiency will increase and the threshold power will decrease when the grating reflectance is increased. This is possible with only minor adjustments to the grating fabrication process. Further improvements will also be realized by directly coating the high reflector onto the waveguide end facets. It has been shown that lasers with several output wavelengths can be integrated on a single glass substrate. This example shows that stable, multi-wavelength, WDM sources with wavelengths falling on the International Telecommunications Union (ITU) grid can be realized by writing several gratings of varying period in Yb/Er-co-doped glass waveguides formed by ion exchange.

EXAMPLE B

Compact solid-state lasers based on the 1.5 µm $Er^{3+}$ transition hold promise as sources for optical fiber communication systems. $Yb^{3+}$ is commonly used as a sensitizer in $Er^{3+}$ lasers because it has a much larger absorption cross section near 980 nm than $Er^{3+}$, and it efficiently transfers its excited state energy to the upper level of the $Er^{3+}$ laser. The $Er^{3+}/Yb^{3+}$ glass waveguide laser, in particular, has several advantages over lasers in $Er^{3+}$-doped or $Er^{3+}/Yb^{3+}$-co-doped glass fiber and bulk crystalline or glass hosts. Ion-exchanged waveguides can be fabricated in glasses with large ytterbium concentrations (approximately 5–15%) which allows the devices to be substantially shorter than fiber lasers. This results in lower polarization and output power noise, caused by thermal and mechanical stress-induced birefringence, and a smaller device volume. Short (approximately 1–2 cm)

laser cavities are also of interest because of the potential for realizing high-pulse-repetition rate (GHz), passively mode-locked lasers. Unlike bulk devices, waveguide lasers can be designed to operate in a single transverse mode independent of the operating power or pump laser transverse mode profile, and do not require the alignment of bulk mirrors. In addition, the mode field sizes in waveguides can be designed to closely match those of optical fiber for efficient coupling with fiberoptic systems. One disadvantage of $Er^{3+}/Yb^{3+}$ glass waveguide lasers, up to this point, has been the relatively low output powers (up to a few milliwatts) available from these devices. Increased output power will greatly expand the utility of these devices. A cw $Er^{3+}/Yb^{3+}$-co-doped phosphate glass waveguide laser which has produced 168 mW of output power at around 1540 nm for 611 mW of launched pump power at 979 nm has been described.

Waveguides were fabricated in a commercially available phosphate glass. The glass was co-doped with 1.15 wt % $Er_2O_3$ ($0.99 \times 10^{20}$ ions/cm$^3$) and 4.73 wt % $Yb_2O_3$ ($3.97 \times 10^{20}$ ions/cm$^3$). Waveguides were formed by $K^+$—$Na^+$ exchange through a 200 nm thick Al mask layer with channel apertures ranging from 3 to 8 $\mu$m in width. The exchange occurred in a $KNO_3$ melt at 375° C for 4 hours in an Al crucible. The laser results reported here are for a 6.5 $\mu$m wide mask aperture. Inspection of the samples after the ion exchange process revealed that the regions of the glass surface corresponding to the location of the mask openings had become recessed by one to two microns during the exchange process. The widths of the etched channels were close to the widths of the mask apertures and uniform in width and depth.

In one embodiment, the refractive index as a function of position within the exchanged sample was analyzed using a refractive near-field scanning method.

FIG. 1-B1 shows the index depth profile at the center of the waveguide formed with the 6.5 $\mu$m mask aperture for a wavelength of 633 nm. This method allows the relative position and absolute index values to be determined with an accuracy of 0.7 $\mu$m and 0.001, respectively.

In one embodiment, the transverse modes of the waveguides were characterized by coupling light at the wavelength of interest into one end of the waveguide and imaging the light emerging from the other end onto a calibrated infrared camera. The uncertainty of the mode dimensions determined using this method are approximately 10%. The device supported a single transverse mode at 1.54 $\mu$m having dimensions of 14.5 $\mu$m wide by 7.5 $\mu$m deep (measured at the 1/e points). The waveguide supported multiple transverse modes at 980 nm. However, when the device was lasing, the pump energy was confined primarily within the lowest order transverse mode which had dimensions of 6.4 $\mu$m wide by 3.6 $\mu$m deep.

In one embodiment, the device was pumped with a $Ti^{3+}$:sapphire laser. The waveguide laser cavities were formed by placing thin dielectric mirrors on the polished waveguide end faces. The mirrors were held in place by small spring clips, and index matching oil was used between the mirror and waveguide end face to reduce losses. The pump laser was launched through one of the mirrors with a 4× microscope objective. The laser output and unabsorbed pump were collimated with a 16× microscope objective and separated using filters. The laser cavity was 20 mm in length. The mirror through which the pump was launched had reflectivities of >99.9% and 15% at 1536 and 980 nm, respectively. The output coupler had a reflectivity of 80% at 1536 nm and transmitted 85% of the incident pump power.

Neither the waveguide length nor the cavity output coupling has been optimized. The launching efficiency was estimated to be ≦71%, including losses due to the transmission of the input mirror and launching objective. The laser output power characteristics for two different pump wavelengths are illustrated in FIG. 1-B2. When pumped at 979 nm, the launched pump power threshold was 51 mW. A maximum output power of 168 mW was obtained for 611 mW of launched 979 nm pump power. A lower threshold could be obtained by tuning the pump laser off of the $Yb^{3-}$ absorption peak. For a pump wavelength of 960 nm, the threshold was 23 mW. The slope efficiency for both pump wavelengths was approximately 28%.

Using the broad-band cavity described above, the $Er^{3+}/Yb^{3+}$ laser usually operated at several wavelengths simultaneously. A typical laser spectrum showing simultaneous operation at 1536.0, 1540.7, and 1544.8 nm is depicted in FIG. 1-B3. The wavelength(s) of operation could be shifted by passing some of the collimated 1.5 $\mu$m laser output through a prism and reflecting it back through the prism and into the waveguide using a dielectric mirror. This formed a weakly coupled, external cavity. By rotating the prism, it was possible to produce wavelengths ranging from 1536 to 1595 nm.

A common feature of many three-level, rare-earth lasers is sustained relaxation oscillations which can be caused by small fluctuations in the pump laser power. Fluctuations in output power at frequencies ranging from approximately 0.5 to 1.5 MHz were observed in this laser. The amplitude of the fluctuations decreased with pump power.

FIG. 1-B4 shows the output power as a function of time for pump power levels just above threshold and 9.4 times threshold. At the low pump power, the output power fluctuations of approximately 30% (peak to peak) of the average power were observed. At the high pump power, the fluctuations decreased to approximately 5% (peak to peak) of the average power. The $Ti^{3+}$:sapphire pump laser exhibited output power fluctuations of approximately 2–3%. Using a diode laser as the pump source should result in much quieter operation of the $Er^{3+}$ laser.

Output powers exceeding 160 mW at 1.5 $\mu$m are now available from glass waveguide lasers fabricated using a simple thermal ion exchange process. Improvements in the waveguide fabrication process to optimize the waveguide geometry (such as incorporating a field-assisted ion exchange and fabricating buried waveguides), as well as adjustments in the cavity length and coupling, should improve the performance of these devices.

EXAMPLE C

Waveguide lasers and amplifiers in glasses codoped with $Er^{3+}$ and $Yb^{3+}$ are promising candidates for compact multifunctional devices operating near 1.5 $\mu$m. The large gain bandwidth resulting from the inhomogeneously broadened glass host makes these devices ideal for narrow-line sources useful in wavelength division multiplexing applications. In addition, due to the short cavity lengths, these waveguide lasers offer high repetition rate (GHz) mode-locked lasers using semiconductor saturable absorbers. Such lasers are ideal as sources for soliton communications systems. Other applications requiring an eye-safe wavelength, such as remote sensing and range finding, could benefit from compact, high power continuous-wave (cw) or Q-switched waveguide laser sources based on these materials. Additionally, optical amplifiers offering gain in the range of 1530 to 1550 nm are realized for some embodiments of the present invention.

It is known that the $Er^{3+}$ concentration must be kept relatively low (approximately 1 wt %) in these devices in order to reduce the deleterious effects of cooperative upconversion. However, the concentration of sensitizing $Yb^{3+}$ is not limited due to any ion-ion interaction, and is expected to have a significant effect on device performance. Various authors have investigated this problem theoretically. This example reports experimental results for waveguide lasers fabricated by $K^+$—$Na^+$ ion exchange in silicate glasses with $Yb^{3+}$:$Er^{3+}$ ratios of 3:1, 5:1, and 8:1. In addition, we show how it is possible to increase the signal mode volume and optimize the pump-signal overlap through judicious choice of laser host material and ion exchange processing parameters. The result is an $Er^{3+}$/$Yb^{3+}$ waveguide laser producing as much as 19.6 mW at 1.54 $\mu$m with 398 mW of launched pump power at 974.5 nm.

The devices were fabricated in a commercially available laser glass. The glass is a phosphorus-free, mixed-alkali, zinc-silicate glass. Nominally, all three glasses were doped with 1 wt % (one percent by weight) $Er_2O_3$ ($0.85 \times 10^{20}$ $cm^{-3}$) and the glasses designated NIST10A, NIST10C, and NIST10E contain $Er^{3+}$:$Yb^{3+}$ ratios of 3:1 ($2.47 \times 10^{20}$ $Yb^{3+}$ ions $cm^{-3}$), 5:1 ($4.16 \times 10^{20}$ $cm^{-3}$), and 8:1 ($6.83 \times 10^{20}$ $cm^{-3}$), respectively. The results reported were obtained by ion exchange through 3 $\mu$m apertures in 150 nm thick Al mask layers. The ion exchange was carried out in a melt of 100% $KNO_3$ for 14 hours at 400° C.

The optical modes of the waveguides at the signal wavelength were evaluated by coupling a 1.5 $\mu$m LED into a waveguide while the output was imaged onto an infrared camera. The waveguides supported a single transverse mode of dimensions 20.5±2.1 $\mu$m wide by 11.5±1.2 $\mu$m deep (measured at the 1/e points) at the signal wavelength. Since the host glass is a mixed alkali glass which contains potassium, the introduction of additional potassium by the ion-exchange process leads to a very small index change. As a result, the optical mode is not tightly confined. Although the waveguides supported multiple transverse modes at the pump wavelength, an examination of the pump mode while the device was lasing showed that only the lowest-order mode was excited. The result is excellent overlap between the pump and signal modes. The pump mode measured 15.2±1.5 $\mu$m wide by 7.0±0.7 $\mu$m deep.

Waveguide losses were estimated at 860 nm, away from the broad $Yb^{3+}$ absorption peak. Cutback measurements performed on samples prepared identically to the laser sample indicated an average waveguide loss of 0.25±0.11 dB/cm for NIST10A, 0.32±0.08 dB/cm for NIST10C, and 0.66±0.12 dB/cm for NIST10E. The coupling efficiency for the pump light was determined by measuring the pump throughput at 860 nm and correcting for losses from the input and output optics, as well as waveguide loss using the above-reported loss figures. Coupling efficiencies typically fell between 50% and 70%. The coupling efficiency was assumed to be identical at 860 nm and 975 nm.

For laser characterization, dielectric mirrors were attached to the polished end facets of the waveguide laser sample with index matching fluid and held in place by a small clip. The input mirror had a reflectance at 1536 nm of 99.9% and a transmittance at the pump wavelength of >90%. Various output couplers with reflectances ranging from 60 to 98% were used. All output couplers were also transmissive at the pump wavelength. The waveguide devices were pumped by a Ti:sapphire laser operating at 974.5 nm, which is the peak of the $Yb^{3+}$ absorption spectrum in this glass host. Pump light was coupled into the waveguide with a 4× (0.10 NA) microscope objective, and the output signal light was collected by a 20× objective. For signal power measurements, the output from the waveguide was focused onto an InGaAs power meter.

The laser performance was investigated as a function of device length as well as output coupler reflectance. FIG. 1-C1 shows a plot of laser signal power vs. launched pump power for two different output couplers, for a 1.68 cm long device fabricated in the glass with 5 $Yb^{3+}$ per $Er^{3+}$ ion. The slope efficiencies and laser thresholds were determined by fitting a line to the laser data. The lowest threshold was achieved when using a 98% reflector as output coupler. This device lased with a launched pump power threshold of approximately 59 mW. The slope efficiency of this device was 2.0% with respect to launched pump power. The highest slope efficiency was realized with a 70% reflector used as an output coupler. In this case, a slope efficiency of 6.5% was achieved with a launched pump power threshold of 86 mW. For a launched pump power of 398 mW, this laser produced 19.6 mW of output power.

A plot of slope efficiency vs. output coupler reflectance for each host glass appears in FIG. 1-C2. Data for device lengths in each glass which were experimentally determined to give the highest slope efficiency are plotted. Highest slope efficiency performance in each host is also compared in Table 1.

Table 1: Performance data for highest slope efficiency devices fabricated in IOG10 silicate glass with different $Yb^{3+}$:$Er^{3+}$ dopant ratios.

| $Yb^{3+}$:$Er^{3+}$ | Device length (cm) | Output coupler reflectance (%) | Slope efficiency (%) | Launched pump threshold (m/W) | Output with 400 MW pump (mW) |
|---|---|---|---|---|---|
| 3:1 | 1.80 | 80 | 5.2 | 52 | 17.9 |
| 5:1 | 1.68 | 70 | 6.5 | 86 | 20.4 |
| 8:1 | 1.42 | 70 | 5.0 | 238 | 8:1 |

The experimental results indicate that the optimal dopant ratio is close to 5 $Yb^{3+}$ for each $Er^{3+}$. Increasing the dopant ratio from 3:1 to 5:1 leads to an improvement in slope efficiency. Further increasing the dopant ratio to 8:1 does not improve the efficiency of the device, but does lead to a substantial penalty in pump power requirements. Recent efforts have been directed toward expanding the above results using a rigorous scalar model. In addition, alteration of the potassium content of the host glass is being investigated as a way to adjust the modal volume and decrease pump threshold requirements.

Some Unique Aspects of the Example Embodiments

The present invention provides the first demonstration of a monolithic single-frequency waveguide laser in a spectroscopically superior phosphate glass, and provides predictable emission wavelength if effective index of the waveguide is known. Embodiments of the invention as described above provide a high-power laser up to 80 mW (previous state-of-the-art in phosphate glass was 5 mW by D. Barbier, et al. at Conference on Optical amplifiers and applications, 1995, and for an Er-doped DBR laser was approximately 2 mW by Technical University of Denmark Microelectronic Centret using sputter-deposited silica doped with Er), a very high-slope efficiency laser of 26% (previous state-of-the-art in phosphate glass was 16% by D. Barbier, et al. at Conference on Optical amplifiers and applications, 1995, and about 11 percent by Yeniay, et. al., Lehigh University & Lucent), and a uniquely high-coupling efficiency of pump light from optical fiber as enabled by the low index change caused by the potassium-sodium ion-exchange process used in forming the waveguides.

One embodiment provides making the photoresist grating by evaporation of a chromium coating with the sample inclined 60 degrees to the normal of the evaporation source beam. This results in a hard metal coating on the tops of the photoresist bars that constitute the grating, thus allowing a more selective sputter etch of the grating and the use of higher DC bias voltages.

One embodiment provides a DBR grating exposure in standard photoresist using an optical phase mask. Another embodiment provides a uniquely high diffraction efficiency of photoresist grating by actively monitoring during photoresist developing to optimize diffraction efficiency and to ensure proper resist development. Also, etching of the grating by Ar-ion sputtering in a standard reactive-ion-etching system results in no CFC (chlorinated fluorocarbon) emissions as with reactive-ion-etching of silica glass. Using only argon gas at low pressure also provides a nearly sinusoidal grating without excess loss due to improved isotropic plasma etching. Isotropic etching in an argon ion plasma (the inert Ar ions come in at a range of angles rather than a single angle) also leaves a smooth surface (approximately sinusoidal) resulting in lower grating scattering losses.

In some embodiments, the effective index of refraction of one or more waveguides on a chip are measured before applying the grating, and a grating pitch (line spacing) is chosen to achieve the desired wavelength.

Further Embodiments and Improvements

As described above, some embodiments of the invention utilize a potassium-sodium ion-exchange process. In some situations, this process can result in the glass surface being etched significantly when exchange is done in an aluminum crucible. Accordingly, a further improvement provides a borosilicate (a.k.a. Pyrex) crucible for performing the ion exchange as opposed to an aluminum crucible. This has been found to greatly reduce the amount of surface attack and etching of the phosphate glass caused by the $KNO_3$ ion-exchange melt. As noted above, water content is also a factor in producing surface etching. Therefore, another embodiment provides an improved control of water content of melt by baking the $KNO_3$ at a temperature of at least approximately 120° C. for a period of 24–48 hours in an inert argon atmosphere.

Another factor involved in surface etching is due to oxidation reactions occurring during the ion-exchange process. Accordingly, in another embodiment, the crucible containing the molten ion-exchange solvent together with the substrate is placed inside a fully enclosed and sealed chamber (containing an inert atmosphere such as argon) during the ion-exchange process.

In another particular embodiment of the invention, the waveguides are buried within the substrate. This not only results in reduced scattering losses in the waveguide, but also largely avoids the corrosive effects that are another factor in surface etching. In this embodiment, the surface of the glass substrate is covered by a deposited titanium mask with narrow (about 2–5 microns in width) photolithographically applied apertures used to locally control the ion-exchange process. The waveguides are first formed just beneath the substrate surface by immersing the substrate, at an elevated temperature, in a molten salt bath of potassium nitrate. Diffusion of K ions from the solvent into the substrate through the mask apertures in exchange for Na ions results in a channel being formed with a higher refractive index believed due to the smaller electronic polarizability of the K ions relative to Na. The surface waveguides thus formed are then buried below the substrate surface by a second, electric-field-assisted ion-exchange using molten sodium nitrate as an ion source. An electrode immersed in a sodium-nitrate bath is used to carry out the electric-field-assisted diffusion of Na ions into the substrate which exchanges for K ions diffused in the previous step. This has the effect of causing further diffusion of K ions of the waveguides deeper into the substrate, covering the waveguides with a lower refractive index material due to the Na ions diffused into the substrate surface. This also gives the waveguides a roughly oval or circular cross-section which minimizes surface scattering losses. The use of K diffusion (as opposed to diffusion with a more mobile element such as Ag) to form the waveguides results in a stable structure that is able to be migrated deeper into the waveguide under the influence of the applied electric field.

Another embodiment provides a sputter or CVD (chemical-vapor deposition) deposited $SiO_2$ buffer layer coating over the surface of optical chip 200 to reduce surface scattering losses from the surfaces of waveguides 220. It is also difficult to get standard photoresist to properly adhere to phosphate glass. It has been found that providing a 1–2 nm of sputter-deposited $SiO_2$ on the surface of the phosphate glass greatly improves adhesion of photoresist during processing.

One embodiment provides an ion-exchange process that results in a slightly buried waveguide with the highest index in the waveguide occurring slightly below the surface. This reduces scattering loss. Another embodiment provides a mode field shape and size that is optimized for laser operation using a field-assisted, ion-exchange process where the electric field is varied as a function of time. In an Yb/Er doped waveguide laser, there are performance tradeoffs related to the Yb-doping concentration, the Er-doping concentration, and the Yb/Er-doping ratio. It has been generally thought that more Yb doping will result in better laser performance. An alternate approach to optimizing the amount of Er and the Yb/Er ratio involves evaluating the relative performance tradeoffs between Yb—Er cross-relaxation efficiency and the total number of inverted Er ions in the laser cavity.

An example of the doping selection process is as follows:

As more Yb is incorporated into a glass with a constant Er concentration, the average distance between Er ions and Yb ions decreases, thus causing a rise in the cross-relaxation efficiency of Yb—Er energy transfer. The disadvantage of this is that more of the pump power is absorbed in a shorter distance. The result is that less Er ions will be inverted in a certain length, thus there will be less gain available as well as additional reabsorption loss in the 3-level Er ion laser system. Laser performance will suffer. The penalty will be higher thresholds and lower slope efficiencies. To obtain the best possible performance, both the Yb—Er cross relaxation and the total number of inverted ions as a function of pump power must be optimized simultaneously. For one particular device, a 4:1 ratio of Yb/Er was chosen with an Er concentration of $1\times10^{20}$ ions/$cm^3$. The total doping concentration is constrained since the glass is doped by substitution of Yb and Er for Na, and the total doping concentration cannot exceed 10 wt %.

By adding feedback elements to the waveguides in the form of reflection gratings, a variety of laser structures can be obtained using a process in accordance with the invention. In one embodiment, many gratings can be formed by exposing the photoresist fabricated on each single glass chip of a wafer using a silica plate that has multiple pitch phase masks printed on it. Accurate linewidth control and control of differential linewidth can be provided using phase masks with more than one period on a single substrate. Another embodiment provides a laser wavelength that is selected by printing a single pitch grating over an array of optical waveguides with each waveguide in the array having a different refractive index. Still another embodiment provides a laser wavelength that is selected by fabricating a single pitch grating on an array of identical optical waveguides where each waveguide crosses the grating at varying angles.

Another embodiment of the invention relates to a multi-compositional glass substrate formed with regions of differing concentrations of the same or different dopants, which regions may be used to form complex integrated-optic structures. The glass substrate may be doped by a selected amount in certain regions with one or more optically active lanthanide species or a laser species (which may be a rare-earth element such as Er, a combination of Er and Yb, or Pr) and undoped in others in such a manner that allows the independent control of gain, loss, and absorption in various regions of the glass. In regions that are undoped, light of many wavelengths can propagate with virtually no loss, while in doped regions various wavelengths can be absorbed causing gain to occur at other wavelengths for creating laser amplifiers or resonators.

The optical devices integrated into the substrate may constitute both active and passive devices. Active devices such as laser amplifiers and resonators use the excited laser medium to amplify or generate light while passive devices such as filters, splitters, and waveguides use the substrate as a transmission medium. Passage of a light signal at a lasing wavelength through a doped region of the substrate results in absorption of the light by the laser species, however, unless the population inversion is maintained by pump light. In order to avoid loss of signal, the doped region must be pumped which adds to the energy requirements of the system. Whether the region is pumped or not, however, transmitting the light signal through a doped region also adds noise to the signal by amplified stimulated emission. The present invention overcomes these problems by providing an undoped region through which light signals can be transmitted and in which passive devices can be located. The undoped region can also provide a pathway by which pump light from an external source can be directed to laser amplifiers or resonators in the substrate without intervening absorption of the light by a laser or sensitizer species.

The left-hand portion of FIG. 2A shows a top view of a glass wafer 100 having a plurality of optical chips 200 according to one embodiment of the present invention. In some embodiments, the top surface of the wafer 100 will be processed to form a large number (e.g., in one embodiment, one hundred devices) of individual optical chips 200 (each forming an optical system) that are diced apart and individually packaged. For example, in one embodiment, each optical chip 200 is a portion of glass wafer 100 diced to about 1.5 cm by 0.5 cm. In some embodiments, glass wafer 100 is processed, for example according to one of the methods described below in Examples A through C.

FIGS. 2A, 2B, 2C, 2D, 2E, 2F, 2G, and 2H show details of various embodiments of optical chips 200 processed, for example, according to one of the methods described below in Examples A through C of this description.

In some embodiments, optical chip 200 is used in a communications system that uses dense wavelength-division multiplexing (DWDM), wherein, for example, 40 different wavelengths are each modulated to carry a different channel of information, and then all 40 channels are combined and passed on a single optic fiber. In one such embodiment, each channel's wavelength differs from the next channel's wavelength by 0.8 nanometers. Thus, for example, an optical chip 200 would be designed to output laser light at wavelengths of 1536.0, 1536.8, 1537.6, 1538.4, 1539.2, 1540.0, 1540.8, and 1541.6 nanometers (nm). Other optical chips of a system would be designed to lase at eight other channel wavelengths. Thus a 40-channel system only needs five such different part numbers (i.e., unique part designs), rather than 40 different part numbers used in conventional approaches.

In some embodiments, an input mirror 240 (e.g., a multi-layer dielectric mirror that is transmissive at the pump-light wavelength 980 nm, and reflective at the lasing wavelength, approximately 1536 nm, of laser 202) is deposited on an end face of optical chip 200 opposite the DBRs 230. In such an embodiment, input mirror 240 provides the interface through which pump light is launched. In other embodiments, an external mirror 240 is placed against that face to provide the feedback function desired for lasing and the pump-light-launching function. Input mirror 240 is designed to transmit as much light as possible at the pump wavelength (in one embodiment, 0.98 micrometers), while reflecting as much light as possible at the output wavelength (in one embodiment, a selected wavelength near 1.54 micrometers as tuned by the corresponding DBR 230). DBR 230 for each laser 202 provides a reflection function that provides feedback tuned to a specific resonant frequency that is a function of the effective index of refraction of the waveguide at the DBR 230 and the effective spacing of the grating forming DBR 230. By varying the effective DBR spacing and/or the effective index of refraction, a desired laser wavelength can be obtained.

In other embodiments, the pump light is launched into each waveguide 201 in a manner bypassing mirror 240 (such as, for example, from a cladding optical layer fabricated adjacent to optical chip 200, such that pump light is injected over a substantial length of each operating waveguide 201, or for another example, from a pump waveguide formed adjacent to, but separated from, each operating waveguide 201 so that evanescent coupling launches the pump light into the operating waveguides 201). In some such embodiments, mirror 240 is made to reflect as much light as possible, both at the pump wavelength of about 980 nm and at the Erbium laser wavelength of about 1536 nm. In still other embodiments, mirror 240 is made slightly transmissive at a wavelength of about 1536 nm, in order to be an output port for the Erbium laser formed of each waveguide 201.

In this description, reference numeral 201 is used generally to refer to any particular waveguide, whether or not it is similar to other waveguides 201 on the same optical chip 200. In contrast, other numerals on waveguides refer to specific types of waveguides (e.g., ones having the same effective index of refraction). Thus, reference numeral 220 refers to waveguides that are substantially the same as other waveguides 220 (in terms of width, depth, cross-section shape, size, doping concentration, and/or effective index of refraction, etc.). Similarly, reference numeral 221 refers to waveguides that are substantially the same as other waveguides 221, but different than, for example, waveguides 222, 223, 224, or 225.

The right-hand portion of FIG. 2A shows a top view of an optical chip 200A having 40 laser waveguides 220 organized in eight waveguide sets 210 according to one embodiment of the present invention. Optical chip 200A is processed to form a plurality of waveguide sets 210 (e.g., in one embodiment, eight waveguide sets), each waveguide set 210 having redundant identical waveguides 220 (e.g., in one embodiment, each waveguide set has five waveguides 220; and in one embodiment, each waveguide set is used such that one waveguide 220 is used, and, in this embodiment, the other four provide redundancy in case one or more do not function properly). In the embodiment shown, each waveguide 220 is overlaid with a diffraction Bragg reflector (DBR) 230 which forms one reflector (i.e., mirror) of a laser 202, and which determines the wavelength of the laser light.

For the optical chip 200A of FIG. 2A, the stepped DBR 230A of each waveguide set 210 is fabricated to a spacing designed to resonate at a single predetermined wavelength for that respective set, with each set having a respective set DBR (231, 232, 233, 234, 235, 236, 237, and 238) defining a different output wavelength. In one embodiment, only eight of the 40 waveguides 220 are used for eight respective lasers 202; the others are provided for redundancy. Each waveguide set 210 includes five identical waveguides 220. Thus, the set DBR 231 for the first waveguide set 210 is designed such that all five waveguides 220 of that waveguide set 210 will lase at the same wavelength, and any one of those waveguides 220 of that set 220 can be used as the laser for the desired wavelength of that waveguide set 210. Within a given waveguide set 210, the grating spacings are the same for all five waveguides 220. However, each of the set DBRs 231, 232, 233, 234, 235, 236, 237, and 238 are designed for a different output wavelength. Thus optical chip 200A is designed to provide eight lasing waveguides 220 each outputting light at one of eight predetermined wavelengths that are tuned by the eight DBRs 230A. This works well for systems in which the process used to form the waveguides is well controlled such that the desired effective index of refraction for each waveguide 220 can repeatedly be obtained with high yield.

In some embodiments, optical chip 200 is configured to accommodate process variations that affect the effective DBR spacing and/or the effective index of refraction, and still provide a high yield of optical chips 200 that provide the desired output wavelengths.

Figure 2C:
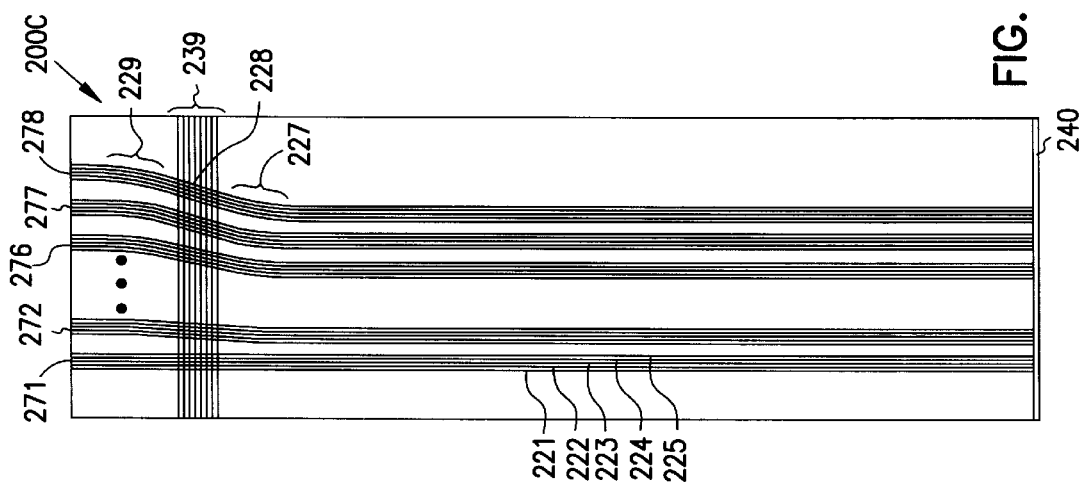
FIG. 2C shows a top view of an optical chip 200C having eight waveguide sets 271, 272, 273, 274, 275, 276; 277, and 278, each having five different waveguides 221, 222,223, 224, and 225.
Figure 2B:
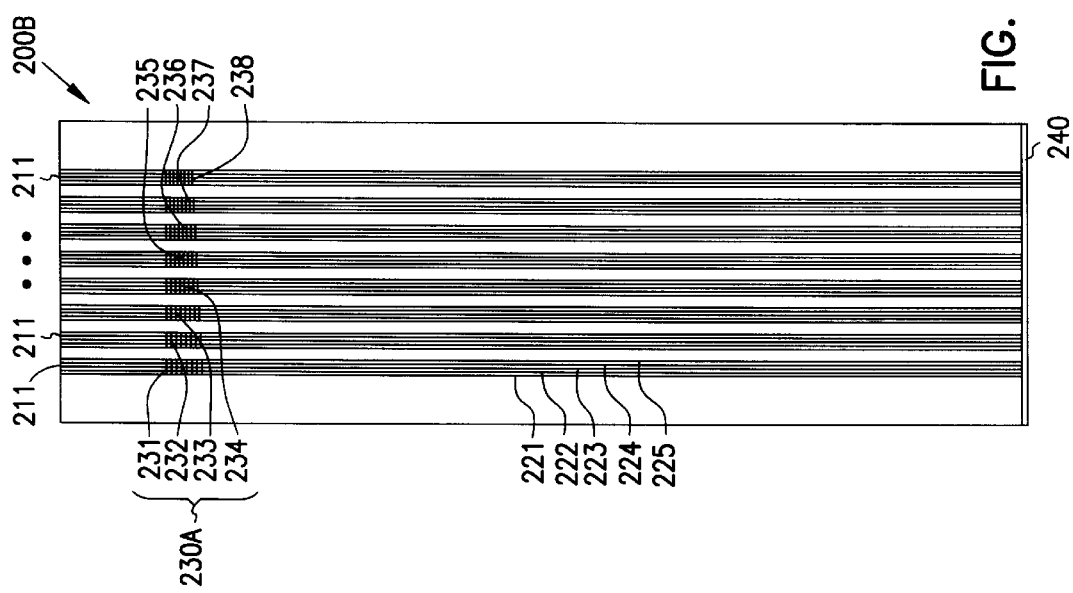
FIG. 2B shows a top view of an optical chip 200B having eight waveguide sets 211, each having five different waveguides 221, 222, 223, 224, and 225 and a stepped DBR 230A.

FIG. 2B shows a top view of an optical chip 200B having eight waveguide sets 211, each having five different waveguides 221, 222, 223, 224, and 225 and a stepped DBR 230A. The five different waveguides 221, 222, 223, 224, and 225 of each waveguide set 211 are each made with a different waveguide mask width, thus provide five different effective indices of refraction and thus resonate at five different wavelengths for a given effective DBR grating spacing. However, each waveguide set 211 is identical to the others, and each contain identical respective waveguides 221, 222, 223, 224, and 225. The stepped DBR 230A provides eight different effective grating spacings, one for each waveguide set 211. Within a given waveguide set 211, the grating spacings are the same for all five waveguides 221, 222, 223, 224, and 225. Thus, when the process variations provide the desired effective index of refraction on waveguide 221 of the first waveguide set 211, the same desired effective index of refraction will be found on the corresponding waveguide 221 of all the other sets. Further, when process variations (such as a slight change in the angle between waveguide 221 and its DBR 230) provide different effective DBR spacings, the same changes affect every waveguide group 211. This provides the advantage that when the desired output wavelength is achieved on waveguide 221 of the first waveguide set 211, the corresponding desired output wavelength will be found on the corresponding waveguide 221 of all the other waveguide sets. Similarly, when the desired output wavelength is achieved on waveguide 222 of the first waveguide set 211, the corresponding desired output wavelength will be found on the corresponding waveguide 222 of all the other sets. Thus, a ferrule holding eight optical fibers at the predetermined center-to-center spacings of waveguide sets 211 can be easily aligned such that each of the eight optical fibers are aligned to the correct respective lasing wavelength. This provides high yield and easier and cheaper assembly of the completed optical device using optical chip 200.

In some embodiments, a system will combine up to forty (40) or more different channels for transmission on a single optical fiber. Each channel's wavelength differs from the next channel's wavelength by 0.8 nanometers. Thus, for example, in some embodiments, an optical chip 200 is designed to output laser light at wavelengths of 1536.0, 1536.8, 1537.6, 1538.4, 1539.2, 1540.0, 1540.8, and 1541.6 nanometers (nm) (i.e., eight consecutive wavelengths of the forty standard wavelengths). Other optical chips of a system would be designed to lase at eight other successive channel wavelengths. Thus a 40-channel system only needs five such different part numbers (i.e., unique part designs), rather than 40 different part numbers in conventional approaches. In other embodiments, optical chip 200 for a first part number is designed to output laser light at wavelengths of 1536.0, 1542.4, 1548.8, 1555.2, 1561.6, 1568.0, 1574.4, and 1580.8 nm (i.e., every eighth wavelength of the forty standard wavelengths, that is, eight channels spaced 6.4 nanometers apart).

Note that the relative spacing differential of the gratings of DBRs 231–238 is exaggerated in the schematic FIGS. 2A–2H in order to be readily perceptible. The actual spacing differential ratio will be as little as 1536.8/1536.0, or about 1.000521 to obtain the different channel wavelengths of 1536.0 and 1536.8 nm. In one embodiment, the DBR spacing differentials are obtained by varying the angle between two interfering laser beams used to define the DBR, such that the lines of constructive and destructive interference of the laser beams form a pattern corresponding to each desired DBR grating. In some embodiments, a mask is used to define the areas of photoresist on chip 200 that will be exposed to each pattern. In other embodiments, the set of patterns is formed into a silicon master. These patterns are then transferred or embossed to a photoresist layer (or a polymer coating) by light exposure or pressure.

FIG. 2C shows a top view of an optical chip 200C having eight waveguide sets 271, 272, 273, 274, 275, 276, 277, and 278, each having five different waveguides 221, 222, 223, 224, and 225. In this embodiment, a single DBR spacing 239 is used for all eight waveguide sets. Waveguide set 271 provides straight waveguides as are used in the embodiment of FIG. 2B, each crossing DBR 239 at the same angle (e.g., 90 degrees). However, the five waveguides of waveguide set 272 each cross DBR 239 at the same angle as one another but a slightly different angle than that of waveguide set 271. Likewise, the crossing angles of waveguide sets 273, 274, 275, 276, 277, and 278 are also each slightly different. Thus, the effective DBR spacings of each waveguide set is different than that of the other waveguide sets, however, this is achieved using a single DBR spacing. In some embodiments, each waveguide set is gently curved at region 227, then passes straight across DBR 239 at region 228, and then is gently curved again at region 229 to exit with a substantially perpendicular waveguide at the upper edge of optical chip 200. The center-to-center spacings of the eight waveguide sets 271, 272, 273, 274, 275, 276, 277, and 278 at the upper edge of optical chip 200 are the same (although this spacing may be different from the spacings elsewhere on chip 200), allowing easy alignment of a single ferrule holding eight optical fibers at that predetermined spacing. Thus, this embodiment provides the same five different waveguide widths for each of the eight waveguide sets 271, 272, 273, 274, 275, 276, 277, and 278, but different effective grating spacings for each waveguide set because of the differing angles used (although within a waveguide set, the same angle is used). As with the embodiment of FIG. 2B, because the five waveguides of each waveguide set (271, 272, 273, 274, 275, 276, 277, and 278) are the same as the other respective waveguide sets, but different from one another within a set (different waveguides 221, 222, 223, 224, and 225), when process variations obtain the desired wavelength from one waveguide (e.g., 223) to one optical fiber, the other different respective wavelengths will be obtained at the corresponding waveguides (e.g., 223) of each of the other waveguide sets. In other embodiments (not shown), one or more additional waveguide sets are provided (e.g., a waveguide set 279 at the right-hand side of waveguide set 278, and at an increased angle), such that if one of the waveguides of waveguide set 272 corresponds to the desired wavelength of the fiber that would normally connect to waveguide set 271, then the wavelength for the other seven fibers are obtained at the corresponding waveguide of the next seven waveguide sets including waveguide set 279 (not shown). This redundant waveguide set provides higher yields of usable optical chips 200.

Examples of process variations include the precise width of the waveguide mask, the time, temperature, and concentration of ion-implantation solvents, the composition of the laser glass, the angle between the waveguide and the DBR grating, and other variables.

Figure 2D:
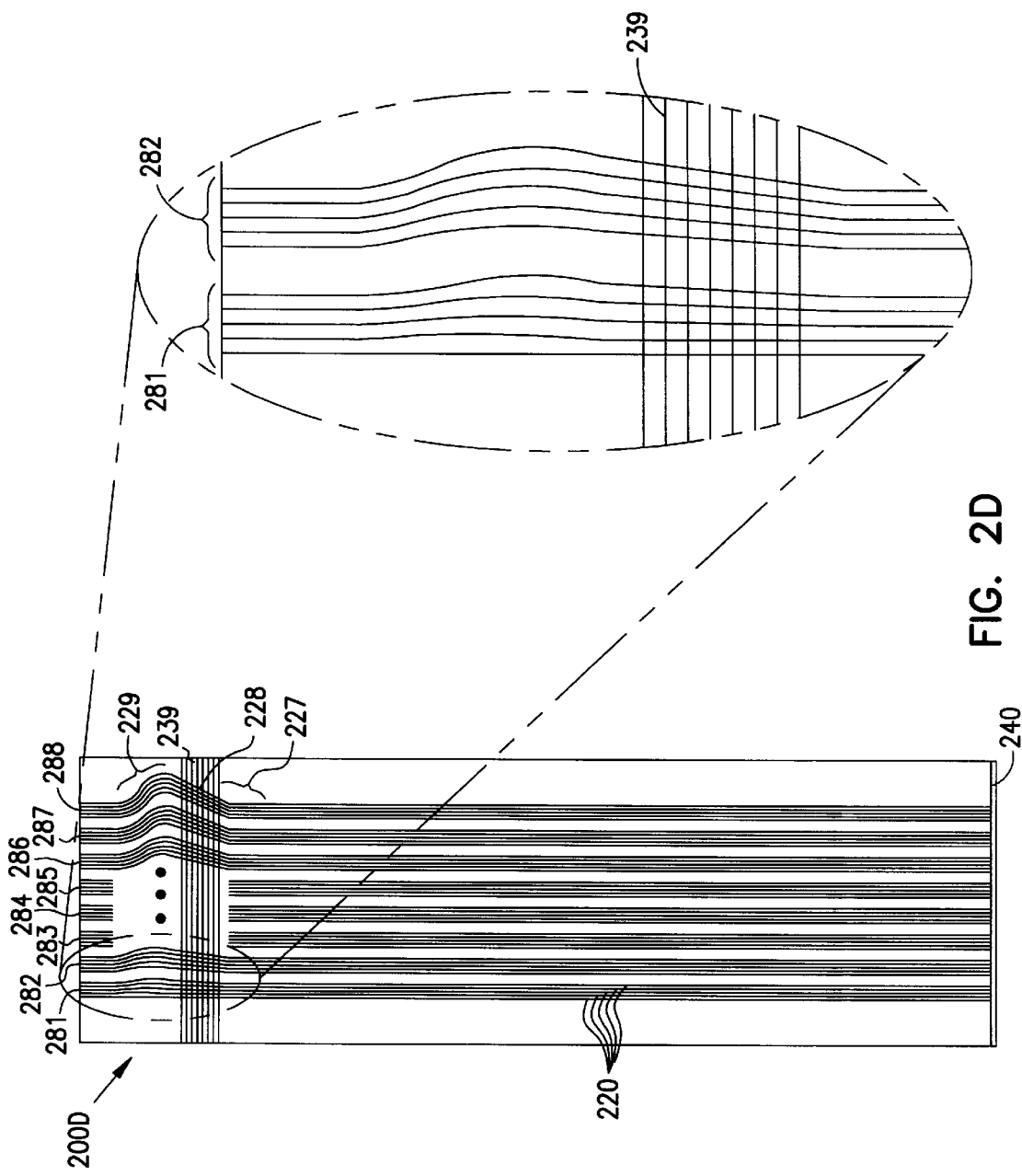
FIG. 2D shows a top view of an optical chip 200D having eight waveguide sets 281, 282, 283, 284, 285, 286, 287, and 288, each having five identically sized waveguides 220, and the right-hand portion shows an enlarged view of a portion of optical chip 200D.

The left-hand portion of FIG. 2D shows a top view of an optical chip 200D having eight waveguide sets 281, 282, 283, 284, 285, 286, 287, and 288, each having five waveguides 220. The right-hand portion of FIG. 2D shows an enlarged view of a portion of optical chip 200D. In this embodiment, the same waveguide width is used for every waveguide, resulting in forty (40) identical effective indices of refraction for all the waveguides 220. Further, a single DBR spacing is fabricated across all waveguides 220. However, within each waveguide set (281, 282, 283, 284, 285, 286, 287, and 288), each waveguide 220 crosses DBR 239 at a slightly different angle. See the right-hand portion of FIG. 2D, where each of the five waveguides 220 of waveguide set 281 cross DBR 239 at a different respective angle. These five angles accommodate process variations such that one of the five waveguides 220 of waveguide set 281 will likely provide the desired wavelength. Further, the five waveguides 220 of waveguide set 282 cross grating 239 at five other angles selected such that when the angle of the corresponding waveguide 220 of waveguide set 281 is at its desired wavelength (e.g., 1536.0 nm), then the corresponding waveguide 220 of waveguide set 282 is also at its desired wavelength (e.g., 1536.8 nm), and so on for the other waveguide sets 283, 284, 285, 286, 287, and 288. In some embodiments, each waveguide is gently curved at region 227, then passes straight across DBR 239 at region 228, and then is gently curved again at region 229 to exit with a substantially perpendicular waveguide at the upper edge of optical chip 200, with each waveguide of a waveguide set (e.g., the second waveguide 220 from the left-hand side of waveguide set 281) spaced from the corresponding waveguides of the other waveguide sets (282, 283, 284, 285, 286, 287, and 288) by an integer multiple of the same center-to-center spacing.

FIG. 2F shows a top view of an embodiment having optical chip 200F having eight waveguide sets 211, 212, 213, 214, 215, 216, 217, and 218, each having five different waveguides. That is, waveguide set 211 includes five different waveguide widths 221, 222, 223, 224, and 225. Waveguide set 212 includes five other different waveguide widths 241, 242, 243, 244, and 245, each selected such that when the process variations achieve the effective index of refraction and effective DBR spacings such that, e.g., waveguide 221 obtains the desired wavelength (e.g., 1536.0 nm) for waveguide set 211, then the corresponding waveguide 241 will obtain the corresponding desired wavelength (e.g., 1536.8 nm) for waveguide set 212. Similarly, each waveguide of each waveguide set 213, 214, 215, 216, 217, and 218 are also set to different widths each selected such that when the process variations achieve the effective index of refraction and effective DBR spacings for any particular waveguide, the corresponding waveguide of the other respective waveguide sets will be at its desired wavelength.

FIG. 2G shows a top view of an optical chip 200G having eight waveguides 220 and one or more tuning thin-film resistors 250 and, optionally, one or more heat sensors 260. In this embodiment, a single identical waveguide 220 is provided in each waveguide set, and each crosses DBR 239 at a different angle. Thin-film resistor(s) 250 heat DBR 239, changing the effective grating spacing based on the temperature coefficient of expansion of the device in the region of DBR 239. The electrical energy supplied is varied to achieve a temperature, and thus an effective grating spacing, of DBR 239 to tune each waveguide to its respective desired wavelength. In this embodiment, all waveguides are tuned to the same temperature. In some embodiments, sensor 260 is used to measure the temperature achieved. In some embodiments, the wavelength is tuned at the manufacturing stage, and the temperature needed to obtain the desired wavelengths is recorded into a memory. Thereafter, sensor 260 is used to measure the temperature and a controller uses this feedback to maintain this recorded temperature value.

In other embodiments (not shown), one or more tuning thin-film resistors 250 and, optionally, one or more heat sensors 260 and associated controller are used with the waveguide/DBR embodiments of FIGS. 2A, 2B, 2C, 2D, 2F, and 2H. In some such embodiments, these temperature-adjustment features are used to tune the wavelengths. In other embodiments, they are used to obtain a known stable temperature to keep the device at its desired wavelengths.

FIG. 2H shows a top view of an optical chip 200H having eight waveguide sets 210, and a fanned DBR 230H. Each waveguide sets 210 has five identical waveguides 220 (i.e., forty identical waveguides). Because fanned DBR 230H provides a different effective DBR grating spacing for each waveguide 220 in a waveguide set 210, process variations can be accommodated such that one waveguide 220 in that waveguide set 210 will have the desired wavelength. Further, each waveguide set 210 is spaced such that each waveguide set 210 will have the corresponding waveguide 220 at the desired wavelength.

Figure 3B:
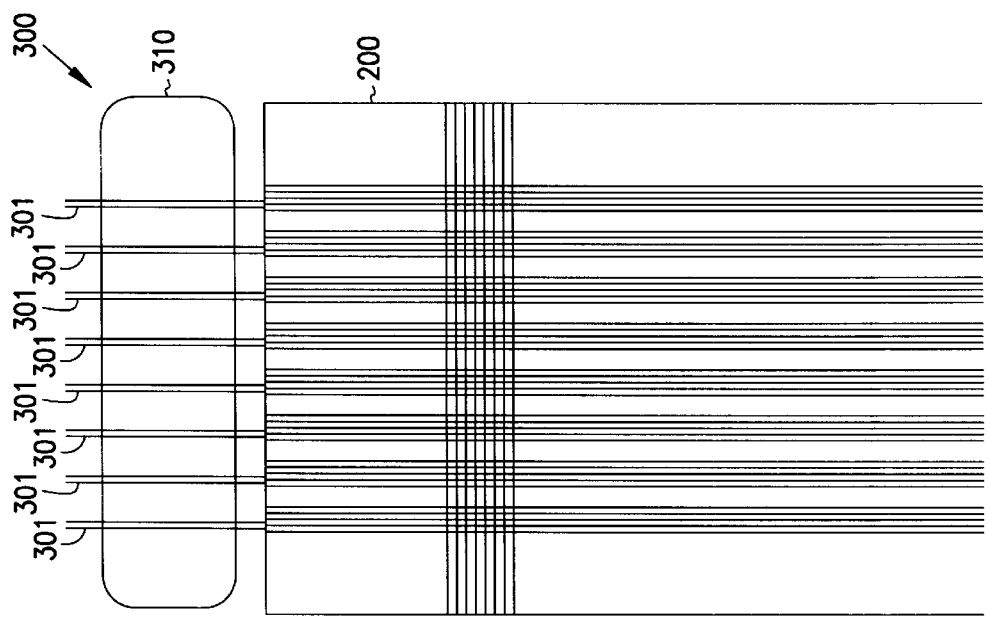
FIG. 3B shows a top view of an optical chip 200 used as part of a multi-wavelength laser source 300B.
Figure 3A:
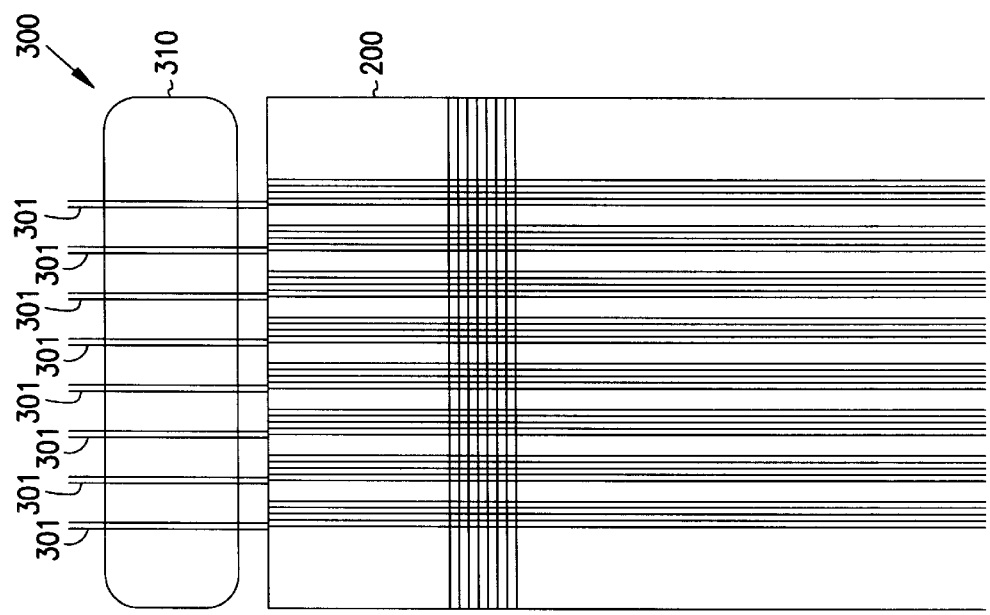
FIG. 3A shows a top view of an optical chip 200 used as part of a multi-wavelength laser source 300A.

FIG. 3A shows a top view of an optical chip 200 used as part of a multi-wavelength laser source 300A according to one embodiment of the present invention. At one interface end of optical chip 200 (i.e., the upper end in FIG. 3A), eight optic fibers 301 are held by alignment block ferrule 310, such that each respective fiber 301 is optically coupled to the emitting end of the left-most or first waveguide of the eight respective waveguide sets 210. In some embodiments, optical chip 200 is designed to provide eight different standard wavelengths, e.g., 1536.0, 1536.8, 1537.6, 1538.4, 1539.2, 1540.0, 1540.8, and 1541.6 nm (i.e., eight consecutive wavelengths of the forty standard wavelengths) or at wavelengths of 1536.0, 1542.4, 1548.8, 1555.2, 1561.6, 1568.0, 1574.4, and 1580.8 nm (i.e., eight wavelengths, chosen to be every eighth one of the forty standard wavelengths). Thus, only five different part numbers are needed to obtain all forty standard wavelengths.

Ferrule 310 has holes or grooves, spaced one from another to match the center-to-center spacing of corresponding waveguides 201 of each waveguide set (e.g., 210, see FIG. 2A), to receive optic fibers 301. In some embodiments, the fibers 301 are secured to ferrule 310 with adhesive. In some embodiments, the inlet end of each hole is chamfered to aid assembly. In some embodiments, the fibers are first secured to ferrule 310 and then trimmed to have ends that are collinear, flat, and perpendicular to the axis of the fibers.

If any one of the first waveguides of optical chip 200 is non-functional or out-of-specification, alignment block ferrule 310 can be moved down to couple to the second waveguides of the eight waveguide sets 210, as shown at the top of FIG. 3B. Similarly, ferrule 310 is again moved if any one of the second set of waveguides is non-functional or out-of-specification, and so on until all five sets of corresponding waveguides are tested. This provides substantial yield improvements for embodiments in which it is difficult to precisely obtain an exact wavelength due to process variations that affect effective indices of refraction or effective DBR spacings, and wherein one or more of the embodiments of FIGS. 2A–2H described above are used to slightly vary the wavelength of each waveguide in each set, but which are designed such that when one waveguide (e.g., 221 of FIG. 2C) of the first waveguide set (e.g., 271 of FIG. 2C) obtains the desired wavelength, then the corresponding waveguide (e.g., 221 of FIG. 2C) of every other waveguide set (e.g., 272, 273, 274, 275, 276, 277, and 278 of FIG. 2C) will also obtain their desired wavelengths (i.e., the process variations affect all waveguides and DBRs the same or proportionately, and the parts are designed based on empirical measurements or theoretical considerations such that a given set of process values will provide corresponding desired wavelengths on one of the sets of corresponding waveguides with a predetermined spacing).

FIG. 3B shows a top view of an optical chip 200 used as part of a multi-wavelength laser source 300 according to one embodiment of the present invention. FIG. 3B shows the output fibers connected to the second waveguide 201 of each waveguide set 210.

FIG. 4A shows a top view of an optical chip 200 used as part of a multi-wavelength laser source 400A. In this embodiment, a pump light source 410 is coupled through a suitable launch-end mirror 240 by butting against the end of a selected one waveguide 201 of a waveguide set 210. For example, in one embodiment, a set of eight semiconductor laser diodes, each lasing at about 0.98 micrometers is used for pump light source 410. Such a source can even be very noisy, emitting a range of frequencies from perhaps as low as 0.96 and as high as 1.00 micrometers, and yet provide a suitable source for a laser tuned to lase at, e.g., 1536.0 nanometers or any of the forty standard ITU wavelengths. In one such embodiment, eight pump laser diodes 401 are used. In some embodiments, pump light source 410 can be moved sideways to optimize coupling into the eight corresponding waveguides that are selected, e.g., by ferrule 310 and its fibers 301 of FIG. 3A.

Figure 4C:
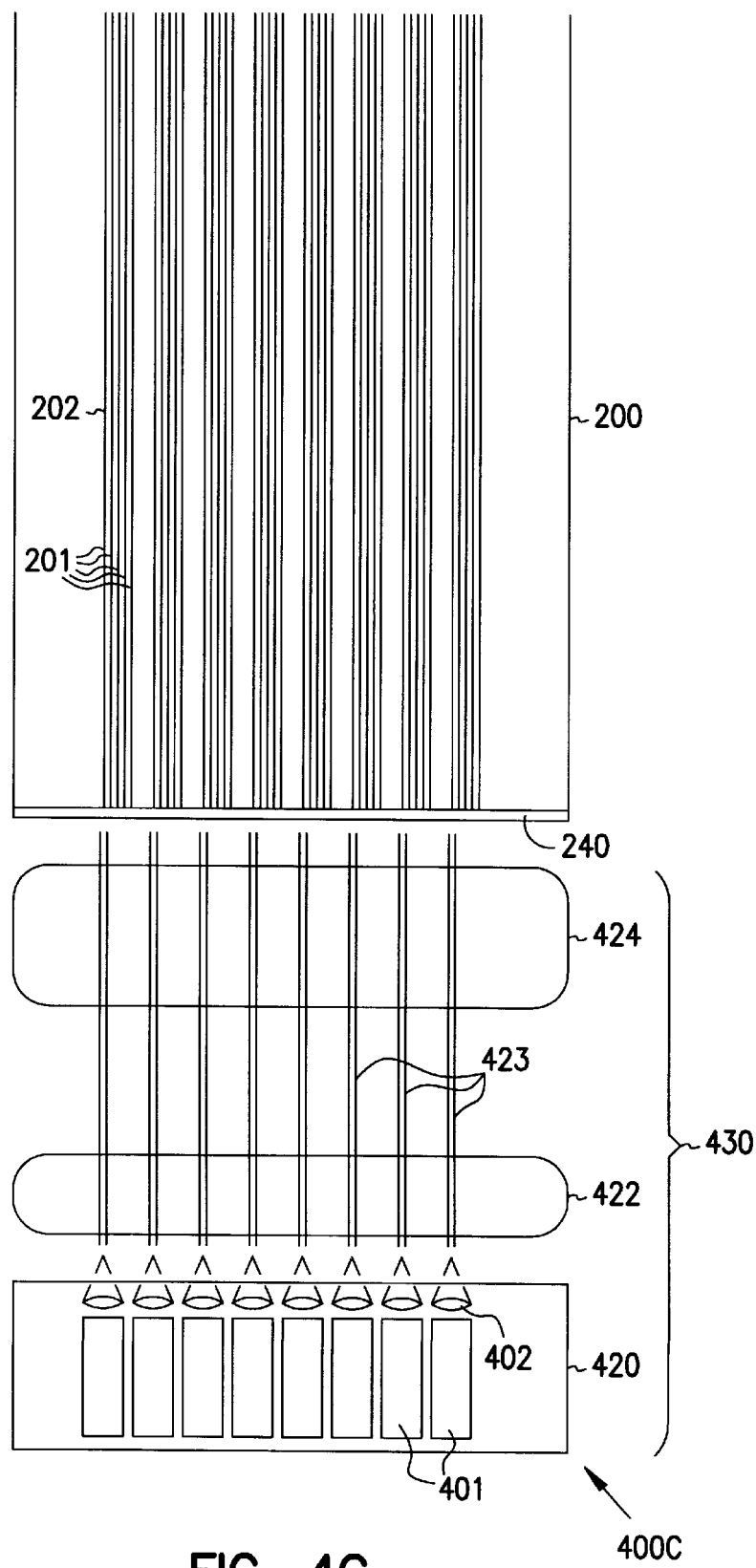
FIG. 4C shows a top view of an optical chip 200 used as part of a multi-wavelength laser source 400C.

FIG. 4B shows a top view of an optical chip 200 used as part of a multi-wavelength laser source 400B. In this embodiment, each pump laser 401 is optically coupled through a lens 402 (which can be a conventional convex-type, e.g., aspherical, lens or a diffraction or holographic lens) that helps concentrate the light from pumps 401 into respective ones of the waveguides 201 that form the respective lasers 202. Note that reference numeral 201 refers to the entire length of the waveguide and to every waveguide whether pumped or not, while reference numeral 202 refers to that portion between mirror 240 and the opposite-end DBR 230 that forms the laser portion, and only to those waveguides that are pumped. Those waveguides that are not pumped and coupled to output fibers 301 are not used. Note that, in the embodiment of FIG. 4A, some pump light may enter unused waveguides causing them to lase and waste energy as heat. In contrast, the embodiments of FIGS. 4B and 4C are better at coupling more light into the desired waveguides and less light into the unused waveguides. This makes temperature management easier.

FIG. 4C shows a top view of an optical chip 200 used as part of a multi-wavelength laser source 400C. In this embodiment, each pump laser 401 is optically coupled through a lens 402 (which can be a conventional convex-type lens or a diffraction or holographic lens) that helps concentrate the light from pumps 401 into respective ones of optic fibers 423 held at one end by ferrule 422 to match the center-to-center spacings of the lasers 401, and at their other ends by ferrule 424 to match the center-to-center spacings of the waveguides 201 that form the respective lasers 202. In some embodiments, the center-to-center spacings of ferrule 422 are different from the center-to-center spacings of ferrule 424.

Figure 5A:
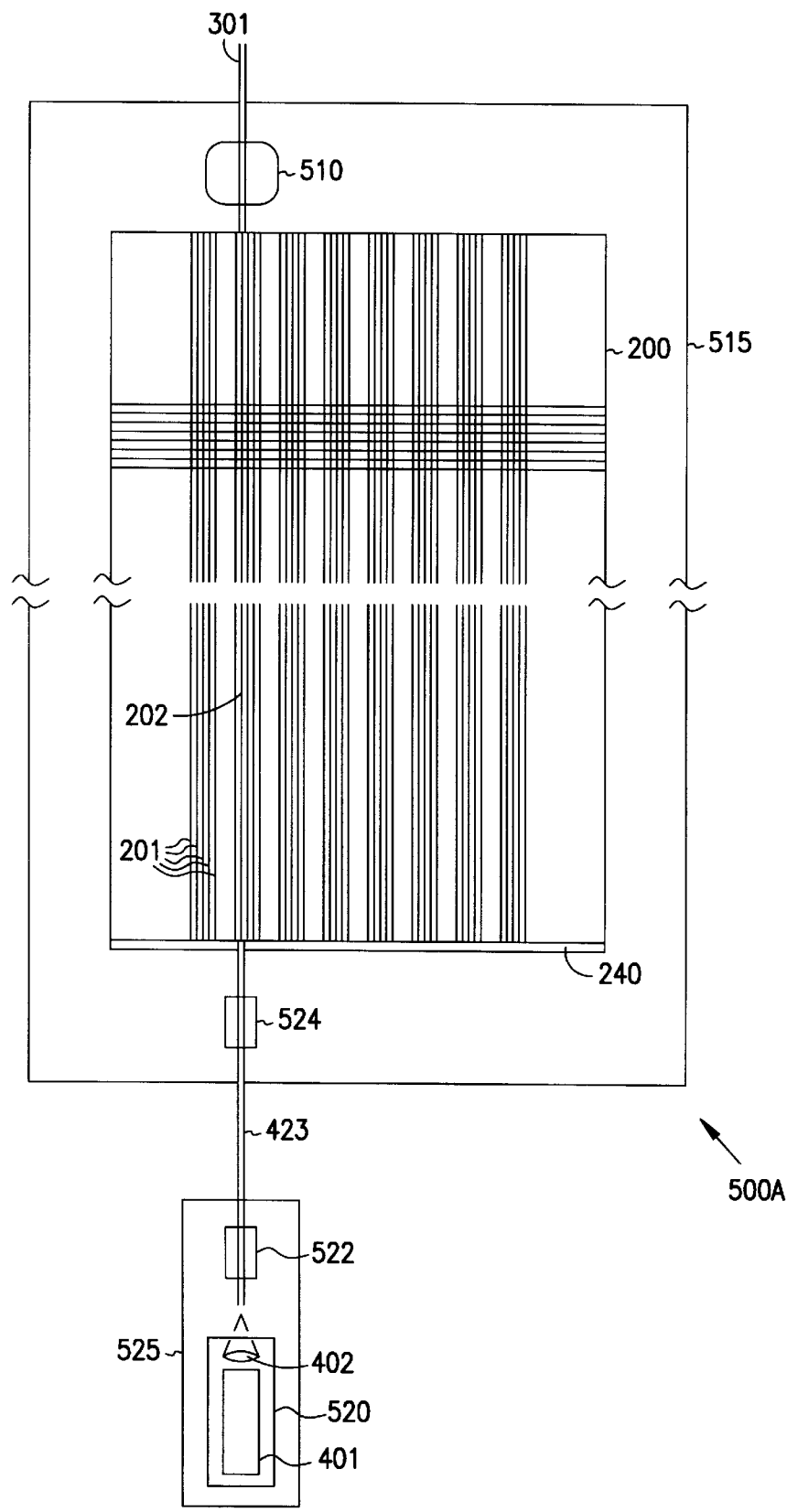
FIG. 5A shows a top view of an optical chip 200 used as part of a single-wavelength laser source 500A.

FIG. 5A shows a top view of an optical chip 200 used as part of a single-wavelength laser source 500A according to one embodiment of the present invention. This embodiment provides a single output wavelength selected from the up to forty available (e.g., in FIG. 5A, wavelength 2 from the second waveguide set) into a single fiber 301. This embodiment also provides a fiber 423 for coupling light from pump laser diode 401 into the desired waveguide 201, a portion of which then becomes laser 202. In this embodiment, pump laser 401 and lens 402 are mounted to laser block 520, which is attached to pump laser assembly 525. Fiber 423 is attached to ferrule 522 which is also attached to pump laser assembly 525. In this embodiment, output laser 202 is selected from all the waveguides of optical chip 200, which is attached to output laser assembly 515. Fiber 423 is also attached to ferrule 524 which is also attached to output laser assembly 515. Fiber 301 is attached to ferrule 510 which is also attached to output laser assembly 515. In some such embodiments, the combination of waveguide characteristics and DBR characteristics is different for every waveguide 201 on chip 200, thus increasing the chance that one of the waveguides will lase at the desired wavelength.

Figure 5B:
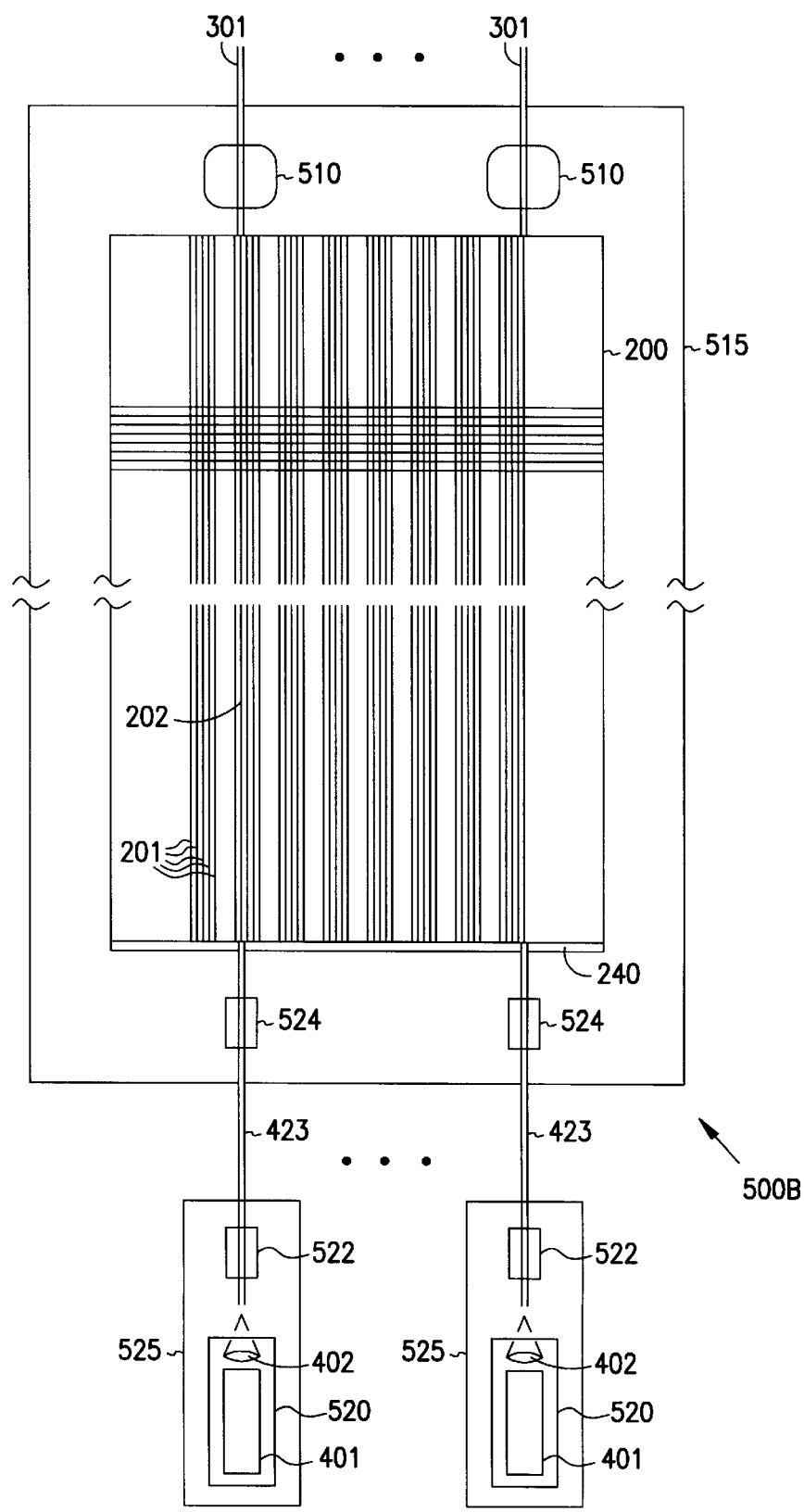
FIG. 5B shows a top view of an optical chip 200 used as part of a multiple-wavelength laser source 500B.

In other embodiments, such as FIG. 5B showing a multiple-wavelength subsystem 500B, multiple ones of the forty waveguides 201 are individually selected, their respective outputs coupled to respective optic fibers 301 held by their respective ferrule 510 to output laser assembly 515, and their respective inputs coupled to respective laser assemblies 525 via respective optic fibers 423 held by their respective ferrule 524 to output laser assembly 515. In this way, the yield of usable optical chips 200 in multiple-wavelength applications is increased, but at the cost of having to individually align each one of the input and output couplings to the usable waveguides 201.

It is to be understood that, in various embodiments of the invention, any of the above output coupling methods and apparatus of FIGS. 3A, 3B and 5 are used in other embodiments of the pump-coupling methods and apparatus of FIGS. 4A, 4B, 4C and 5.

Figure 6:
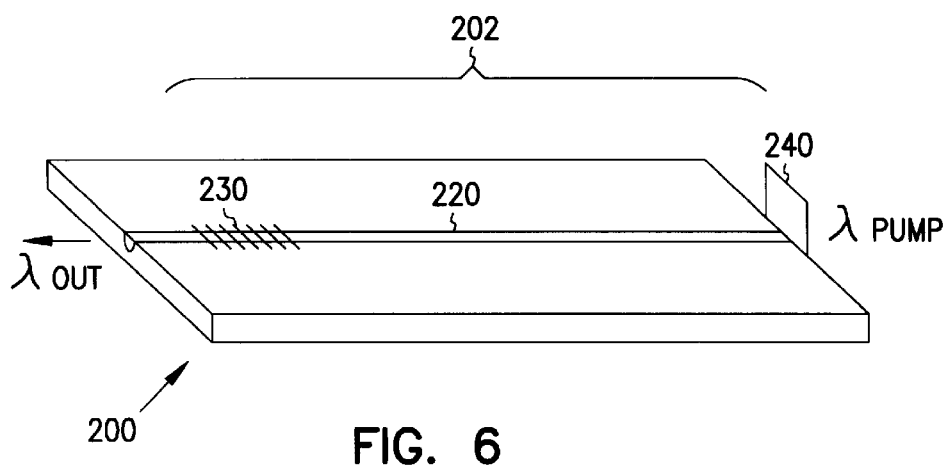
FIG. 6 shows an isometric view of an optical chip 200 having a laser 202 comprising waveguide 220, DBR mirror 230 and optional input mirror 240.

FIG. 6 shows an isometric view of an optical chip 200 having a laser 202 comprising waveguide 220, DBR mirror 230 and optional input mirror 240 according to one embodiment of the present invention. FIG. 6 shows more detail of a single laser 202 having an external launch mirror 240, which is transmissive at the pump light wavelength but highly reflective at the lasing wavelength of laser 202, and is used to launch the pump light into the laser cavity. Other embodiments include redundant waveguides all operating at a single wavelength, other waveguides 220 each having a DBR 230 tuned to a unique wavelength, or combinations thereof, all integrated on a single optical chip 200. In various embodiments, optical chip 200 of FIG. 6 is made with one of the configurations of FIGS. 2A–2H described above. In some embodiments, a plurality of operable lasers 202 are provided on each chip 200.

Figure 7:
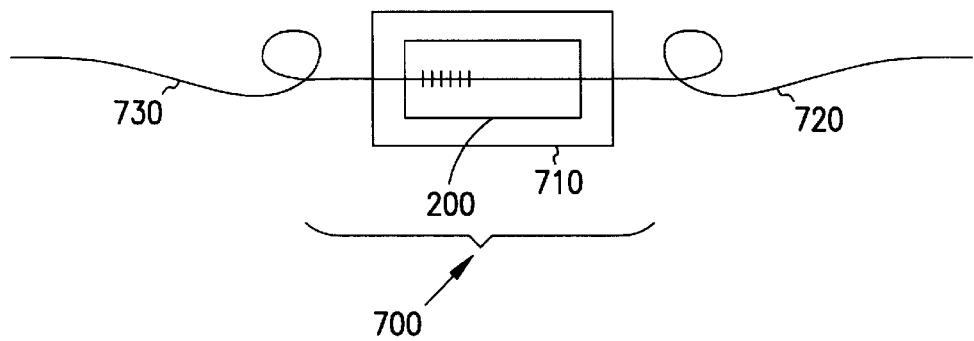
FIG. 7 shows a top view of a packaged device 700 that includes an optical chip 200.

FIG. 7 shows a top view of a packaged device 700 that includes an optical chip 200 according to one embodiment of the present invention. Device 700 includes a hermetically sealed package 710, and is optically pumped, in this embodiment, by light carried by fiber 720, and its laser light is coupled to output fiber 730. While this embodiment includes a laser 202 as described above, it is otherwise a passive device. Such a device takes a pump light input, which can be noisy as described above, and outputs a "clean" laser output light at a different frequency, wherein the output is stable and has a very narrow wavelength spectrum. In various embodiments, optical chip 200 of FIG. 7 is made with one of the configurations of FIGS. 2A–2H described above. In some embodiments, a plurality of operable lasers 202 are provided on each such chip 200.

Figure 8:
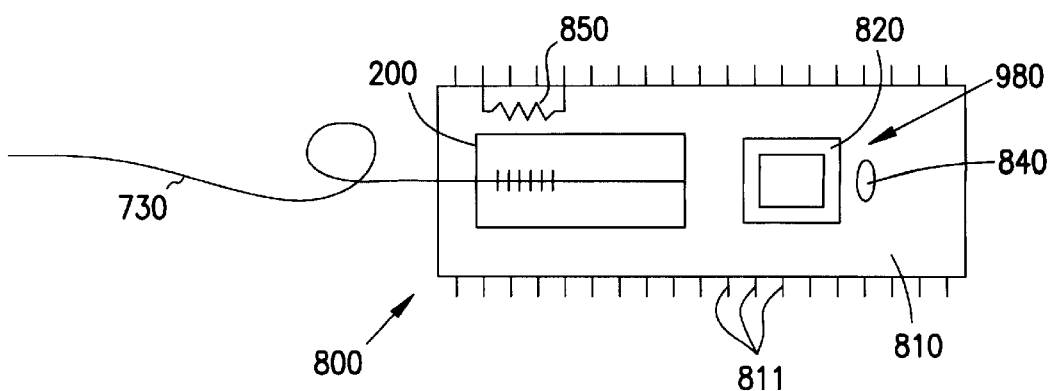
FIG. 8 shows a top view of an integrated device 800 that includes an optical chip 200.

FIG. 8 shows a top view of an integrated device 800 that includes an optical chip 200 according to one embodiment of the present invention. Device 800 includes active components such as a pump laser diode, a photodetector (e.g., a light-sensing diode), a thermistor and electrical connections between and to these components. Some embodiments also include a temperature-maintaining device (such as a resistor or thermoelectric device to heat and/or cool device 800) in order to maintain a constant temperature. Some embodiments also include an output modulator to encode information on the output light. Some such embodiments also include an output combiner to combine the modulated light into a single fiber. The layout of components shown is schematic only.

Figure 9:
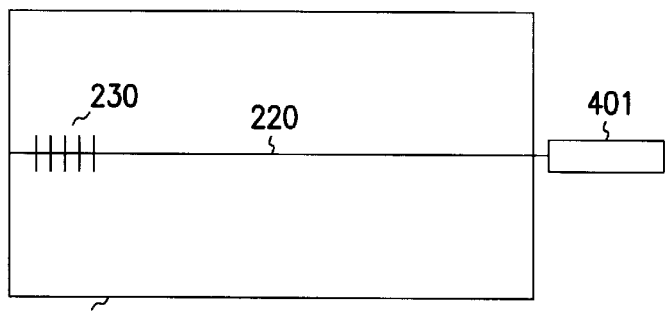
FIG. 9 shows a top view of a laser 900 using direct (butt) coupling that includes optical chip 200.

FIG. 9 shows a top view of a laser 900 using direct (butt) coupling of pump laser diode 310 to optical chip 200 according to one embodiment of the present invention.

Figure 10:
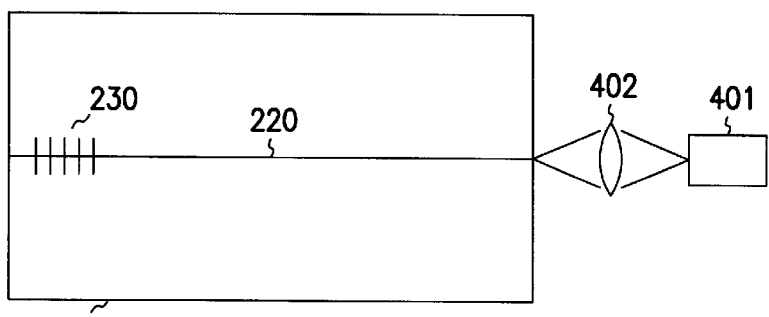
FIG. 10 shows a top view of a laser 1000 using lensed coupling that includes an optical chip 200.

FIG. 10 shows a top view of a laser 1000 using lensed coupling of pump laser diode 310 to optical chip 200 according to one embodiment of the present invention.

Figure 11:
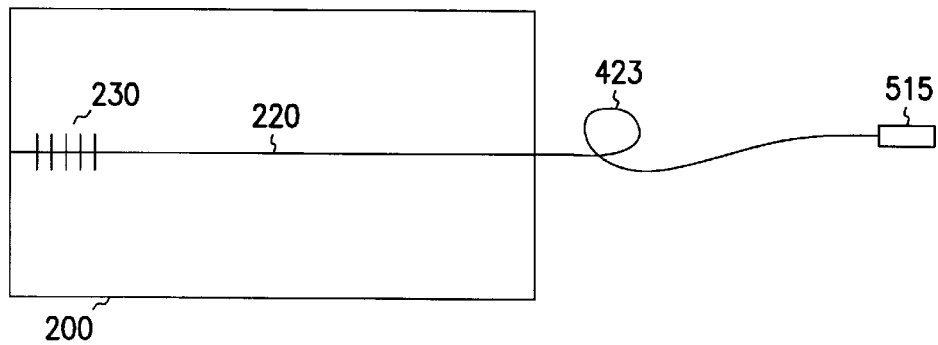
FIG. 11 shows a top view of a laser 1100 using a fiber coupling that includes an optical chip 200.

FIG. 11 shows a top view of a laser 1100 using a fiber coupling of pump laser diode 310 to optical chip 200 according to one embodiment of the present invention.

Figure 12:
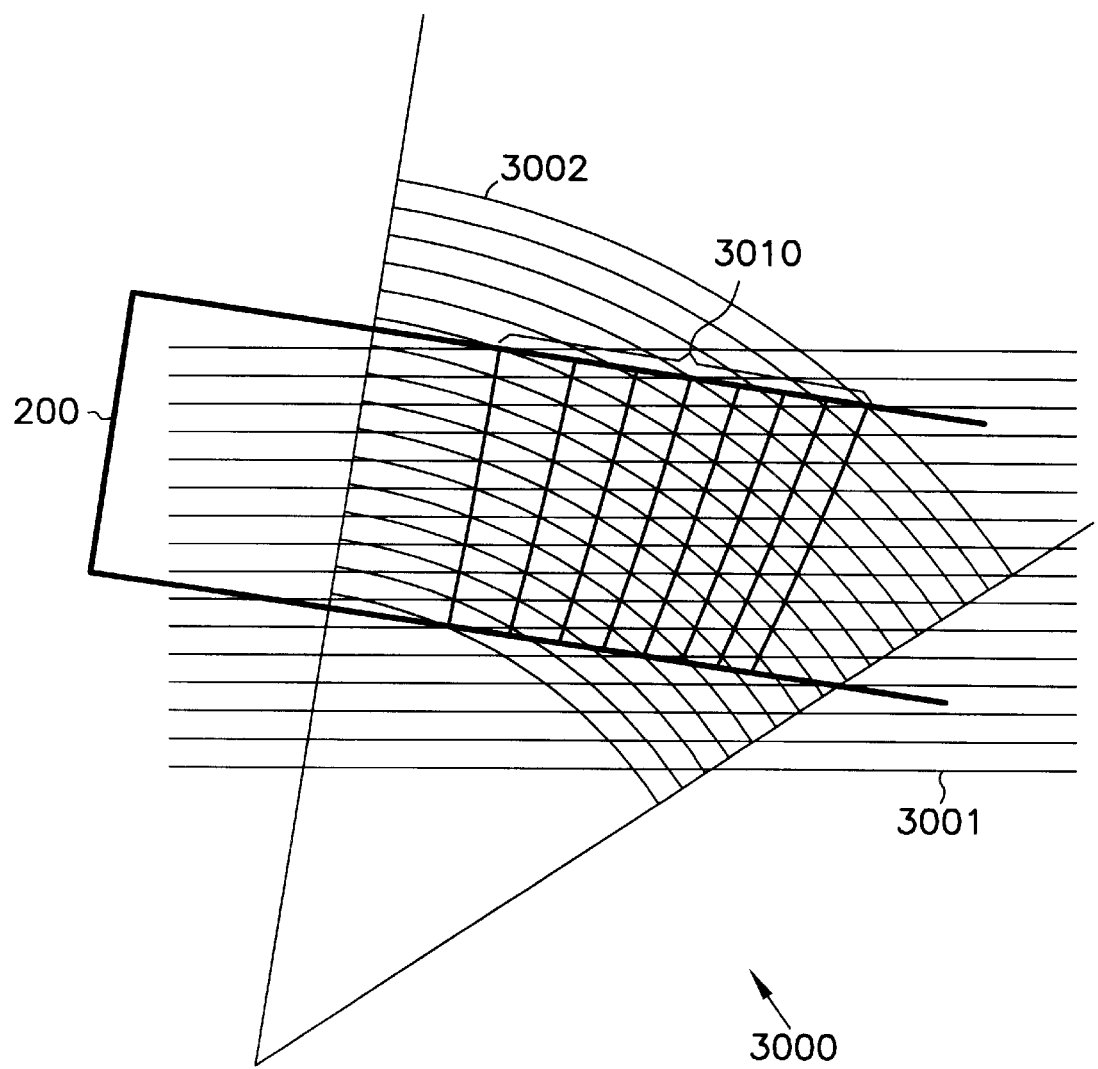
FIG. 12 is a top view schematic of an example of two interfering laser beams that create a diverging grating on optical chip 200.

FIG. 12 is a top view schematic of an example of two interfering laser beams that create a diverging grating on optical chip 200. In this embodiment, a collimated laser beam 3001 (having planar wavefronts) interferes with a cylindrical-collimated laser beam 3002 (having cylindrical wavefronts such as may be created by passing a collimated through a cylindrical lens or equivalent hologram), thus creating a constructive/destructive interference pattern 3010. This is used to expose photoresist to transfer a corresponding grating pattern to optical chip 200, which is then processed as described elsewhere in this description (see examples A, B, and C, above). In other embodiments, collimated laser beam 3001 is passed through a suitably defined hologram which then transforms collimated laser beam 3001 into the equivalent interference patterns as shown here. In yet another embodiment, a suitably defined hologram provides other grating patterns as defined herein.

Figure 13A:
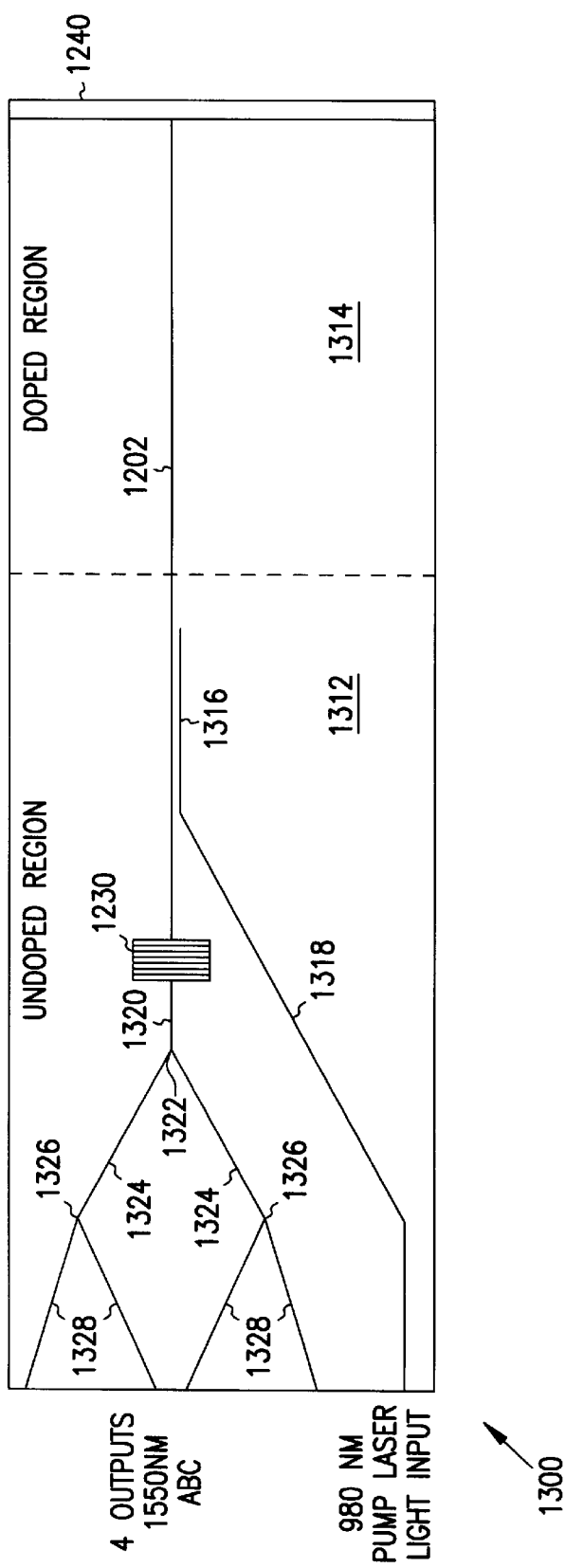
FIG. 13A is a top view schematic of an example of a laser configuration where the substrate has doped and undoped regions.

An example is shown in the schematic top view of FIG. 13A where a laser is formed by a waveguide 1201 fabricated on a substrate or optical chip 1200 that carries light through a doped region (DR) 1314 and an undoped region (UDR) 1312. A laser cavity (LC) 1202 is formed by a reflector 1240 at one end of the waveguide 1201 at the edge of the chip 1200 and by a grating 1230 at the other end within the undoped region 1312. The reflector 1240 and grating 1230 both reflect light at 980 and 1550 nm with the grating being only partially reflective at 1550 nm to allow output of the laser light. The laser is pumped by a 980 nm wave-division multiplexing (WDM) coupler 1316 that introduces the light within undoped region UDR 1312 of laser waveguide 1202 of the device such that the pump light is minimally absorbed except within the doped region of laser cavity 1202 itself. The light generated by the laser is then split in the undoped region 1312 via splitter junctions SP 1322 and 1324. This occurs with minimal loss owing to the location of the splitters in the undoped region. If the entire substrate were doped, the region containing the splitters would require pump light in order not to reabsorb the laser light. In other embodiments, the substrate 1200 has multiple regions of varying concentrations of the same dopant so that the amount of pump light absorbed by the regions differs. This facilitates distribution of the pump light and allows devices with different pumping requirements to be more easily integrated into the system. The identity of the dopant may also be varied so that devices with different lasing wavelengths can be constructed within the substrate 1200. In some embodiments, the Yb/Er ratios described above are used.

Figure 13B:
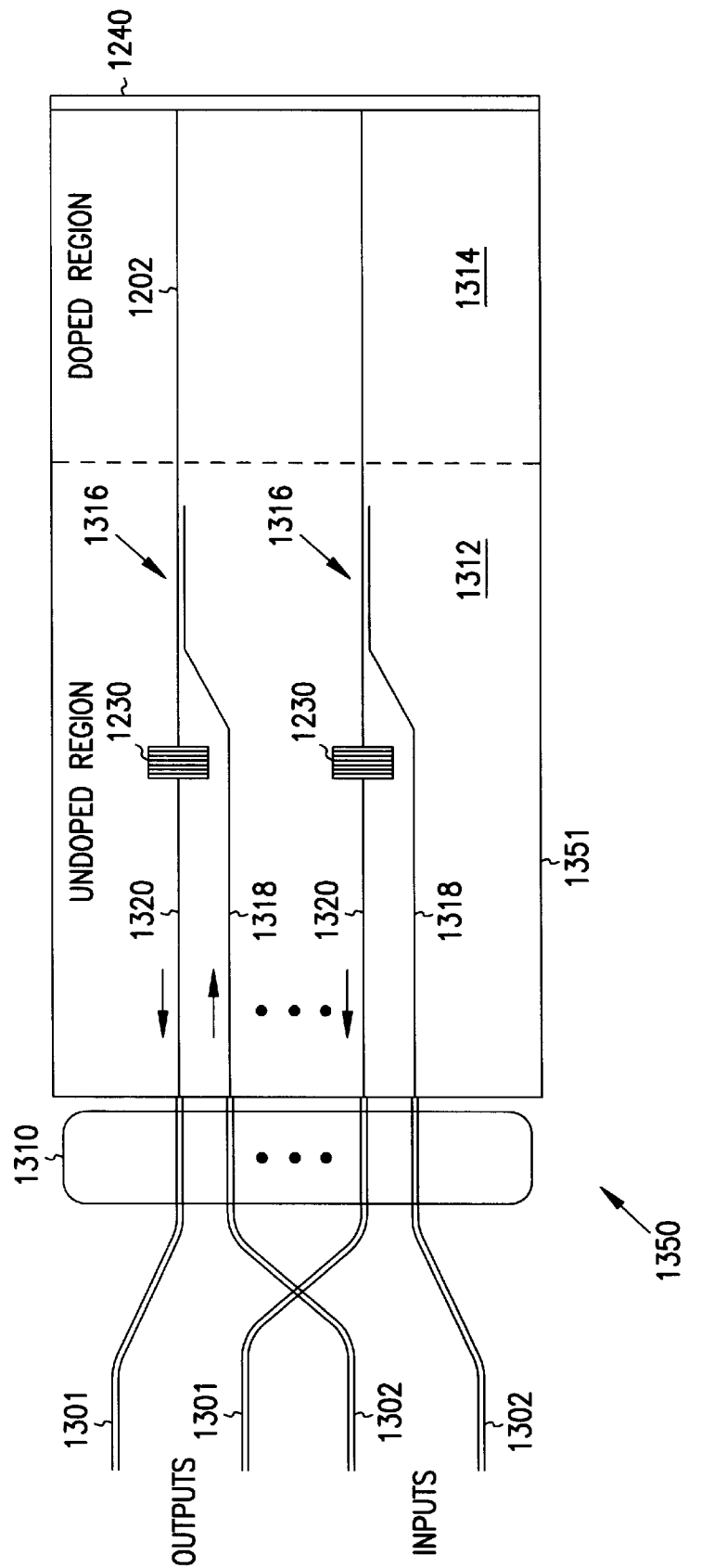
FIG. 13B is a top view schematic of a substrate 1351 having doped and undoped regions, wherein a single alignment ferrule 1310 is used to couple both the pump input fibers and the laser output fibers.

FIG. 13B is a top view schematic of a substrate 1351 having doped and undoped regions, wherein a single alignment ferrule 1310 is used to couple both the pump input fibers and the laser output fibers. In this embodiment, a plurality of lasers 1202, each coupled through its DBR grating 1230 to its own output waveguide 1320 are formed on substrate 1351. In this embodiment, the pump light for each laser is provided by pump waveguide 1318 and launched onto laser 1202 through WDM 1316 (e.g., the pump waveguide in this region is formed along a section of laser waveguide with a small gap designed (or optimized) such that evanescent coupling will pass light of the pump wavelength across that gap (and in one such embodiment, this gap is also designed to minimize coupling of e.g., 1536 nm light while maximizing coupling of the 980 nm pump light). While sharp-angled turns are shown in the pump waveguide, it is to be understood that curves are a preferred shape, wherein the radius of curvature is large enough to minimize light leakage from the waveguide at the turn.

FIGS. 14A through 14F depict the process steps for making a substrate with distinctly doped regions in an exemplary embodiment. In one such embodiment, a glass substrate S is formed from a plurality of glass blocks GB 1410 and 1420 shown in FIG. 14A having either no dopants, differing dopants or differing concentrations of the same dopants. The glass from which the blocks 1410 and 1420 are made are, in various embodiments, e.g., a phosphate or silicate glass and can be doped or undoped. In this example, the glass is phosphate-based with one of the blocks GB 1410 undoped and the other block 1420 doped with Er. The blocks GB 1410 and 1420 are fused together by heating the blocks to their softening points and pressing them together to form a single block of glass with distinct regions of dopant concentration as shown in FIGS. 14B and 14C. The fused block FB 1430 is then sliced into wafers WF 1432 as shown in FIGS. 14D and 14E. The wafer 1430 is then polished to provide a substrate with regions of differing dopant concentrations in which optical devices may be fabricated to form optical chip 1200 as shown in FIG. 14F.

Composite Substrate Fabrication

In some embodiments, the method of joining two glass blocks is to typically hold the respective parts together and heat the assemblage to above the glass transition temperature (Tg) as described above. The high temperature treatment allows a chemical/mechanical bond to provide a permanent join. The assemblage is then carefully annealed to minimize any residual stress that would affect either the structural integrity or the optical properties of the interface. This type of approach, requiring relatively high temperatures to allow the interfacial bonding reaction, may not be desirable for certain applications in which pre-existing structures (e.g., waveguides, gratings) may exist in one or both joined pieces.

An alternative approach used by some embodiments is to use a third material (generically called "glue") to join the two pieces. In some embodiments, this method is used to join two or more dissimilar wafers, e.g., after they have sliced from a block. In some embodiments, this method is used to join, edge-to-edge, an optical chip 200 to one or more other chips or substrates having dissimilar doping or other characteristic. This "glue" material may be either organic or inorganic; however, one advantage of certain inorganic materials is that the joint can have properties similar to the adjacent glass blocks. For example, by tailoring the composition and processing of the inorganic glue, the joint can be as temperature-resistant, share similar thermal and mechanical properties and, have similar optical properties as the two pieces being joined, in order to minimize optical attenuation.

Description of Sol-gel Technology

One method of manufacturing this type of inorganic glue is through sol-gel technology which is used by some embodiments of the invention. The technique, used for the fabrication of glasses and ceramics for several decades, involves combining organic precursors that contain the desired stoichiometry of chemical species within the final glass (or ceramic). This allows chemical mixing and homogeneity on an atomic level. The mixed organic precursors form small particles in solution called sols. The size and stability of these sols, controlled by the solution chemistry (e.g., sterically by organic chains on the surfaces of the particle, or electrostatically by a surface charge layer), are important to the process. For example, if the sol particles grow too large, they will precipitate irreversibly into hard porous agglomerates. Typically, the sol particles are coalesced in a controlled manner by carefully modifying the solution chemistry, referred to as a gelation process (the gel part of sol-gel technology).

The approach has been used to create ceramic powders, organic-ceramic composites or "ceramers", monolithic glass or ceramic bodies, and glass or ceramic thin films. Recent work in "bio-ceramics" for use as bone replacement or bio-active coatings for artificial joints has focused on apatite-based compositions (hydrated calcium phosphate), providing useful information on precursor chemistry for production of phosphate-based sol-gel derived glasses. For example, to create a composition similar to Schott Glass IOG-1, one embodiment uses a mixture of precursors containing sodium ($Na_2NO_3$), aluminum ($Al(NO_3)_3 9H_2O$), phosphorus (($NH_4)_2HPO_4$) and rare-earths such as erbium and ytterbium ($Er(NO_3)_3 5H_2O$, $Yb(NO_3)_3 5H_2O$). These compositions are only examples of salts that may be used. In other embodiments, other precursors are used.

An Example of Part Fabrication

For thin-film preparation in some sol-gel embodiments, the solution is typically spin coated at high speeds (>1000 rpm) onto a block or substrate surface to provide a thin, uniform coating. The coating is then dried and may be fired to densify. For some embodiments, either one surface or both surfaces of the glass blocks are coated. The films are then dried or annealed, then the two pieces are joined. The joining process of some embodiments requires the application of pressure and elevated temperatures to achieve adequate bonding, and the resulting part in some embodiments is then annealed for optimal mechanical optical properties.

In various embodiments described herein, Er and Yb are used as optically active species. In other embodiments, other optically active lanthanides are used. In yet other embodiments, optically active non-lanthanides are used. This technology has tremendous potential for DWDM communication sources and amplifiers from 1310–1700 nm wavelengths. Er/Yb doping covers approximately 1525–1595 nm.

FIGS. 15A through 15D show examples of fused blocks FB with four different doping arrangements, and four different functions obtained.

Figure 15A:
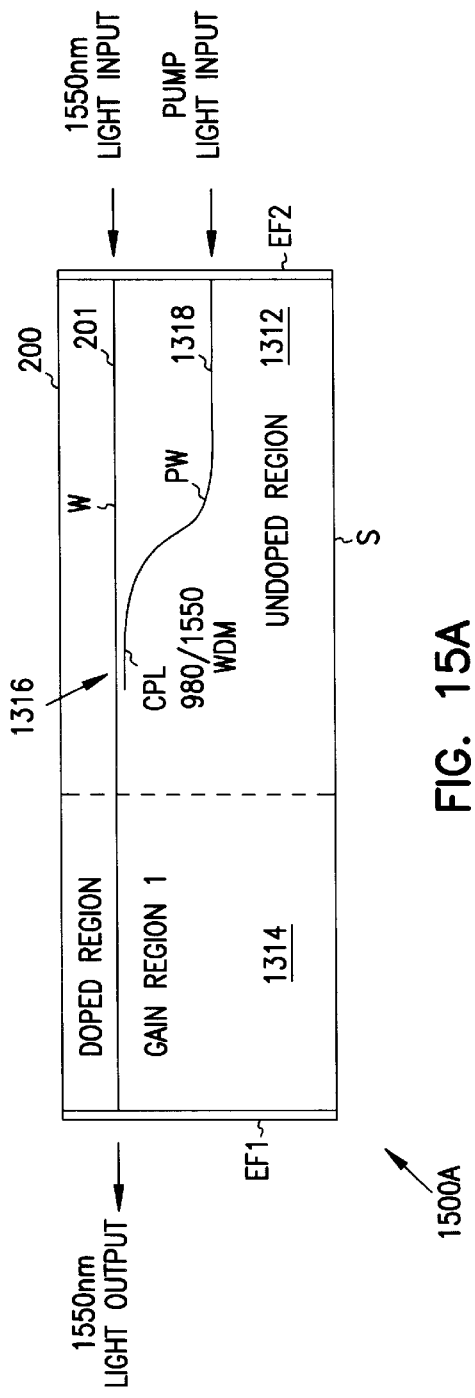
FIGS. 15A through 15D show examples of fused blocks with four different doping arrangements.

FIG. 15A shows an amplifier optical chip 1500A with one undoped region UDR 1312 and the other region DR 1314 co-doped with Yb/Er. This allows a laser input signal to be passed through waveguide 201 (e.g., by an input fiber coupled to one endface antireflective layer 1358 (i.e., EF2), and an output fiber coupled to the other endface antireflective layer 1350 (e.g. EF1)), pump light is injected from input waveguide 1318 through WDM coupler 1316. In one such embodiment, endface antireflective layer 1358 is split into two regions, one that is antireflective at 980 nm over the end of waveguide 1318, and another that is antireflective at 1536 nm over the end of waveguide 201.

Figure 15B:
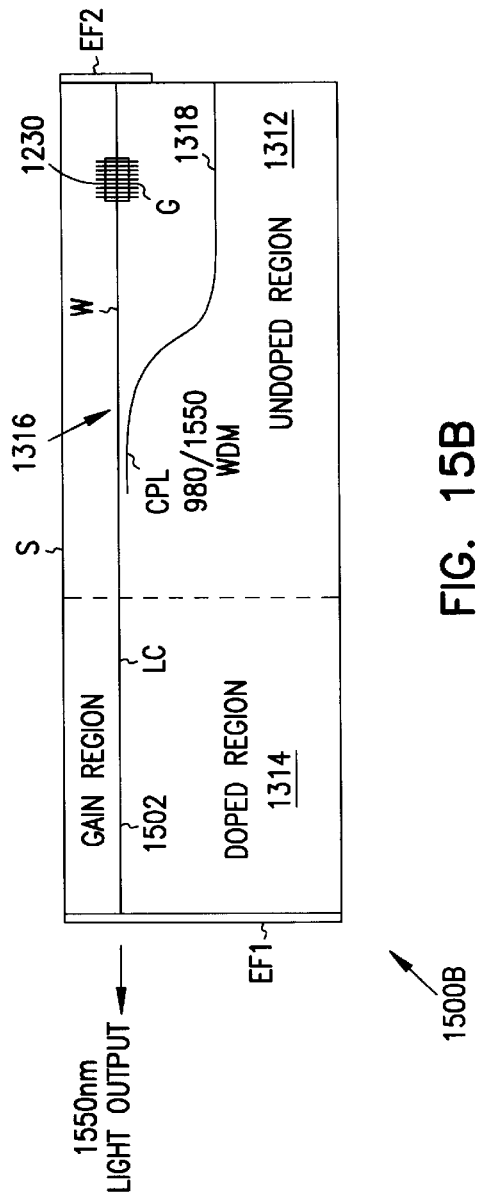

FIG. 15B shows a laser optical chip 1500B with one undoped region UDR 1312 and the other region DR 1314 co-doped with Yb/Er. This allows a pump light to be efficiently transferred into laser cavity 1502, since there is no optically active species to absorb it until it is in the laser cavity 1502. DBR 1230 reflects at a tuned wavelength at one end of laser cavity 1502, and partially reflective layer 1351 (i.e., EF1), where an output fiber can be coupled, pump light is injected from input waveguide 1318 through WDM coupler 1316. In one such embodiment, endface EF2 is split into two regions, one that is covered by layer 1354 that is antireflective at 980 nm over the end of waveguide 1318, and another covered by layer 1353 that is highly reflective at 980 nm over the end of waveguide 201.

Figure 15C:
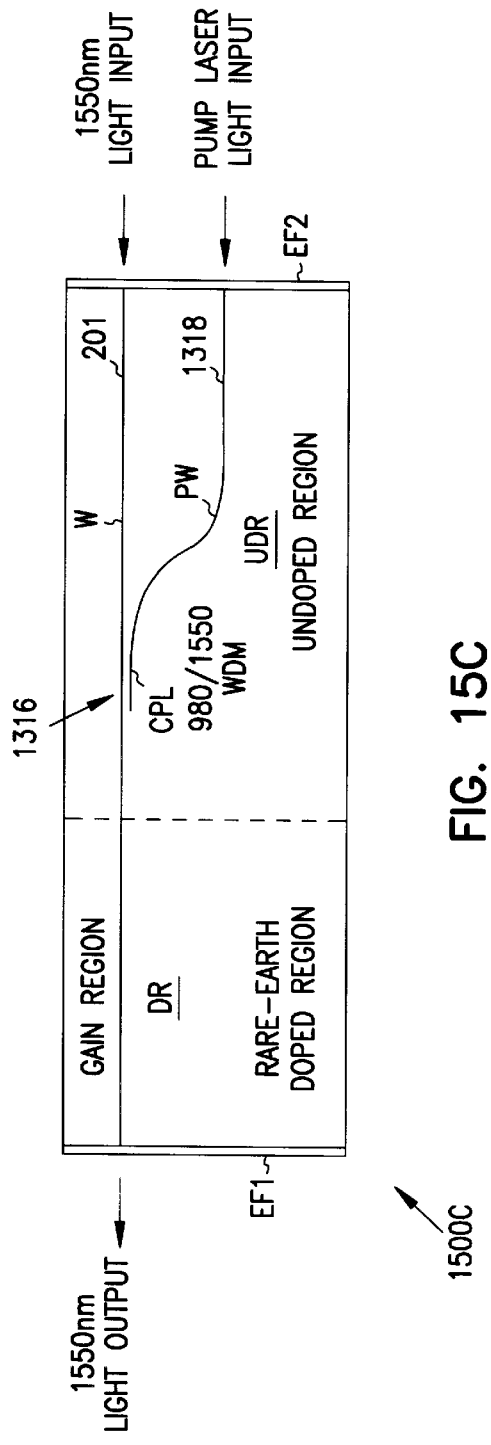

FIG. 15C shows a laser optical chip 1500C with one undoped region UDR 1312 and the other region DR 1314 co-doped with Yb/Er in one embodiment. Chip 1500C is similar to chip 1500B except that highly reflective layer 1355 replaces DBR 1230 and layer 1353. Layer 1355 is highly reflective at 1536 nm.

Figure 15D:
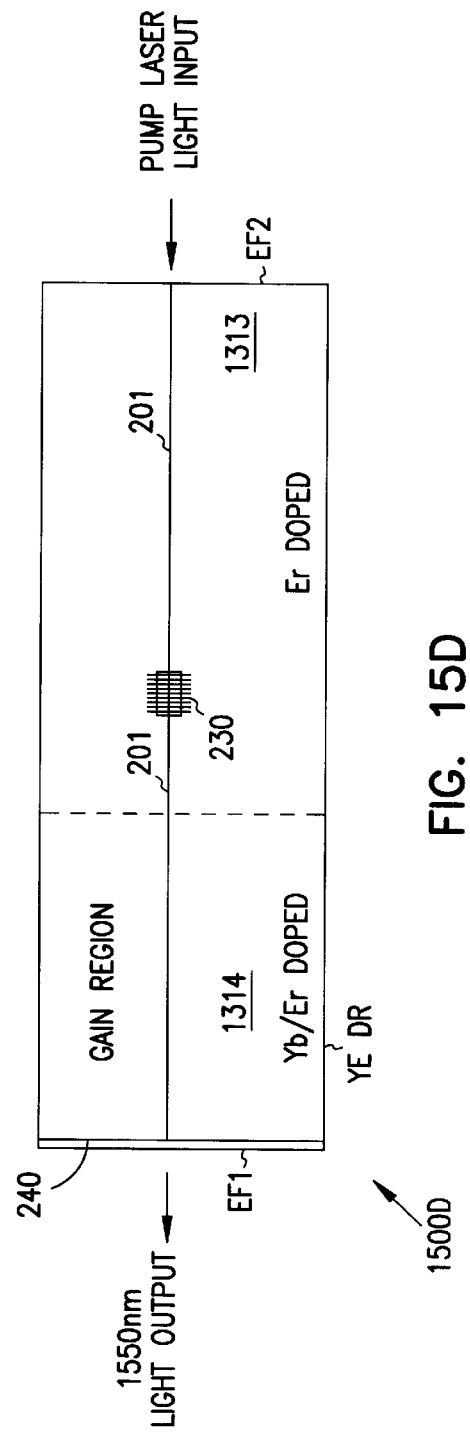

FIG. 15D shows a laser optical chip 1500D with one Er region 1313 and the other region DR 1314 co-doped with Yb/Er. Chip 1500D receives injected pump light through antireflective layer 1354 into waveguide 201, and through DBR 230 into laser cavity 202. Input waveguide 201 and DBR 230 are placed in the Er region 1313. Output laser light at approximately 1550 nm passes through partially reflective layer 1351 (also called mirror 240).

The structures of FIGS. 15C and 15D are blocks with two doped regions DR1 and DR2 adjacent one another, with one of the doped regions doped with Er and the other with Yb/Er. Such variation in doping allows for the variation in absorption of pump light across the substrate in a manner that facilitates the distribution of pump light as well as the integration of devices with differing pump requirements. The structure can also be used to create regions that emit different wavelengths of light depending upon the dopants used in each region. For example, an Er-doped region would emit light in the 1550 nm region while a Pr-doped region would emit at a wavelength of 1300 nm. FIG. 15D shows a optical chip 1500D having a Yb/Er doped region 1314 joined to Er doped region 1313 and waveguide 201 passing through both. DBR grating 230 located in region 1313, provides a tuned-feedback reflector for laser cavity 202, which has a suitable reflector 240 at its far end.

It should be noted that in the process just described, all of the active and passive devices can be produced in a common fabrication process. Because the composition is defined in the glass melts that are fused together and subsequently sliced into individual wafers, uniformity among the individual devices is very good. However, in fusing the glasses, attention should be paid to the thermal expansion coefficients, softening points, and transformation points of the individual glasses to be fused. If these parameters are not well matched among the glasses, the result may be residual strain that can cause cracking, unpredictable diffusion characteristics, or optical polarization effects. The glasses should also be matched in terms of their indices of refraction and diffusion characteristics so that waveguides in the different regions of the fused glass can be connected without discontinuities.

FIG. 15A shows a laser-resonator configuration in which the laser cavity LC is defined within a waveguide W by the reflectors R1 and R2 (the reflector R2 being reflective at 1550 nm, and the reflector R1 being partially reflective at 1550 nm to allow output of 1550 nm laser light) at the two end-facets EF1 and EF2 of the substrate S, with the substrate having an undoped region UDR and doped region DR.

FIG. 15B shows a similar configuration in a multi-compositional substrate in which the laser cavity LC is between a reflector R1 and a grating G. The laser in both configurations is pumped by a 980 nm wave-division multiplexing (WDM) coupler that introduces the light through a pump waveguide PW within an undoped region UDR of the device such that the pump light is minimally absorbed except within the laser cavity itself. In both cases, the advantage of the undoped region being used to introduce the pump light is that no pump light is absorbed outside the laser region.

FIGS. 15C and 15D show laser amplifiers constructed of multi-compositional substrates. FIG. 15C has a similar configuration to that of the device in FIG. 15A except that the end facets EF1 and EF2 have anti-reflection coatings so as to be transparent to 1550 nm light. As 980 nm pump light is introduced through pump waveguide PW, signal light entering through end-facet EF2 is amplified before being output through end-facet EF1.

FIG. 15D shows a combined laser-resonator/amplifier in which a grating G is formed in an Er-doped region EDR thus creating a laser-resonator cavity. The grating is partially reflective at 980 nm so as to convey pump light to the Yb/Er doped region YEDR.

Figure 18:
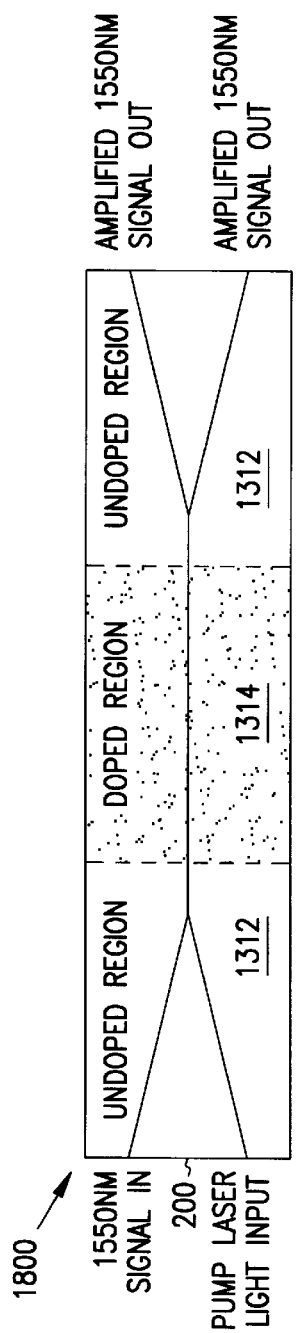
FIGS. 18, 19, and 20 show exemplary devices that can be made with multi-compositional substrate.
Figure 19:
Figure 20:
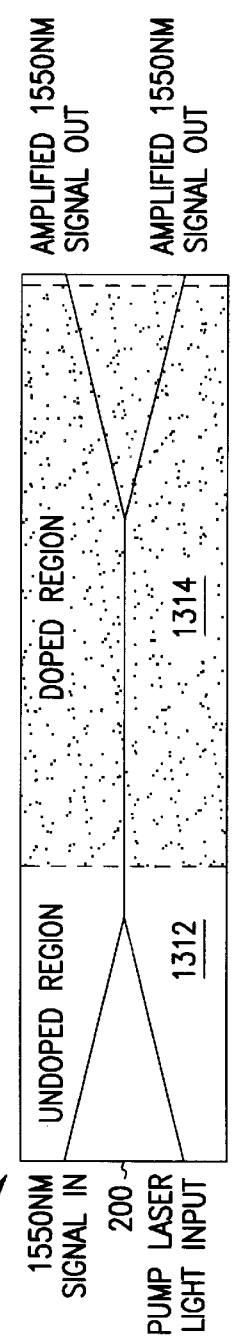

FIGS. 18 through 20 show three exemplary types of amplifiers constructed from substrates S having doped regions DR and undoped regions UDR. FIG. 18 shows an optical amplifier constructed with a splitter SP in the pump waveguide PW located in the undoped region UDR of the substrate for splitting the pump light. Such splitting allows for more efficient distribution of the pump light to the waveguides W in the doped region DR.

Another embodiment of the invention is a tunable waveguide laser made up of a waveguide in a glass substrate forming a laser resonator cavity and a distributed Bragg reflection grating positioned along the waveguide for providing feedback. The glass substrate is doped with one or more optically active lanthanides species, such as Er or a combination of Er and Yb, which can be pumped, optically or otherwise to form a laser medium which is capable of lasing at a plurality of frequencies. For a given cavity length and effective refractive index, the wavelength of light generated by the laser can be varied by varying the wavelength of light reflected by the grating (i.e., a wavelength satisfying the Bragg condition). The grating can be fabricated by etching or machining the grating pattern into the substrate, or by deposition of material onto the surface of the substrate. In order to allow the laser to be tuned, a variable refractive index material is used to either form the gratings or coat the gratings so that changing the material's refractive index varies the wavelength of light reflected by the grating. The variable index material may be electro-optic, thermal-optic, or piezoelectric and can be added to the substrate by, e.g., vapor deposition, thermal evaporation, or spin coating.

An exemplary embodiment is shown in FIGS. 16A and 16B which depict side and top views, respectively, of a tunable laser made up of a rare-earth-doped substrate S having a waveguide W defined therein with a reflector R1 at one end (e.g., a mirror or dielectric coating) and a grating G positioned along the length of the grating for providing optical feedback and defining a laser-resonator cavity. A pump laser PL provides pump light through one end of the waveguide which is transmitted through the grating to the laser-resonator cavity. A cladding C made up of an active coating material with a variable index of refraction is deposited on the reflection grating of the substrate waveguide to form a cladding thereon. In other embodiments. The cladding in one embodiment is composed of an electro-optic polymer with a variable index of refraction. By applying an electrical potential to electrical contacts EC that is impressed across the cladding by means of electrical conductors CND, the index of refraction of the cladding is varied in accordance with the applied potential. As the index of refraction is varied, the Bragg wavelength reflected by the grating is changed so that the waveguide cavity resonates at a different wavelength.

In another embodiment, the cladding C of the laser in FIGS. 16A and 15B is composed of a piezoelectric coating material. An electrical potential applied to the cladding causes deformation of the coating material which strains the grating and thereby alters the spacing of the grating elements and the wavelength reflected by the grating. Alternatively, the electrical conductors CND are resistive elements in thermal contact with either the cladding or the grating itself such that application of an electrical potential to the electrical contacts EC causes thermal heating of the grating. As the grating is heated, thermal expansion causes the grating spacing to increase to thereby alter the wavelength reflected.

In yet another embodiment, the cladding C of the laser in FIGS. 16A and 15B is composed of a ferroelectric liquid crystal material.

Another exemplary embodiment is shown in FIGS. 17A and 17B which depict side and top views, respectively, of a tunable laser similar to the one of FIGS. 16A and 16B except that here, a plurality of gratings G with claddings C are spaced along the waveguide. The gratings define a plurality of laser-resonator cavity lengths with each grating having a different pitch to reflect a wavelength corresponding to a longitudinal mode fitting the boundary conditions as determined by the length of the cavity. By adjusting the refractive index of a particular grading cladding to be the same as the grating, the grating no longer reflects and is rendered transparent to light propagating within the cavity. By selectively adjusting the refractive indices of the grating claddings, all but one of the gratings can be made transparent. The laser may thus be tuned by applying an electrical potential to the grating claddings to selectively render one grating G reflective at a wavelength that corresponds to a longitudinal mode of the substrate waveguide cavity and the others transparent.

In another embodiment, as shown in FIGS. 22A and 22B, a laser similar to the embodiments described above is provided with a waveguide W defined in a substrate S, a laser-resonator cavity defined within the waveguide by a reflector R1 and grating G, and a pump laser PL for exciting the laser species of the waveguide. The laser in this embodiment is tuned by altering the effective length of the laser-resonator cavity. A cladding C composed of an electro-optic polymer with a variable index of refraction is deposited on the waveguide W with electrodes in contact therewith. By applying an electrical potential to the cladding, the refractive index of the cladding is varied. The effective refractive index of the waveguide is also varied since the cladding's refractive index affects the distance traveled by evanescent waves in the cladding as a wave propagates through the waveguide. Varying the effective refractive index of the waveguide is equivalent to varying its length, thus allowing the laser to be tuned by altering the longitudinal modes supported by the waveguide.

Figure 23:
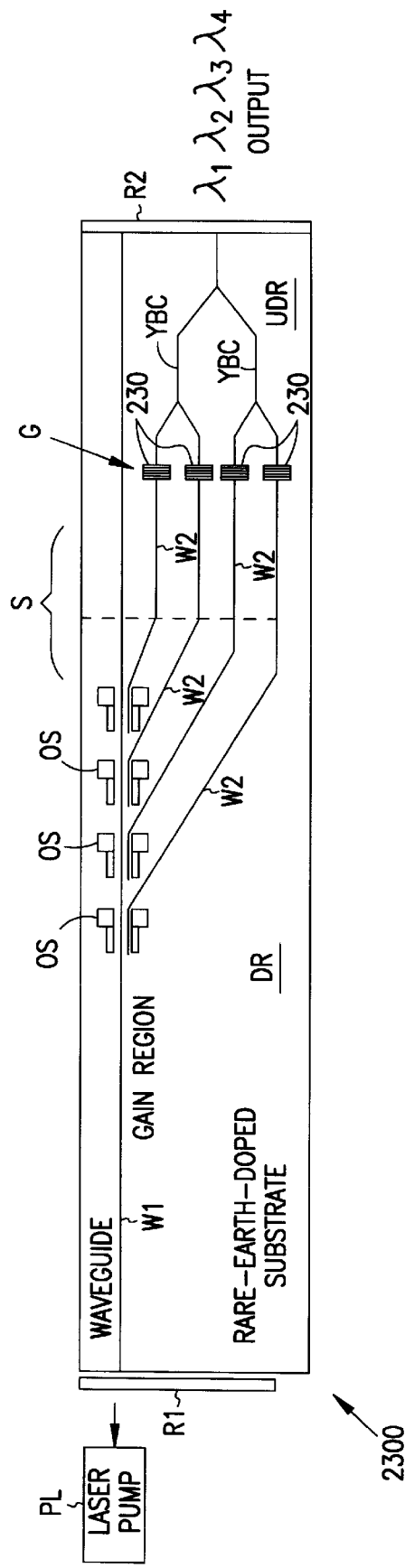
FIG. 23 shows a tunable laser with optical switches for switching between a plurality of waveguides defined on the substrate.

FIG. 23 shows another tunable laser in accordance with another aspect of the invention. A multi-compositional substrate S with an undoped region UDR and a doped region DR has a primary waveguide W1 defined therein that runs through both the doped and undoped regions of the substrate. In the undoped region UDR, there are a plurality of secondary waveguides W2, each of which contains a grating G of a different pitch. Each of the waveguides at one end is in contact or close proximity with the primary waveguide W1 such that light can be selectively coupled from the primary to the secondary waveguide by means of an optical switch OS. Each switch is electro-optic and controlled by application of a voltage to the switch, or thermo-optic and controlled by a resistive heating element to which a voltage is applied. The other end of the secondary waveguides W2 are combined to form a single output by a series of Y-branch couplers YBC (or, alternatively, directional couplers). When one of the optical switches OS is activated, the light propagating in the primary waveguide W1 is transferred to the secondary waveguide W2 corresponding to that switch. The wavelength of the output light thus varies in accordance with which secondary waveguide W2 is selected due to the differing pitches of the gratings G in each waveguide. In an alternative embodiment, the secondary waveguides may be left uncombined such that light of different wavelengths is emitted from separate output locations of the substrate.

Figure 24:
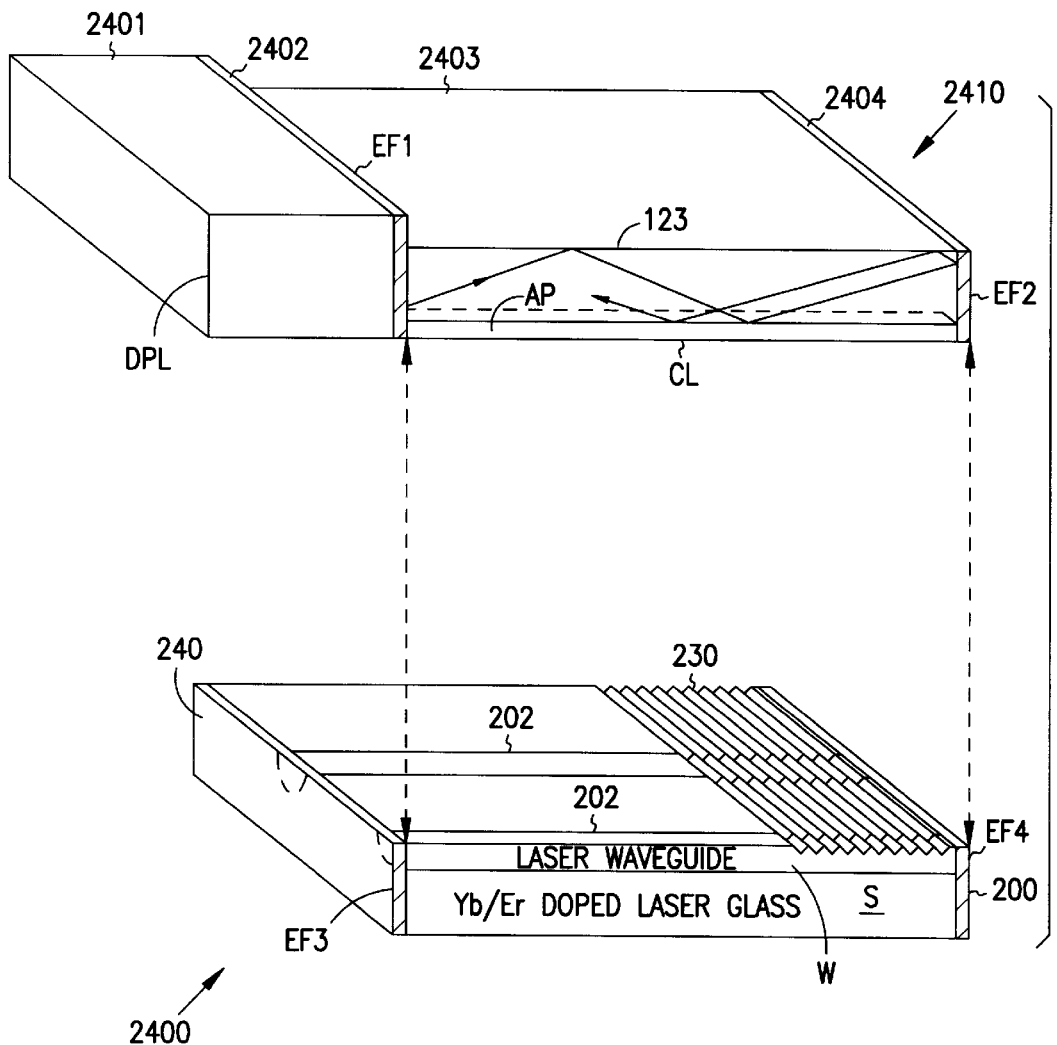
FIG. 24 shows in an exploded view the components of diode pumped laser in accordance with the invention.

Another embodiment of the present invention is a waveguide laser that includes a waveguide defined within a glass substrate and a diode pump laser with an extended waveguide cavity for supplying pump light to the waveguide laser. FIG. 24 shows in an exploded view of the components of such a laser which includes a doped substrate S with a substrate waveguide W defined therein, and a diode pump laser DPL with its output facet abutted to an extended waveguide laser-resonater cavity EWC. The substrate waveguide W is again defined within the substrate as a region of increased index of refraction relative to the rest of the substrate. In one embodiment, the glass substrate is doped with one or more optically active lanthanides species that can be optically pumped, such as Er or a combination of Er and Yb, to form a laser medium. In the case of Yb/Er co-doped glass, pump light at 980 nm supplied to the laser medium results in laser output centered near 1536 nm. The aspect of the invention to be described here, however, can be used with other combinations of dopants require different pump light wavelengths and outputting laser light centered at another wavelength.

Figure 25:
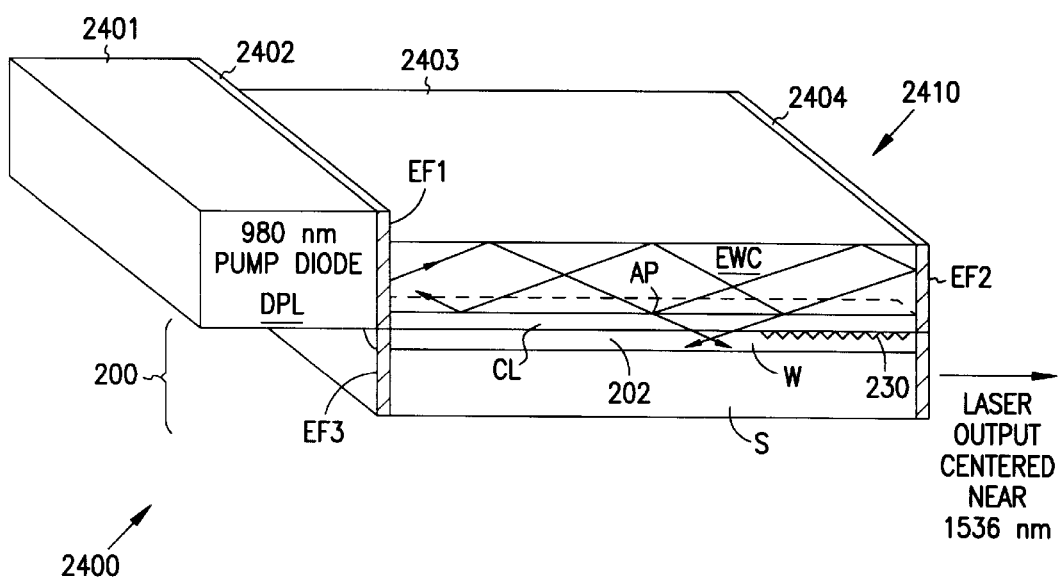
FIG. 25 shows the constructed view of a diode pumped laser in accordance with the invention.

In accordance with the invention, the output facet of the diode pump laser DPL in FIG. 24 has an anti-reflection coating applied thereto and the extended cavity EWC abutted to the output facet so that the laser-resonator cavity of the diode pump laser includes the cavity EWC. The diode pump laser in this example produces 980 nm light, and the cavity EWC is terminated with a reflective element R1 that reflects at a wavelength centered near 980 nm. As shown in FIG. 25, in the operational device, the extended cavity EWC is positioned adjacent the waveguide W to form a superstrate thereon. The cavity EWC includes a cladding layer CL interposed between the cavity and the waveguide W that prevents pump light from uniformly leaking out of the cavity EWC and into the waveguide W. Instead, apertures AP are located in the layer CL that selectively leak pump light from the cavity EWC to the waveguide W. The apertures are placed so as not to interfere with the grating G of the substrate wave guide. As pump light resonates within the extended diode laser cavity EWC, a portion of the light is transmitted to the substrate waveguide W along a portion of its length to cause lasing action therein. The diode pump laser cavity EWC in some embodiments has a lower index of refraction than the substrate waveguide and constitutes part of the cladding thereof. Pump light is thus transmitted to the substrate waveguide W, but laser light from the laser species within the substrate waveguide is contained by the total internal reflection of the propagating mode due to the relatively higher refractive index of the substrate waveguide with respect to the substrate and diode pump laser cavity EWC. In this embodiment, the substrate waveguide and diode laser cavity are separated by a layer of interposed cladding having apertures AP defined therein for transmitting the pump light into the substrate waveguide at selected locations. In another embodiment, the substrate waveguide and diode laser cavity are separated by a gap with transmission of pump light into the substrate waveguide occurring via evanescent coupling. In still other embodiments, the cladding layer CL may be fabricated as a resonant ARROW structure to produce the same effect.

In one embodiment, reflective element R2 (which may be mirrors or distributed Bragg reflection gratings) and grating G are located along the substrate waveguide for providing feedback in order to form a laser-resonator cavity within the waveguide W, with the grating G made partially reflective for providing laser output. Other embodiments may omit the feedback elements R2 and G to form a laser amplifier. Other possible modifications of this aspect of the invention include the use of a bulk optic component to couple light from the diode pump laser gain section to the extended cavity EWC, and the incorporation of grating stabilization of the diode pump laser via a distributed-feedback grating formed in the extended cavity EWC.

In one embodiment, reflective element R2 (which may be mirrors or distributed Bragg reflection gratings) and grating G are located along the substrate waveguide for providing feedback in order to form a laser-resonator cavity within the waveguide W, with the grating G made partially reflective for providing laser output. Other embodiments may omit the feedback elements R2 and G to form a laser amplifier. Other possible modifications of this aspect of the invention include the use of a bulk optic component to couple light from the diode pump laser gain section to the extended cavity EWC, and the incorporation of grating stabilization of the diode pump laser via a distributed-feedback grating formed in the extended cavity EWC.

The embodiment of the invention described with reference to FIGS. 24 and 25 thus presents an improvement over prior methods of cladding pumping of waveguide lasers and amplifiers. By using the diode pump laser cavity as a secondary cladding for the substrate waveguide W, as opposed to simply coupling the output of the diode pump laser to the secondary cladding, cladding pumping of very short (i.e., 1 cm or less) substrate waveguide lasers is thereby made possible. The configuration also permits mass production of a number of separate devices fabricated from a single superstrate formed on a single substrate having an array of waveguides defined therein.

Figure 21A:
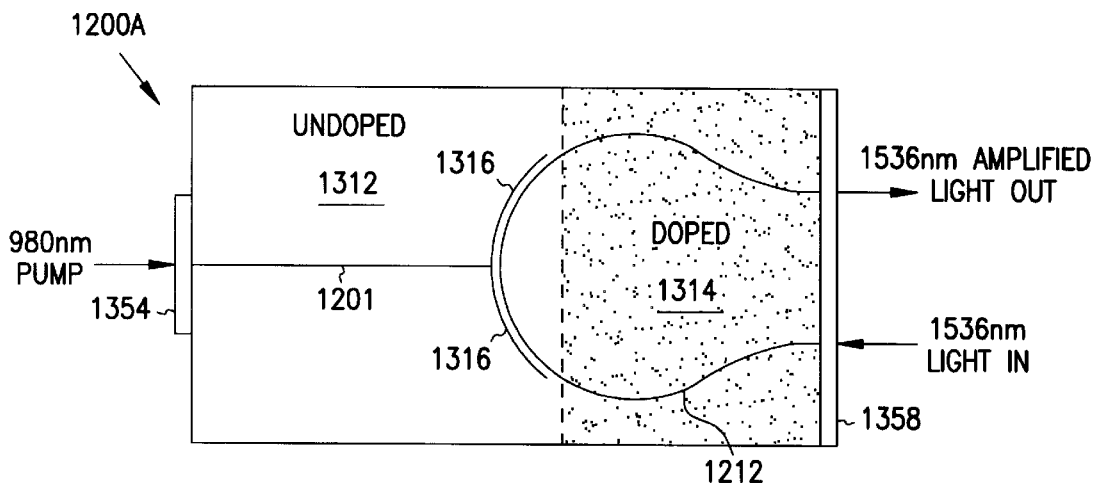
FIG. 21A is a top view schematic of an amplifier 1200A where the substrate has doped and undoped regions.

FIG. 21A is a top view schematic of an amplifier 1200A where the substrate has doped and undoped regions. In this embodiment, 980 nm pump light enters input waveguide 1201 located in undoped region 1312. Amplifier waveguide 1212 is configured in a curved route starting and ending at antireflective layer 1358 on an endface, and passing through doped region 1314, undoped region 1312, and again through doped region 1314. In some embodiments, antireflective layer 1358 is highly transparent at 1536 nm and has high reflectivity at 980 nm to avoid losing pump light. Input light, typically from a laser operating at one or more of a plurality of DWDM wavelengths approximately 1536 nm enters waveguide 1212 at one end, and an amplified version of that signal is output at the other end. Evanescent coupler 1316 (also called a wave-division multiplexor or coupler) couples 980 nm pump light from input waveguide 1201 into waveguide 1212. In some embodiments, evanescent coupler 1316 is also designed not to couple 1536 nm light in the other direction.

Figure 21B:
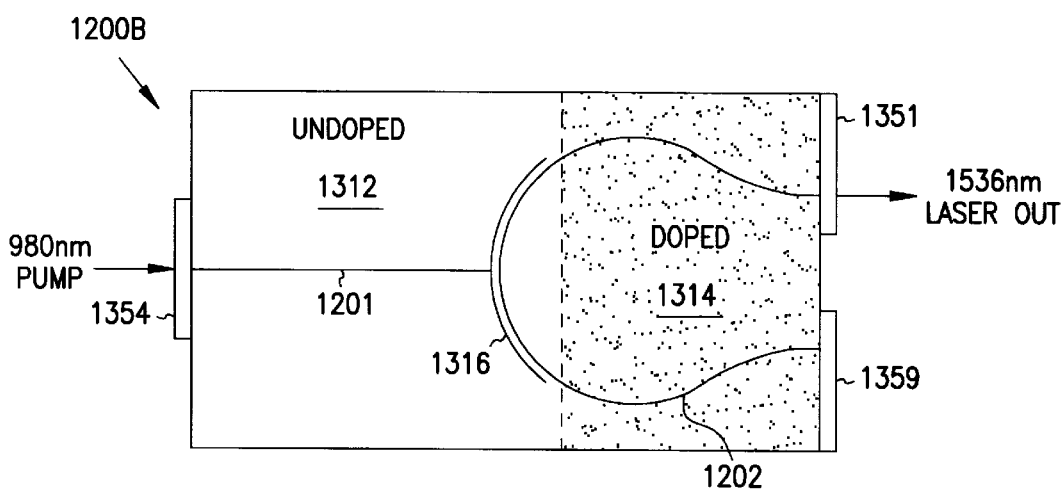
FIG. 21B is a top view schematic of a laser 1200B where the substrate has doped and undoped regions.

FIG. 21B is a top view schematic of a laser 1200B where the substrate has doped and undoped regions. In this embodiment, which is otherwise similar to amplifier 1200A, a highly reflective layer 1359 is placed on an endface at one end of the laser cavity 1202 (which is physically the same as Amplifier waveguide 1212, but provides a different function), and partially reflective layer 1359, though which 1536 nm laser light exits.

Figure 21C:
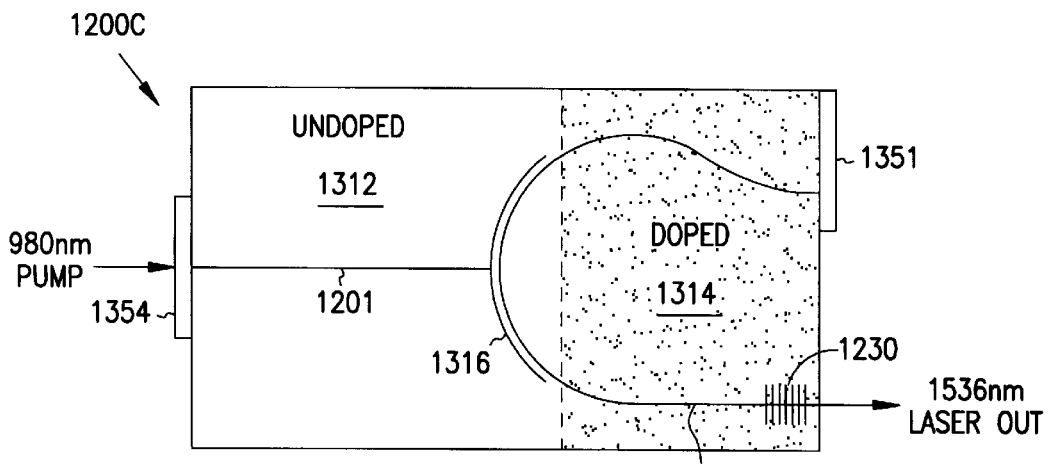
FIG. 21C is a top view schematic of a laser 1200C where the substrate has doped and undoped regions.

FIG. 21C is a top view schematic of a laser 1200C where the substrate has doped and undoped regions. In this embodiment, which is otherwise similar to amplifier 1200A, a DBR 1230 (to tune the wavelength) is placed on an endface at one end of the laser cavity 1202 (which is physically the same as Amplifier waveguide 1212, but provides a different function), and partially reflective layer 1359, though which 1536 nm laser light exits.

Figure 26A:
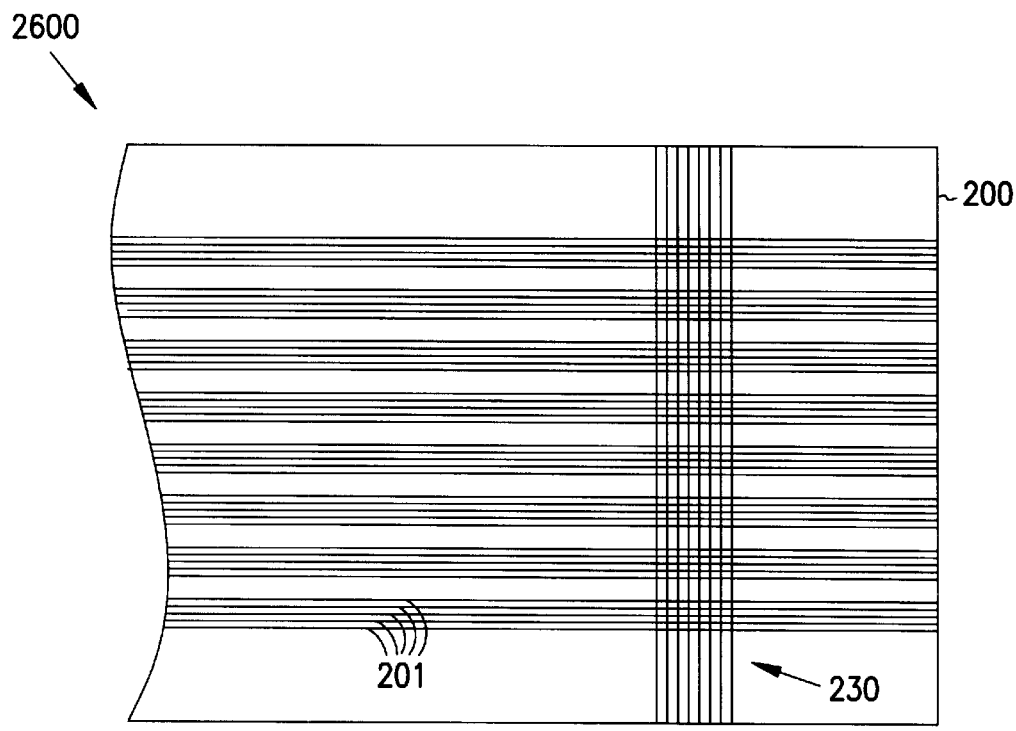
FIGS. 26A and 26B depict top and side views, respectively, of a grating formed into the waveguides 201.
Figure 26B:
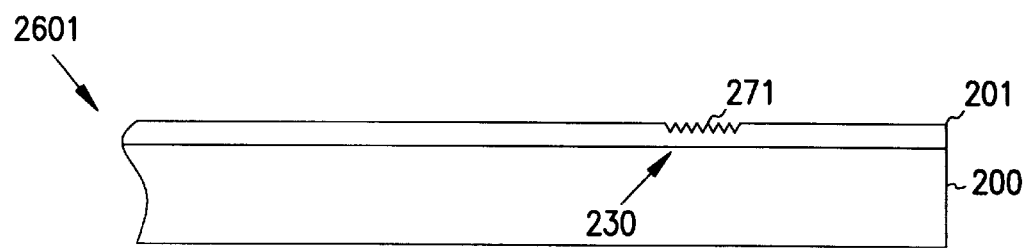
Figure 26C:
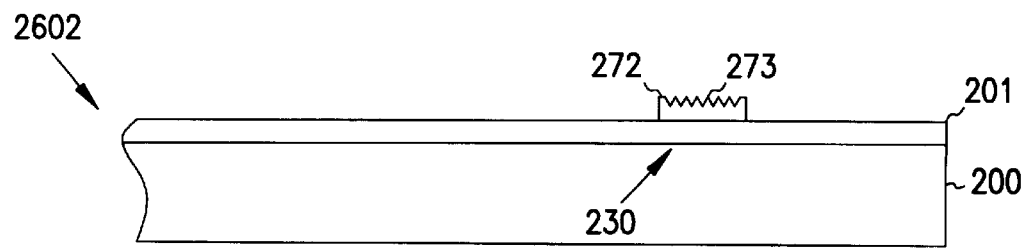
FIG. 26C depicts a side view of a grating 230 formed into a passive overlayer 272 covering the waveguides 201.

FIGS. 26A and 26B depict top and side views, respectively, of a grating formed into the waveguides 201. In one such embodiment, a 1 to 2 nm layer of $SiO_2$ is formed on a phosphate glass substrate to get better photoresist adhesion as described above, coated with photoresist, exposed and developed with a pattern for grating 230, the tops of the pattern coated with chromium, and argon-ion etched. FIG. 26C depicts a side view of a grating 230 formed into a passive overlayer 272 covering the waveguides 201. In some embodiments, overlayer 272 is $SiO_2$ deposited to a thickness of approximately 1000 to 2000 nm, and a grating 273 as described above is formed into just into overlayer 272 without going into the substrate.

Figure 27A:
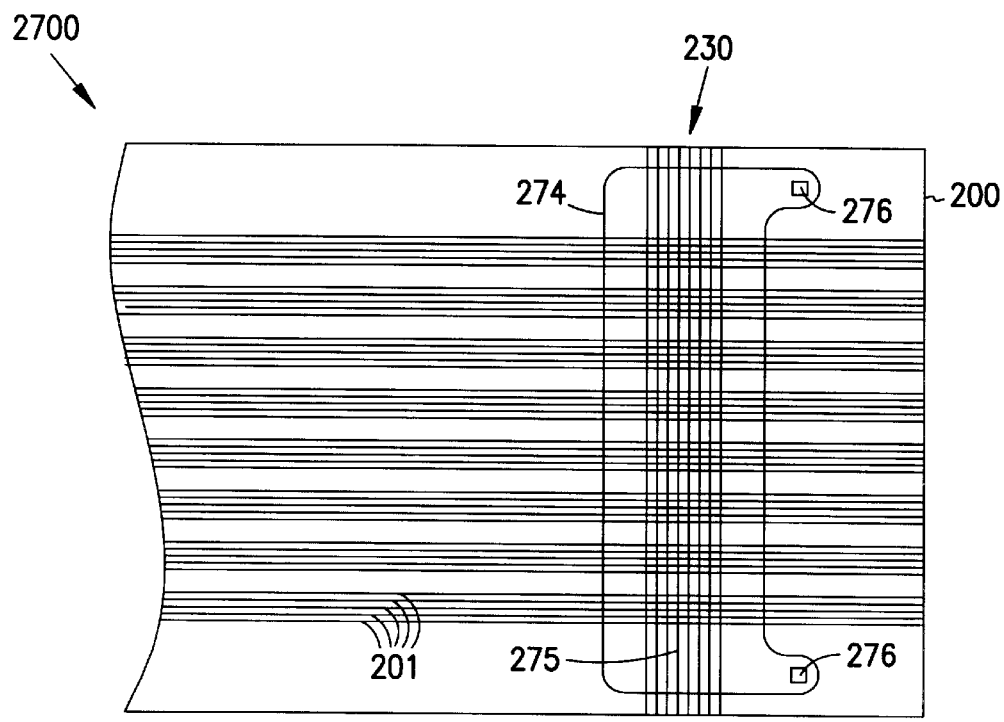
FIGS. 27A and 27B depict top and side views, respectively, of a grating formed into an electro-optic overlayer 274 covering the waveguides 201.
Figure 27B:
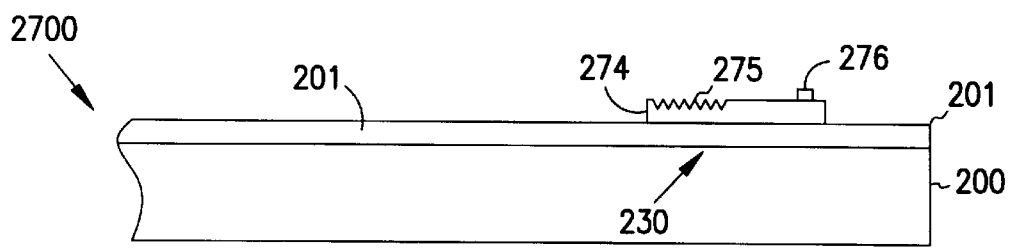

FIGS. 27A and 27B depict top and side views, respectively, of a grating formed into an electro-optic overlayer 274 covering the waveguides 201. Grating 275 is formed into overlayer 274, and electrical contacts 276 are provided. In one such embodiment, electro-optic overlayer 274 is a material known in the art that changes index of refraction upon application of an electric field, thus changing the effective grating spacing of grating 275 based on the applied field. This allows tuning of the wavelength of the laser light of the one or more operating laser cavities 202. In some embodiments, the changing index of refraction changes the effective distance between the grating and the underlying waveguide and/or the ratio of indices of refraction between the waveguide and the overlayer at that interface, thus changing the amount of coupling, and even allowing the coupling to be "invisible" to the light in the waveguide.

Figure 28A:
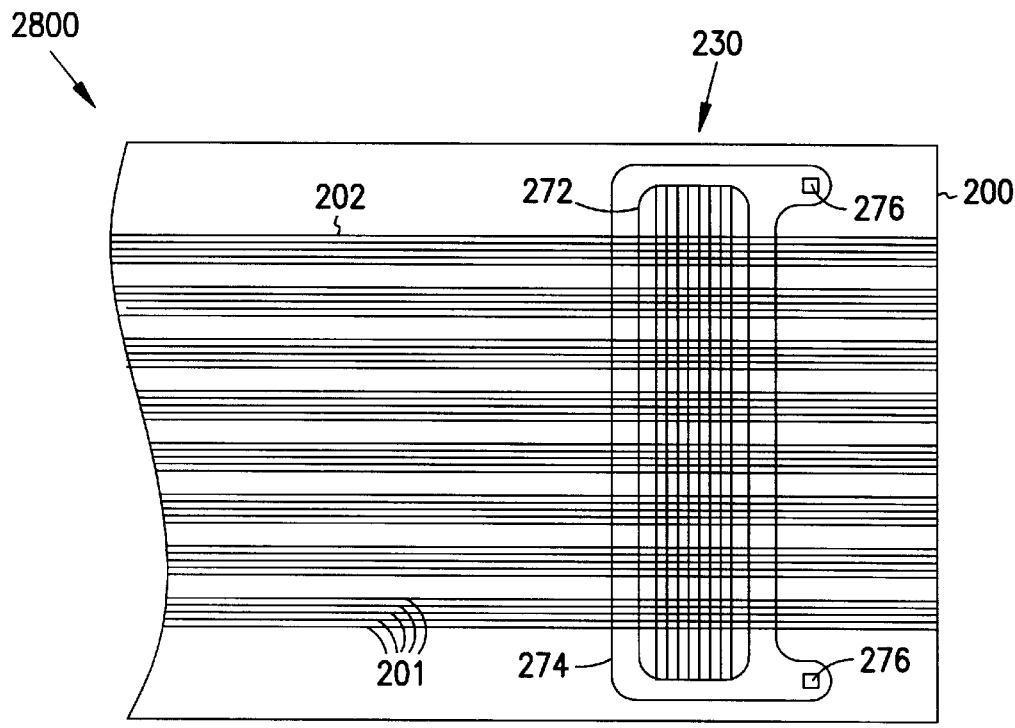
FIGS. 28A and 28B depict top and side views, respectively, of a grating formed into a passive overlayer 272 covering an electro-optic overlayer 274 covering the waveguides 201.
Figure 28B:
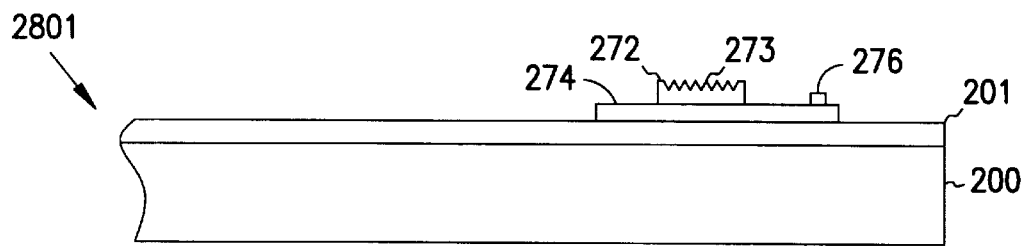

FIGS. 28A and 28B depict top and side views, respectively, of a grating formed into a passive overlayer 272 covering an electro-optic overlayer 274 covering the waveguides 201. In some such embodiments, electro-optic overlayer 274 changes index of refraction based on the applied electrical field. Thus, the effective evanescent coupling between the lasing light and grating 273. The thickness of overlayer 272 and the effective thickness of electro-optic overlayer 274 as determined by the applied field thus allowing the grating interaction with the laser beam to be varied and/or eliminated.

Figure 28C:
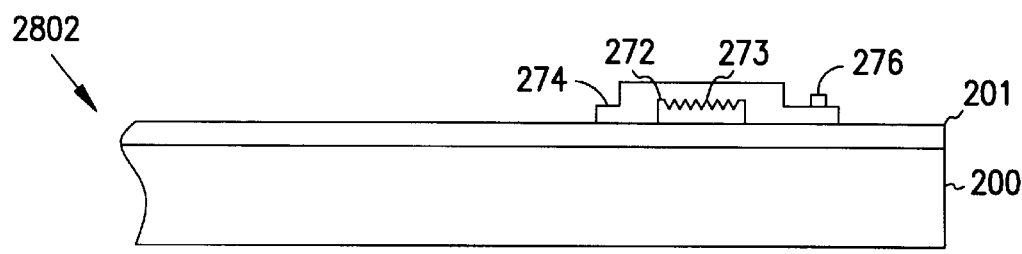
FIG. 28C depicts a side view of a grating 230 formed into a passive overlayer 272 covering the waveguides 201, and covered by an electro-optic overlayer 274.

FIG. 28C depicts a side view of a grating 230 formed into a passive overlayer 272 covering the waveguides 201, and covered by an electro-optic overlayer 274. In some embodiments, the index of refraction of overlayer 272 and overlayer 273 are chosen such that at some applied voltage, they match, thus making the grating effectively transparent, while at a different voltage, the DBR grating 273 will reflect (and, in some embodiments, tune) the underlying laser beam.

Figure 29A:
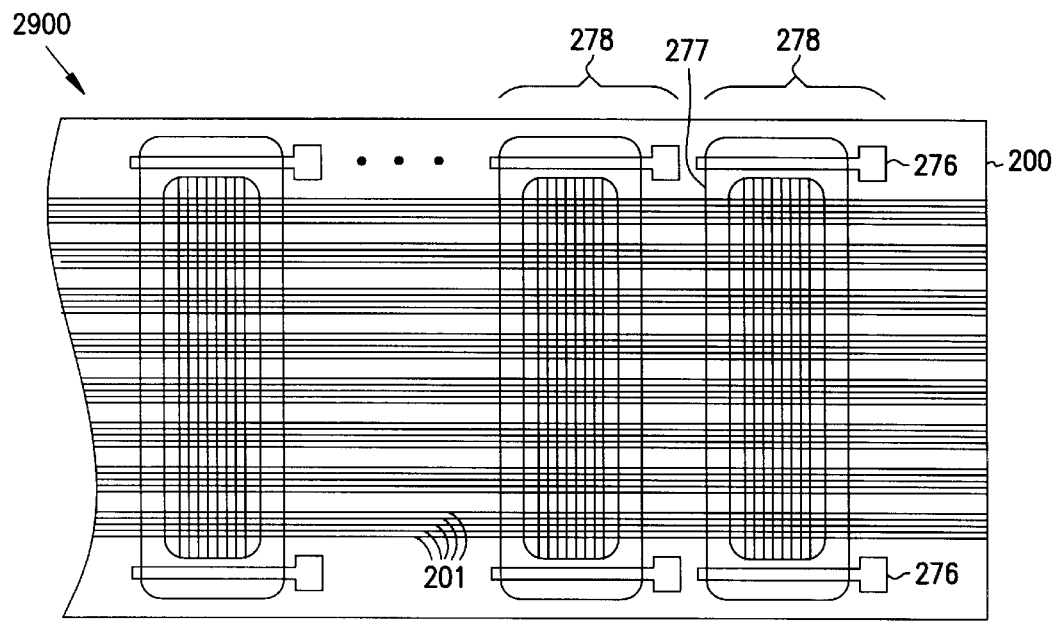
FIGS. 29A and 29B depict top and side views, respectively, of a plurality of gratings, arranged in series along waveguides 201, and each formed into a passive overlayer 272 covering an electro-optic overlayer 274 covering the waveguides 201.
Figure 29B:
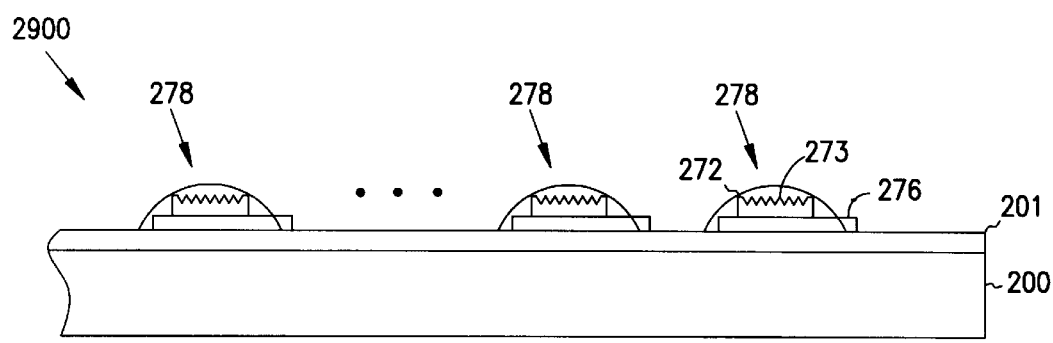

FIGS. 29A and 29B depict top and side views, respectively, of a plurality of gratings, arranged in series along waveguides 201, and each formed into a passive overlayer 272 covering an electro-optic overlayer 274 covering the waveguides 201. In this embodiment, each DBR grating 273 is formed at a different effective grating spacing relative to the waveguide (either by changing the spacing, or changing the angle to the waveguide). In some such embodiments, all but one of the controllable DBRs 278 are made transparent by applying (or removing) their electric field, and the remaining one is made highly reflective, thus tuning the underlying laser beam(s) to a wavelength corresponding to its effective grating spacing.

CONCLUSION

The following alphanumbered paragraphs describe exemplary embodiments of various aspects of the present invention.

Section A

A1. A laser component comprising a glass substrate doped with a laser species and having one or more waveguides defined by channels within the substrate, the one or more waveguides forming one or more laser-resonator cavities with distinct resonance characteristics to provide lasing action at a selected wavelength when pumped.

A2. The laser component of alphanumbered paragraph A1 wherein the substrate is an alkali phosphate glass doped with Er and Yb and wherein the channels are formed at a surface of the substrate as regions of increased refractive index.

A3. The laser component of alphanumbered paragraph A2 further comprising one or more feedback elements for providing optical feedback to the waveguides to form the one or more laser-resonator cavities, wherein injection of pump light at one or more suitable wavelengths into the laser-resonator cavity causes output of laser light at a wavelength in accordance with a longitudinal cavity mode of the cavity.

A5. The laser component of alphanumbered paragraph A3 wherein the feedback element comprises a mirror coupled to a location along the length of the waveguide.

A6. The laser component of alphanumbered paragraph A3 wherein the laser-resonator cavities have a plurality of widths on the substrate surface to thereby define a plurality of effective indices of refraction for the cavities, the wavelength of a longitudinal cavity mode being dependent thereon.

A*The laser component of alphanumbered paragraph A6 wherein the laser-resonator cavities have a plurality of widths on the substrate surface adjacent a diffraction Bragg reflector (DBR) to thereby define a plurality of different wavelengths defined at spaced-apart wavelength intervals to match standard wavelength spacings.

A**The laser component of alphanumbered paragraph A6 wherein the laser-resonator cavities are fabricated in a plurality of groups, wherein the cavities in each group have a plurality of widths on the substrate surface adjacent a DBR to thereby define a plurality of different wavelengths defined at spaced-apart wavelength intervals, such that one cavity per group matches a standard wavelength associated with that group.

A*The laser component of alphanumbered paragraph A6 further comprising: a ferrule having a plurality of spaced-apart attachment sites;
a plurality of optic fibers attached to the ferrule, each optic fiber attached to its own attachment site;
wherein each attachment site corresponds to a different group of cavities, such that each of the optic fibers is coupled to a corresponding one cavity on a different one of the groups.

A4. The laser component of alphanumbered paragraph A3 wherein the feedback element comprises a reflection grating formed on the substrate surface along the length of the waveguide.

A7. The laser component of alphanumbered paragraph A4 wherein the reflection grating of a first laser-resonator cavity has a pitch that differs from a pitch of a reflection grating of a second laser-resonator cavity, so that reflectance of light occurs at different wavelengths in the two cavities with the wavelength of each longitudinal cavity mode being dependent thereon.

A8. The laser component of alphanumbered paragraph A4 wherein a reflection grating of a single pitch is formed on the surface of the substrate at differing angles to a plurality of waveguides to form laser-resonator cavities of differing lasing wavelengths.

A10. The laser component of alphanumbered paragraph A4 wherein a reflection grating on the substrate surface is formed by reactive ion etching through a mask formed from photoresist defined with a grating pattern.

Axx. The laser component of alphanumbered paragraph A1, further comprising a phosphate glass substrate doped with a laser species, coated with between about 1 and about 2 nm of a silicon oxide formed on a surface in order to improve adhesion of a photoresist layer etching a DBR mirror into substrate using the photoresist Axx. The laser component of alphanumbered paragraph A1, further comprising a phosphate glass substrate doped with a laser species, coated with a silicon oxide formed on a surface in order to reduce scattering losses Axx. The laser component of alphanumbered paragraph A1, further comprising a phosphate glass substrate doped with a laser species, having a silicon oxide layer formed on a surface and of sufficient depth (500 to 2000 nm) in order to form a diffraction grating in the silicon oxide layer, etching a DBR mirror only into silicon oxide layer A9. The laser component of alphanumbered paragraph A1 wherein the waveguides are formed by ion-exchange with a solvent through a mask layer placed on a surface of the substrate with the width of each waveguide being defined by the width of an aperture of the mask layer.

A29. The laser component of alphanumbered paragraph A9 wherein the glass substrate comprises a phosphate alkali glass, and the solvent is molten potassium nitrate, thereby forming K doped waveguides within the substrate.

A30. The laser component of alphanumbered paragraph A29 wherein the K doped waveguides are buried within the substrate by diffusing Na ions into the substrate after formation of the K doped waveguides.

A13. A method for making a laser component comprising:
forming a mask layer upon a surface of a glass substrate doped with Er and Yb, the mask layer having one or more line apertures defined therein; and
exposing the masked surface of the substrate to an ion-exchange solvent, thereby forming one or more waveguides in the substrate as defined by the line apertures of the mask layer wherein the one or more waveguides form one or more laser-resonator cavities with distinct resonance characteristics.

Axx. The method of alphanumbered paragraph A13, further comprising using a phosphate glass substrate doped with a laser species, coating with between about 1 and about 2 nm of silicon oxide formed on a surface in order to improve adhesion of a photoresist layer. evaporating chromium coating onto photoresist after grating pattern is exposed to "harden" the pattern before etching forming DBR in standard photoresist using optical phase interference mask monitoring the reflection efficiency of the DBR during photoresist developing stage to control developing to optimize efficiency etching via Argon ion sputtering in standard reactive ion etch system to avoid CFC emissions that are usual with silica glass.

A14. The method of alphanumbered paragraph A13 wherein the glass substrate comprises a alkali phosphate based glass, and the solvent is molten potassium nitrate, thereby forming K doped waveguides within the substrate.

A15. The method of alphanumbered paragraph A14 wherein the substrate is exposed to the solvent in a borosilicate glass crucible.

A18. The method of alphanumbered paragraph A16 wherein the reflection grating is etched by a process selected from a group consisting of a reactive ion etch process, an argon milling process, and an argon sputtering process.

A26. The method of alphanumbered paragraph A14 further comprising diffusing Na ions into the substrate after formation of the K doped waveguides in order to bury the K doped waveguides within the substrate.

A27. The method of alphanumbered paragraph A26 wherein the diffusing of Na ions is carried out by electrical field-assisted diffusion using a Na containing electrode. In one such embodiment, the electric field is varied as a function of time.

A17. The method of alphanumbered paragraph A13 further comprising etching a reflection grating at a location along a waveguide using a photoresist layer defined with a desired grating pattern.

A21. The method of alphanumbered paragraph A17 further comprising monitoring a diffraction of laser light by the developed photoresist layer prior to etching the grating pattern into the substrate.

A22. The method of alphanumbered paragraph A13 further comprising depositing a layer of silicon dioxide on the surface of the substrate after formation of the waveguides.

A25. The method of alphanumbered paragraph A13 wherein the exposure of the substrate to an ion-exchange solvent is carried out in an enclosed chamber filled with an inert gas.

Axx. A laser component comprising: an alkali-phosphate glass substrate doped with Er and Yb and having one or more waveguides defined by channels formed at a surface of the substrate as regions of increased refractive index, the one or more waveguides forming one or more laser-resonator cavities to provide lasing action with power of at least about 20 milliwatts at a selected wavelength when pumped. In some embodiments, up to 180 mW has been achieved (compared to a previous high of 5 mW).

Axx. A laser component comprising: an alkali-phosphate glass substrate doped with Er and Yb and having one or more waveguides defined by channels formed at a surface of the substrate as regions of increased refractive index, the one or more waveguides forming one or more laser-resonator cavities to provide lasing action with slope efficiency of at least about 20% at a selected wavelength when pumped. In some embodiments, up to 25% has been achieved (compared to a previous high of 16%).

A28. The laser component of alphanumbered paragraph A1 further comprising a layer of silicon dioxide on the surface of the substrate.

A16. The method of alphanumbered paragraph A14 wherein the potassium nitrate solvent is pre-baked for a period of at least 24 hours at a temperature of at least 120 degrees C. in an argon atmosphere to lessen water content.

A23. The method of alphanumbered paragraph A13 wherein the glass substrate is doped with an approximate Yb:Er ratio of between 3:1 and 8:1.

A24. The method of alphanumbered paragraph A13 wherein the glass substrate is doped with an approximate Yb:Er ratio of 4:1.

A11. The laser component of alphanumbered paragraph A1 wherein the glass substrate is doped with an approximate Yb:Er ratio of between 3:1 and 8:1.

A12. The laser component of alphanumbered paragraph A11 wherein the glass substrate is doped with an approximate Yb:Er ratio of 4:1.

A31. The laser component of alphanumbered paragraph A11 wherein the glass substrate is doped with an approximate Yb:Er ratio of 3.5:1.

A32. The laser component of alphanumbered paragraph A11 wherein the glass substrate is doped with an approximate Yb:Er ratio of 4.5:1.

A33. The laser component of alphanumbered paragraph A11 wherein the glass substrate is doped with an approximate Yb:Er ratio of 5:1.

A34. The laser component of alphanumbered paragraph A11 wherein the glass substrate is doped with an approximate Yb:Er ratio of 5.5:1.

A35. The laser component of alphanumbered paragraph A11 wherein the glass substrate is doped with an approximate Yb:Er ratio of 6:1.

A36. The laser component of alphanumbered paragraph A11 wherein the glass substrate is doped with an approximate Yb:Er ratio of 6.5:1.

A37. The laser component of alphanumbered paragraph A11 wherein the glass substrate is doped with an approximate Yb:Er ratio of 7:1.

A38. The laser component of alphanumbered paragraph A11 wherein the glass substrate is doped with an approximate Yb:Er ratio of 7.5:1.

A39. The laser component of alphanumbered paragraph A11 wherein the glass substrate is doped with an approximate Yb:Er ratio of 8:1.

Axx. The laser component of alphanumbered paragraph A11 wherein the glass substrate is doped with an approximate Yb:Er ratio of 4:1, and Er concentration is $1 \times 10^{20}$ ions/cc.

Described above are one or more exemplary embodiments providing apparatus and method for integrating rare-earth doped lasers and optics on glass substrates. An exemplary embodiment includes a laser component formed from a glass substrate doped with a laser species with a plurality of waveguides defined by channels within the substrate. The laser component may constitute a monolithic array of individual waveguides in which the waveguides of the array form laser resonator cavities with differing resonance characteristics. The channels defining the waveguides are created by exposing a surface of the substrate to an ion-exchange solvent through a mask layer having a plurality of line apertures corresponding to the channels which are to be formed.

Section B

B1. A laser comprising:
- a glass substrate doped with a laser species;
- a waveguide defined within the substrate; and
- a diode pump laser with an extended waveguide laser resonator cavity, the extended diode laser cavity being positioned adjacent the substrate waveguide so that pump light from the diode laser is absorbed along a length thereof.

B2. The laser of alphanumbered paragraph B1 wherein the substrate is doped with Yb and Er.

B3. The laser of alphanumbered paragraph B1 wherein the substrate is doped with Er.

B4. The laser of alphanumbered paragraph B1 wherein the substrate waveguide forms a laser resonator cavity within the substrate.

B5. The laser of alphanumbered paragraph B4 further comprising a reflection grating formed on the substrate surface along the substrate waveguide for providing feedback to the laser resonator cavity.

B12. The laser of alphanumbered paragraph B5 further comprising:
a cladding deposited on the reflection grating of the substrate waveguide, the cladding being composed of an electro-optic polymer with a variable index of refraction; and
electrodes for applying an electrical potential across the grating cladding to vary the index of refraction in accordance therewith and thereby vary the wavelength of light reflected by the grating.

B13. The laser of alphanumbered paragraph B5 further comprising electrodes and a resistive element for heating and thermally expanding the reflection grating of the substrate waveguide to alter the wavelength reflected by the grating.

B14. The laser of alphanumbered paragraph B5 further comprising electrodes for applying an electrical potential to a piezo-electric coating applied to the reflection grating to thereby vary the wavelength of light reflected by the grating.

B15. The laser of alphanumbered paragraph B5 wherein the reflection grating is composed of an electro-optic polymer and further comprising electrodes for applying an electrical potential across the grating to vary the index of refraction in accordance therewith and thereby vary the wavelength of light reflected by the grating.

B16. The laser of alphanumbered paragraph B5 further comprising:
one or more additional reflection gratings formed on the substrate waveguide, each grating having a cladding composed of an electro-optic polymer with a variable index of refraction deposited thereon; and
electrodes for selectively applying an electrical potential across each grating cladding to vary the index of refraction in accordance therewith and render the grating transparent or reflective at a wavelength corresponding to a longitudinal mode of the substrate waveguide laser cavity.

B6. The laser of alphanumbered paragraph B4 further comprising a mirror coupled to a location along the substrate waveguide for providing feedback to the laser resonator cavity.

B7. The laser of alphanumbered paragraph B1 wherein the extended waveguide cavity of the pump diode laser is a dielectric waveguide abutted at one end to an antireflection-coated gain section of the diode laser and at another end to a highly reflective mirror.

B8. The laser of alphanumbered paragraph B1 wherein the extended waveguide cavity of the pump diode laser is a dielectric waveguide abutted at one end to an antireflection coated gain section of the diode laser and at another end to a reflection grating.

B9. The laser of alphanumbered paragraph B1 wherein the extended waveguide cavity of the pump diode laser has a lower index of refraction than the substrate waveguide and forms part of a cladding thereof.

B10. The laser of alphanumbered paragraph B1 wherein the extended waveguide cavity is abutted to the surface of the substrate waveguide and separated therefrom by a layer of cladding with apertures for transmitting pump light into the substrate waveguide.

B11. The laser of alphanumbered paragraph B1 wherein the separation between the extended waveguide cavity and the substrate waveguide is such that pump light is transmitted by evanescent coupling.

B17. A method for operating a waveguide laser comprising transmitting pump light from an extended waveguide laser cavity of a diode laser into a substrate waveguide laser cavity along a length of the substrate cavity, wherein the extended diode laser cavity forms part of a lower refractive index cladding of the substrate waveguide laser cavity.

B18. The method of alphanumbered paragraph B17 wherein the substrate waveguide laser cavity is composed of glass doped with Er and Yb, with the diode laser and extended cavity thereof being tuned to provide pump light at a wavelength appropriate to cause lasing in the substrate waveguide cavity.

B19. The method of alphanumbered paragraph B17 wherein pump light from the extended laser cavity of the diode laser is transmitted into the substrate waveguide laser cavity via evanescent coupling.

B20. The method of alphanumbered paragraph B17 wherein pump light from the extended laser cavity of the diode laser is transmitted into the substrate waveguide laser cavity through apertures in a layer of cladding material interposed therebetween.

B21. The method of alphanumbered paragraph B17 wherein the substrate waveguide cavity has a reflection grating at one end for providing optical feedback to the cavity and further wherein an electro-optic polymer having a variable index of refraction is deposited on the grating to form a cladding therefor, the method further comprising tuning the laser by applying an electrical potential to the grating cladding to select a wavelength reflected by the grating that corresponds to a longitudinal mode of the substrate waveguide cavity.

B22. The method of alphanumbered paragraph B17 wherein the substrate waveguide cavity has a plurality of spaced apart reflection gratings at one end for providing optical feedback to the cavity and further wherein an electro-optic polymer having a variable index of refraction is formed on the gratings to constitute claddings therefor, the method further comprising tuning the laser by selectively applying an electrical potential to the grating claddings to render one grating reflective at a wavelength that corresponds to a longitudinal mode of the substrate waveguide cavity.

Described above are also one or more exemplary embodiments providing apparatus and method for integrating rare-earth doped lasers and optics on glass substrates. In particular, the invention is directed toward a method and structure for pumping the laser. The invention includes a laser component formed from a glass substrate doped with a laser species and having one or more substrate waveguides defined therein, and a superstrate waveguide cavity positioned adjacent the substrate waveguide for supplying the latter with pump light. The structure is highly efficient and capable of pumping waveguide or fiber lasers that are of very short length.

Section C

C1. An optical substrate for fabrication of optical devices therein comprising a block of glass having distinct regions doped with varying concentrations of one or more laser species, wherein the substrate is constructed by fusing together a plurality glass blocks having differing concentrations of the same or different dopants.

C2. The substrate of alphanumbered paragraph C1 wherein the substrate is formed by slicing the fused blocks into a plurality of wafers, each such wafer constituting a substrate.

C4. The substrate of alphanumbered paragraph C2 wherein the substrate is further constructed by slicing the fused blocks into a wafers with each wafer forming a substrate.

C3. The substrate of alphanumbered paragraph C1 wherein the fusing is performed by heating the blocks to their softening points and pressing the blocks together to form a single block of glass with distinct regions of dopant concentration.

C5. The substrate of alphanumbered paragraph C1 wherein the distinct regions have differing concentrations of the same dopant.

C6. The substrate of alphanumbered paragraph C1 wherein the distinct regions are doped with different laser species.

C7. The substrate of alphanumbered paragraph C1 wherein at least one region is undoped.

C8. The substrate of alphanumbered paragraph C7 further comprising a optic amplifier and a waveguide for conveying pump light to the amplifier fabricated therein, wherein at least a portion of the waveguide is located in an undoped region of the substrate.

C9. The substrate of alphanumbered paragraph C7 further comprising a laser resonator and a first waveguide for conveying pump light to the resonator fabricated therein, wherein at least a portion of the first waveguide is formed in an undoped region of the substrate.

C10. The substrate of alphanumbered paragraph C1 further comprising a laser resonator and a laser amplifier fabricated therein, wherein the resonator and amplifier are formed in regions of the substrate with different dopant concentrations.

C11. The substrate of alphanumbered paragraph C1 further comprising a plurality of laser resonators fabricated therein, wherein the resonators are formed in regions of the substrate doped with different laser species so that lasing occurs within the resonators at different wavelengths.

C12. The substrate of alphanumbered paragraph C1 further comprising an active and a passive optical device fabricated therein, wherein the active device is formed in a doped region and the passive device is formed in an undoped region.

C13. The substrate of alphanumbered paragraph C12 wherein the passive device conveys light to the active device.

C14. A method for constructing an optical substrate for fabrication of optical devices therein comprising fusing together a plurality glass blocks having differing concentrations of the same or different dopants.

C15. The method of alphanumbered paragraph C13 wherein the fusing is performed by heating the blocks to their softening points and pressing them together to form a single block of glass with distinct regions of dopant concentration.

C16. The method of alphanumbered paragraph C13 further comprising slicing the fused block into wafers.

Described above are one or more exemplary embodiments providing an optical structure and method for making same incorporating a multi-compositional substrate. The substrate is doped with a laser species and has distinct regions of varying dopant concentration. The substrate allows for the configuration of laser systems with lessened power requirements and greater immunity to noise. The substrate also allows for the configuration of components in which the gain, loss, and absorption in various regions of the glass can be independently controlled.

Section D

D1. A laser comprising:
a glass substrate doped with a laser species;
a waveguide within the substrate forming a laser resonator cavity;
a reflection grating in the substrate waveguide for providing feedback to the resonator cavity;
means for tuning the laser by altering the wavelength reflected by the grating; and
means for pumping the laser by exciting the laser species of the substrate waveguide.

D2. The laser of alphanumbered paragraph D1 wherein the pumping means is a pump laser for injecting pump light into the substrate waveguide.

D3. The laser of alphanumbered paragraph D1 further comprising a mirror affixed to an end of the substrate waveguide for providing feedback.

D4. The laser of alphanumbered paragraph D1 further comprising a second reflection grating positioned along the substrate waveguide for providing feedback.

D5. The laser of alphanumbered paragraph D1 wherein the glass substrate is doped with Er and Yb.

D6. The laser of alphanumbered paragraph D1 wherein the laser tuning means comprises:
a cladding deposited on the reflection grating of the substrate waveguide, the cladding being composed of an electro-optic polymer with a variable index of refraction; and
electrodes for applying an electrical potential across the grating cladding to vary the index of refraction in accordance therewith and thereby vary the wavelength of light reflected by the grating.

D7. The laser of alphanumbered paragraph D1 wherein the laser tuning means comprises:
one or more additional reflection gratings formed on the substrate waveguide, each grating having a cladding composed of an electro-optic polymer with a variable index of refraction deposited thereon; and
electrodes for selectively applying an electrical potential across each grating cladding to vary the index of refraction in accordance therewith and render the grating transparent or reflective at a wavelength corresponding to a longitudinal mode of the substrate waveguide laser cavity.

D8. The laser of alphanumbered paragraph D1 wherein the laser tuning means comprises electrodes and a resistive element for heating and thermally expanding the reflection grating of the substrate waveguide to alter the wavelength reflected by the grating.

D9. The laser of alphanumbered paragraph D1 wherein the laser tuning means comprises electrodes for applying an electrical potential to a piezo-electric layer applied to the reflection grating to thereby vary the wavelength of light reflected by the grating.

D10. The laser of alphanumbered paragraph D1 wherein the laser tuning means comprises a reflection grating composed of an electro-optic polymer, and electrodes for applying an electrical potential across the grating to vary the index of refraction in accordance therewith and thereby vary the wavelength of light reflected by the grating.

Dxx. The laser of alphanumbered paragraph D10 wherein a voltage to the electro-optic polymer is varied to vary a reflection coefficient of the grating Dxx. The laser of alphanumbered paragraph D10 wherein a voltage to the electro-optic polymer is varied to maximize a reflection coefficient of the grating Dxxx. The laser of claim 10 wherein a voltage to the electro-optic polymer is varied to minimize a reflection coefficient of the grating D11. A laser comprising:
a glass substrate doped with a laser species;
a waveguide laser resonator cavity formed within the substrate;
a cladding composed of an electro-optic polymer with an electrically variable index of refraction deposited on the waveguide;
electrodes for applying an electrical potential across the cladding to vary the index of refraction in accordance therewith and thereby vary the effective refractive index of the waveguide cavity; and
a pump laser for injecting pump light into the substrate waveguide cavity.

D12. A method for operating a waveguide laser comprising injecting pump light into a waveguide laser resonator cavity wherein the laser cavity has a reflection grating at one end for providing optical feedback to the cavity and further wherein the grating is responsive to application of an external voltage by changing the wavelength of light reflected by the grating in accordance the applied voltage, the method further comprising tuning the laser by applying an electrical potential to the grating to select a wavelength reflected by the grating that corresponds to a longitudinal mode of the substrate waveguide cavity.

D13. The method of alphanumbered paragraph D12 wherein the grating is coated with a cladding composed of an electro-optic polymer having a variable index of refraction such that application of a voltage to the cladding changes the wavelength of light reflected by the grating.

D14. The method of alphanumbered paragraph D12 wherein the grating is composed of an electro-optic polymer having a variable index of refraction such that application of a voltage to the cladding changes the wavelength of light reflected by the grating.

D15. The method of alphanumbered paragraph D12 wherein the grating is coated with a piezo-electric coating such that application of a voltage to the coating thereby varies the wavelength of light reflected by the grating.

D16. The method of alphanumbered paragraph D12 wherein the grating is in contact with a resistive element for heating and thermally expanding the reflection grating of the substrate waveguide to alter the wavelength reflected by the grating when a voltage is applied thereto.

D17. A method for operating a waveguide laser comprising injecting pump light into a waveguide laser resonator cavity wherein the waveguide cavity has a plurality of spaced apart reflection gratings at one end for providing optical feedback to the cavity and further wherein an electro-optic polymer having a variable index of refraction is deposited on the gratings to form claddings therefor, the method further comprising tuning the laser by applying an electrical potential to the grating claddings to selectively render one grating reflective at a wavelength that corresponds to a longitudinal mode of the substrate waveguide cavity.

Described above are one or more exemplary embodiments providing optical structures and method for producing tunable waveguide lasers. In one embodiment, a waveguide is defined within a glass substrate doped with a rare-earth element or elements by ion diffusion. Feedback elements such as mirrors or reflection gratings in the waveguide further define a laser-resonator cavity so that laser light is output from the waveguide when pumped optically or otherwise. Means are disclosed for varying the wavelengths reflected by the reflection gratings and varying the effective length of the resonator cavity to thereby tune the laser to a selected wavelength.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A laser component comprising:
a glass substrate doped with a laser species and having a plurality of waveguides defined by channels within the substrate, each one of the plurality of waveguides forming a laser-resonator cavity with a distinct resonance characteristic to provide lasing action at a selected wavelength when pumped, wherein the substrate is an alkali phosphate glass doped with Er and Yb and wherein the channels are formed at a surface of the substrate as regions of increased refractive index;
one or more feedback elements for providing optical feedback to the waveguides to form the one or more laser-resonator cavities, wherein injection of pump light at one or more suitable wavelengths into the laser-resonator cavity causes output of laser light at a wavelength in accordance with a longitudinal cavity mode of the cavity and wherein the laser-resonator cavities have a plurality of widths on the substrate surface to thereby define a plurality of effective indices of refraction for the cavities, the wavelength of a longitudinal cavity mode being dependent thereon;
a ferrule having a plurality of spaced-apart attachment sites; and
a plurality of optic fibers attached to the ferrule, each optic fiber attached to its own attachment site wherein each attachment site corresponds to a different group of cavities, each group including a plurality of cavities, such that each of the optic fibers is coupled to a corresponding one cavity on a different one of the groups.

2. The laser component according to claim 1, further comprising:
   a silicon oxide layer formed on a surface of the glass substrate; and
   a surface-relief diffraction grating formed into the silicon oxide layer, wherein the silicon oxide layer is of sufficient depth for the diffraction grating to be formed at least in part in the silicon oxide layer.

3. The laser component of claim 2 wherein the diffraction grating forms a diffraction Bragg reflector (DBR) mirror extending only into silicon oxide layer.

4. The laser component of claim 2 wherein the diffraction grating is formed only into the silicon oxide layer and not into the substrate.

5. The laser component of claim 2 wherein the silicon oxide layer has a thickness in a range of between about 500 nm and about 2000 nm.

6. The laser component of claim 2, wherein the silicon oxide layer has a thickness in a range of between about 1000 nm and about 2000 nm.

7. The laser component according to claim 1, further comprising:
   at least one pump that excites the laser species of the substrate waveguides;
   a first surface-relief reflection grating formed on the substrate waveguide for providing feedback of a first one of the one or more feedback elements to the resonator cavity;
   means for tuning the laser by altering the wavelength reflected by the first grating, wherein the laser tuning means comprises:
      an electro-optic material optically coupled to the first grating; and
      electrodes for applying an electrical potential across the electro-optic material to vary an index of refraction in accordance therewith and thereby vary a wavelength of light reflected by the first grating.

8. The laser of claim 7 wherein a voltage to the electro-optic material is varied to vary a reflection coefficient of the grating.

9. The laser of claim 7 wherein a voltage to the electro-optic material is varied to maximize a reflection coefficient of the grating.

10. The laser of claim 7 wherein a voltage to the electro-optic material is varied to minimize a reflection coefficient of the grating.

11. The laser of claim 7 wherein a voltage to the electro-optic material is selected to maximize a reflection coefficient of the first grating in order to select a lasing wavelength determined by the first grating.

12. The laser of claim 7 wherein a voltage to the electro-optic material is selected to minimize a reflection coefficient of the first grating in order to select a lasing wavelength determined by a grating other than the first grating.

13. The laser component of claim 1, further comprising:
   one or more pump light sources operatively coupled to the cavities; and
   packaging enclosing the laser component.

14. The laser component of claim 1, further comprising:
   a silicon oxide layer formed on a surface of the glass substrate, wherein the one or more feedback elements comprise a surface-relief diffraction grating formed into the silicon oxide layer, wherein the silicon oxide layer is of sufficient depth for the diffraction grating to be formed at least in part in the silicon oxide layer.

15. The laser component of claim 14, wherein the diffraction grating is formed only into the silicon oxide layer and not into the substrate.

16. The laser component of claim 13, wherein the silicon oxide layer has a thickness in a range of between about 1000 nm and about 2000 nm.

17. The laser component of claim 1, wherein the one or more feedback elements comprise:
   a first surface-relief diffraction grating on the substrate waveguide that provides feedback to the resonator cavity;
   an electro-optic material optically coupled to the first grating; and
   electrodes that apply an electrical potential across the electro-optic material to vary an index of refraction in accordance therewith and thereby control a wavelength of the resonator cavity.

18. The laser component of claim 17 wherein a voltage to the electro-optic material is selected to maximize a reflection coefficient of the first grating and thereby control a wavelength of the resonator cavity.

19. The laser component of claim 17 wherein a voltage to the electro-optic material is selected to minimize a reflection coefficient of the first grating and thereby control a wavelength of the resonator cavity.

20. A method for operating a waveguide laser comprising:
   providing a waveguide laser resonater cavity having a plurality of reflection gratings at a first end for providing optical feedback to the cavity, wherein a first electro-optic cladding having a variable index of refraction is cladded to a first one of the plurality of the gratings;
   injecting pump light into the waveguide laser resonator cavity; and
   tuning the laser by selectively applying a first electrical potential to the first one of the grating claddings to selectively render the first grating reflective at a first wavelength that corresponds to a first longitudinal mode of the substrate waveguide cavity in order to tune the laser to the first wavelength.

21. The method of claim 20, wherein, the tuning further comprises selectively applying a second electrical potential to the first cladding to selectively render the first grating substantially transparent at a second wavelength that corresponds to a second longitudinal mode of the substrate waveguide cavity, wherein applying the second electrical potential renders the first grating substantially not reflective at the first wavelength, and wherein a second one of the plurality of gratings is reflective at the second wavelength in order to tune the laser to the second wavelength.

22. The method of claim 21, wherein, when reflective, the first one of the gratings reflects at a first wavelength, and when reflective, the second one of the gratings reflects at a second wavelength different from the first wavelength, and wherein the tuning further comprises applying an electrical potential to the second one of the grating claddings to selectively render the second grating reflective at a wavelength that corresponds to the second longitudinal mode of the substrate waveguide cavity.

23. The method of claim 20, wherein, when reflective, the first one of the gratings reflects at a first wavelength that is based in part on a first angle between the first grating and the waveguide laser resonator cavity, and when reflective, the second one of the gratings reflects at a second wavelength different from the first wavelength, the second wavelength based in part on a second angle between the second grating and the waveguide laser resonator cavity.

24. A laser comprising:
    a glass substrate doped with a laser species;
    a waveguide within the substrate forming a laser resonator cavity;
    a pump coupled to the laser resonator cavity to excite the laser species in the waveguide;
    a surface-relief grating formed over the waveguide on the substrate that selectively provides feedback to the laser resonator cavity;
    an electro-optic cladding optically coupled to the grating on the substrate; and
    electrodes that selectively apply an electric field to the electro-optic cladding to vary the index of refraction of the electro-optic cladding and thereby determine a characteristic wavelength of the laser resonator cavity.

25. The laser of claim 24 wherein the voltage to the electro-optic material is varied to vary a reflective wavelength of the grating.

26. The laser of claim 24 wherein the voltage to the electro-optic material is varied to maximize a reflection coefficient of the grating.

27. The laser of claim 24 wherein the voltage to the electro-optic material is varied to minimize a reflection coefficient of the grating.

28. The laser of claim 24 wherein the electro-optic cladding is located between the grating and the waveguide.

29. The laser of claim 24 wherein the grating is located between the electro-optic cladding and the waveguide.

30. A laser component comprising:
    a glass substrate doped with a laser species and having a plurality of waveguides defined by channels within the substrate, each one of the plurality of waveguides forming a laser-resonator cavity with a distinct resonance characteristic to provide lasing action at a selected wavelength when pumped, wherein the substrate is an alkali phosphate glass doped with Er and Yb and wherein the channels are formed at a surface of the substrate as regions of increased refractive index, wherein each cavity includes a feedback element that provides optical feedback to form the laser-resonator, wherein injection of pump light at one or more suitable pump wavelengths into the laser-resonator cavity causes output of laser light at a wavelength in accordance with a longitudinal cavity mode of each cavity and wherein each one of the plurality of laser-resonator cavities lases at a different selected wavelength of a plurality of different wavelengths;
    a ferrule having a plurality of spaced-apart attachment sites; and
    a plurality of optic fibers attached to the ferrule, each optic fiber attached to its own attachment site wherein each attachment site corresponds to a different one of the cavities, wherein the number of optic fibers is fewer than the number of cavities such that each of the optic fibers is coupled to a corresponding one cavity selected from a plurality of possible cavities.

31. The laser component of claim 30, wherein the plurality of cavities are formed as a plurality of groups, each group including a plurality of cavities and corresponding to one of the plurality of otic fibers such that the plurality of optic fibers is aligned to the plurality of groups in order that either a first optic fiber is coupled to a first cavity of a first group and a second optic fiber is coupled to a first cavity of a second group, or the first optic fiber is coupled to a second cavity of the first group and the second optic fiber is coupled to a second cavity of the second group.

32. A method of making the laser component of claim 30, comprising:
    forming the substrate such that a first plurality of waveguides each lase at a different wavelength selected from a first plurality of wavelengths and a second plurality of waveguides each lase at a different wavelength selected from a second plurality of wavelengths; and
    aligning the ferrule such that a first laser wavelength is output to a first one of the plurality of optic fibers and a second laser wavelength different than the first laser wavelength is output to a second one of the plurality of optic fibers.

33. The laser component of claim 30, further comprising:
    a pump light source; and
    packaging enclosing the laser component.

34. The laser component of claim 30, further comprising:
    a silicon oxide layer formed on a surface of the glass substrate, wherein the one or more feedback elements comprise a surface-relief diffraction grating formed into the silicon oxide layer and not into the substrate.

35. The laser component of claim 34, wherein the one or more feedback elements further comprise:
    an electro-optic cladding optically coupled to the grating on the substrate; and
    electrodes that selectively apply an electric field to the electro-optic cladding to vary the index of refraction of the electro-optic cladding and thereby determine a characteristic wavelength of the laser resonator cavity.

36. The laser component of claim 33, wherein the silicon oxide layer has a thickness in a range of between about 1000 nm and about 2000 nm.

37. The laser component of claim 30, wherein the feedback element comprises
    a first surface-relief diffraction grating on the substrate waveguide that provides feedback to the resonator cavity;
    an electro-optic material optically coupled to the first grating; and
    electrodes that apply an electrical potential across the electro-optic material to vary an index of refraction in accordance therewith and thereby control a wavelength of the resonator cavity.

38. The laser component of claim 37 wherein a voltage to the electro-optic material is selected to maximize a reflection coefficient of the first grating and thereby control a wavelength of the resonator cavity.

39. The laser component of claim 37 wherein a voltage to the electro-optic material is selected to minimize a reflection coefficient of the first grating and thereby control a wavelength of the resonator cavity.

40. A laser component comprising:
    a substrate doped with a laser species and having a plurality of laser cavities including a first cavity, each cavity providing lasing action at a selected wavelength when pumped;
    a ferrule having a first laser-output fiber-attachment site; and
    a first optic fiber attached to the ferrule at the first laser-output fiber-attachment site, wherein the ferrule is aligned to the substrate such that the first optic fiber is aligned to an output interface of the first cavity, wherein the first cavity is selected from a plurality of possible cavities that the first fiber could align to.

41. The laser component of claim 40, wherein the plurality of laser cavities further includes a second cavity, the ferrule further having a second laser-output fiber-attachment site, the component further comprising a second optic fiber attached to the ferrule at the second laser-output fiber-attachment site, wherein the ferrule is aligned to the substrate such that the second optic fiber is aligned to an output interface of the second cavity, wherein the second cavity is selected from a plurality of possible cavities that the second fiber could align to.

42. The laser component of claim 41, wherein the first laser cavity lases at a first wavelength, the second cavity lases at a second wavelength that is different than the first wavelength, wherein the substrate and ferrule are configured such that when the first optic fiber is aligned to the first cavity lasing at the first wavelength, the second optic fiber will be spaced to a cavity lasing at the second wavelength.

43. The laser component of claim 40, wherein the ferrule further includes a first pump-light site, and wherein the ferrule is aligned to the substrate such that the first optic fiber is aligned to an output interface of the first cavity and the first pump light site is aligned to a pump-light input interface of the first cavity.

44. The laser component of claim 40, wherein the plurality of laser cavities further includes a second cavity, the ferrule further having a second laser-output fiber-attachment site and a first and a second pump-light site, the component further comprising a second optic fiber attached to the ferrule at the second laser-output fiber-attachment site, wherein the ferrule is aligned to the substrate such that the second optic fiber is aligned to an output interface of the second cavity, and the first pump light site is aligned to a pump-light input interface of the first cavity and the second pump light site is aligned to a pump-light input interface of the second cavity, wherein the second cavity is selected from a plurality of possible cavities that the second fiber could align to.

45. A laser component comprising:
  a substrate doped with a laser species and having a first cavity, the first cavity providing lasing action when pumped by suitable pump light;
  a ferrule having a first pump-light site and a first laser-output fiber-attachment site; and
  a first optic fiber attached to the ferrule at the first laser-output fiber-attachment site, wherein the ferrule is aligned to the substrate such that the first optic fiber is aligned to an output interface of the first cavity and the first pump light site is aligned to a pump-light input interface of the first cavity.

46. The laser component of claim 45, wherein the substrate further includes a second cavity, the ferrule further having a second pump-light site and a second laser-output fiber-attachment site, the component further comprising a second optic fiber attached to the ferrule at the second laser-output fiber-attachment site, wherein the ferrule is aligned to the substrate such that the second optic fiber is aligned to an output interface of the second cavity, and the second pump light site is aligned to a pump-light input interface of the second cavity.

47. The laser component of claim 46, wherein the output interface of the first cavity and of the second cavity and the pump-light input interface of the first cavity and of the second cavity are all located on a single surface of the substrate.

48. The laser component of claim 45, wherein the output interface of the first cavity and the pump-light input interface of the first cavity are both located on a single surface of the substrate.

49. The laser component of claim 45, wherein the first cavity comprises:
  a first surface-relief diffraction grating on the substrate waveguide that provides feedback to the resonator cavity;
  an electro-optic material optically coupled to the first grating; and
  electrodes that apply an electrical potential across the electro-optic material to vary an index of refraction in accordance therewith and thereby control a wavelength of the resonator cavity.

50. The laser component of claim 45, wherein the first cavity comprises:
  a silicon oxide layer formed on a surface of the glass substrate and a surface-relief diffraction grating formed into the silicon oxide layer and not into the substrate.

51. A method for making a laser component comprising:
  providing a substrate having a first cavity doped with a laser species, the first cavity providing lasing action when pumped by suitable pump light;
  providing a ferrule having an attached first optic fiber and an attached first pump-light source; and
  aligning the ferrule to the substrate such that the first optic fiber is aligned to an output interface of the first cavity and the first pump-light source is aligned to a pump-light input interface of the first cavity.

52. The method of claim 51, wherein the substrate further includes a second cavity doped with a laser species, the second cavity providing lasing action when pumped by suitable pump light, and wherein the ferrule further includes an attached second optic fiber and an attached second pump-light source, and wherein the aligning of the ferrule to the substrate further comprises:
  selecting between the first cavity and the second cavity based on a desired laser output characteristic; and
  aligning the ferrule to the substrate such that the first optic fiber is aligned to an output interface of the second cavity and the second pump-light source is aligned to a pump-light input interface of the second cavity.

53. The method of claim 52, wherein the output interface of the second cavity and the pump-light input interface of the second cavity are both located on a single face of the substrate.

54. The method of claim 51, wherein the substrate further includes a second cavity doped with a laser species, the second cavity providing lasing action when pumped by suitable pump light, and wherein the ferrule further includes an attached second optic fiber and an attached second pump-light source, and wherein the aligning of the ferrule to the substrate further comprises:
  selecting the first cavity and the second cavity from among a larger plurality of cavities based on a desired laser output characteristic; and
  aligning the ferrule to the substrate such that the first optic fiber is aligned to an output interface of the first cavity and the first pump-light source is aligned to a pump-light input interface of the first cavity, and the second optic fiber is aligned to an output interface of the second cavity and the second pump-light source is aligned to a pump-light input interface of the second cavity.

55. The method of claim 51, wherein the attached first pump-light source comprises an optic fiber connectable to an external light source.

56. A method for making a laser component comprising:

providing a substrate having a first cavity doped with a laser species and a second cavity doped with a laser species, the first cavity providing lasing action when pumped by suitable pump light and the second cavity providing lasing action when pumped by suitable pump light;

providing a ferrule having an attached first optic fiber;

selecting between the first cavity and the second cavity based on a desired laser output characteristic; and aligning the ferrule to the substrate such that the first optic fiber is aligned to an output interface of the selected first or second cavity.

57. The method of claim 56, wherein the substrate includes a plurality of cavities doped with a laser species including the first cavity, the second cavity, and a third cavity, and wherein the ferrule further includes an attached second optic fiber, and wherein the aligning of the ferrule to the substrate further comprises aligning the ferrule to the substrate such that the second optic fiber is aligned to an output interface of the third cavity when the first optic fiber is aligned to the output interface of the selected first or second cavity.

58. The method of claim 56, wherein the substrate includes a plurality of cavities doped with a laser species including the first cavity, the second cavity, and a third cavity, and wherein the ferrule further includes an attached second optic fiber, an attached first pump-light source, and an attached second pump-light source, and wherein the aligning of the ferrule to the substrate further comprises:

aligning the ferrule to the substrate such that the first optic fiber is aligned to an output interface of the first cavity and the first pump-light source is aligned to a pump-light input interface of the first cavity, and the second optic fiber is aligned to an output interface of the second cavity and the second pump-light source is aligned to a pump-light input interface of the second cavity.

59. The method of claim 58, wherein the attached first pump-light source comprises an optic fiber connectable to an external light source.

60. The method of claim 58, wherein the output interface of the second cavity and the pump-light input interface of the second cavity are both located on a single face of the substrate.

* * * * *

UNITED STATES PATENT AND TRADEMARK OFFICE
CERTIFICATE OF CORRECTION

PATENT NO. : 6,330,388 B1
DATED : December 11, 2001
INVENTOR(S) : Mark P. Bendett and Michael A. McCoy It is certified that error appears in the above-identified patent and that said Letters Patent is hereby corrected as shown below:

Column 3,
Line 55, insert space between "222," and "223,".

Column 46,
Line 6, delete "13" and insert -- 14 --, therefor.

Column 48,
Line 34, delete "33" and insert -- 34 --, therefor.

Signed and Sealed this

Twenty-eighth Day of May, 2002

Attest:

JAMES E. ROGAN
*Attesting Officer*  *Director of the United States Patent and Trademark Office*